US011120673B2

(12) United States Patent
Büttner et al.

(10) Patent No.: US 11,120,673 B2
(45) Date of Patent: Sep. 14, 2021

(54) SYSTEMS AND METHODS FOR GENERATING HAPTIC OUTPUT FOR ENHANCED USER EXPERIENCE

(71) Applicant: Lofelt GmbH, Berlin (DE)

(72) Inventors: Daniel Büttner, Berlin (DE); Sebastian Roos, Berlin (DE)

(73) Assignee: Lofelt GmbH, Berlin (DE)

( * ) Notice: Subject to any disclaimer, the term of this patent is extended or adjusted under 35 U.S.C. 154(b) by 201 days.

(21) Appl. No.: 16/435,353

(22) Filed: Jun. 7, 2019

(65) Prior Publication Data

US 2019/0379977 A1 Dec. 12, 2019

Related U.S. Application Data

(60) Provisional application No. 62/681,755, filed on Jun. 7, 2018.

(51) Int. Cl.
*G08B 6/00* (2006.01)
*H03G 3/30* (2006.01)
(Continued)

(52) U.S. Cl.
CPC .............. *G08B 6/00* (2013.01); *G06F 3/016* (2013.01); *G06N 3/0454* (2013.01); *G06N 3/08* (2013.01);
(Continued)

(58) Field of Classification Search
CPC ........ G08B 6/00; G06F 3/016; G06N 3/0454; G06N 3/08; H03G 3/3005; H03G 9/14; H04R 1/1008
(Continued)

(56) References Cited

U.S. PATENT DOCUMENTS 5,832,444 A 11/1998 Schmidt
2007/0038164 A1 2/2007 Afshar
(Continued)

FOREIGN PATENT DOCUMENTS

EP 2624099 A1 8/2013
EP 2846228 A2 3/2015

OTHER PUBLICATIONS

European Search Report prepared by the European Patent Office for related EP 18176491, dated Dec. 11, 2018, 2 pages.
(Continued)

*Primary Examiner* — Sean H Nguyen
(74) *Attorney, Agent, or Firm* — Chernoff Vilhauer LLP

(57) ABSTRACT

Systems and methods for generating a haptic output from an audio signal having a continuous stream of sampled digital audio data are provided. A haptic processing system receives the digital audio data, analyses the digital audio data for processing and extracts haptic signals for generating a haptic effect through an actuator. The method includes passing the digital audio signal on through dynamic processor(s), adjusting the dynamic range of the digital audio signal, extracting the signal envelope of the audio data, synthesising low-frequency signals from the extracted signal envelope, and enhancing the low-frequency content using a resonator. The haptic output is generated by mixing the digital audio signal with outputs from the different modules of the haptic processing system. An analytics module monitors, controls and adjusts the processing of the digital audio signal at the noise gate module, the compressor module and the envelope module to enhance the haptic output.

43 Claims, 32 Drawing Sheets

(51) Int. Cl.
    *H04R 1/10*     (2006.01)
    *H04R 5/04*     (2006.01)
    *G06F 3/01*     (2006.01)
    *G06N 3/04*     (2006.01)
    *G06N 3/08*     (2006.01)
    *H03G 9/14*     (2006.01)

(52) U.S. Cl.
    CPC ............ *H03G 3/3005* (2013.01); *H03G 9/14* (2013.01); *H04R 1/1008* (2013.01); *H04R 1/1075* (2013.01); *H04R 5/04* (2013.01); *H04R 2205/022* (2013.01); *H04R 2400/03* (2013.01)

(58) Field of Classification Search
    USPC .......................................................... 381/162
    See application file for complete search history.

(56) References Cited

U.S. PATENT DOCUMENTS

| | | |
|---|---|---|
| 2013/0227410 A1 | 8/2013 | Sridhara et al. |
| 2013/0265286 A1 | 10/2013 | Da Costa et al. |
| 2014/0064516 A1 | 3/2014 | Cruz-Hernandez et al. |
| 2014/0176415 A1 | 6/2014 | Buuck et al. |
| 2018/0034435 A1 | 2/2018 | Stegner |
| 2018/0067558 A1 | 3/2018 | Eagleman et al. |
| 2019/0286235 A1 | 9/2019 | Gautama |
| 2019/0378383 A1 | 12/2019 | Büttner et al. |
| 2019/0379342 A1 | 12/2019 | Weber |
| 2019/0379976 A1 | 12/2019 | ap Dafydd et al. |

OTHER PUBLICATIONS

Office Action prepared by the US Patent and Trademark Office for U.S. Appl. No. 16/435,344, dated Dec. 2, 2019, 17 pages.
Office Action prepared by the US Patent and Trademark Office for U.S. Appl. No. 16/435,349, dated Mar. 4, 2020, 41 pages.

SYSTEMS AND METHODS FOR GENERATING HAPTIC OUTPUT FOR ENHANCED USER EXPERIENCE

CROSS REFERENCE TO RELATED APPLICATION

This application claims priority to U.S. Provisional Application Ser. No. 62/681,755, filed Jun. 7, 2018, which is incorporated herein by reference in its entirety for all purposes.

FIELD OF THE INVENTION

The present invention relates to haptic processing system to generation of a haptic response. More specifically, the invention relates to digital audio signal processing to generate a haptic output in an actuator.

BACKGROUND

Haptic usually refers to a sense of touch provided to a user as a feedback force or vibration on a user interface of an electronic device. The feedback force can provide information to the user. With technological advancement, user interfaces are now integrated with haptic interfaces that provide haptic feedback. Mobile devices, gaming devices, and automobiles are now integrated with haptics to provide a better user experience. An important element of providing user feedback is the processing of the audio signal to convert the audio signal into a haptic response. The haptic response drives an actuator to provide vibration in response to a touch on a user interface. Another application of haptics is to provide real time experience to a user by inducing vibration in the human body along with audio. This application is widely used in headsets, headphones, wearable straps, and other devices. All these applications require processing of the audio signal to extract a haptic response from the audio signal in real time. The user experience in haptics is widely influenced by the haptic processing system that converts the input audio data to generate a haptic response. User experience is usually controlled by the ability of the haptic processing system to process and generate a good haptic effect.

Several technologies provide different implementations to provide haptic output from the input audio signal, for example, U.S. Pat. No. 7,979,146 provides a system and method for automatically converting the received audio signal into haptic events by separating the audio signal into a number of sub-bands and segments. The sub-band signal is then converted into a number of events. The system assigns haptic events to specific sub-bands that generate a haptic response in an actuator. The system provides different parameters related to frequency characteristics, actuator parameters, and minimum time separation for generating a haptic response.

Similarly, U.S. Pat. No. 8,378,964 extends the technology. It provides a structured representation of haptic events. The method calculates the event score for different channels and, based on cumulative score, assigns haptic events to specific channels to generate a haptic response in an associated actuator.

US Patent Application Publication No. 2009/0189748 provides a method and an associated device for processing an audio signal and/or a video signal to generate haptic excitation. A haptic excitation generating unit generates haptic excitation on specific body parts of the user by generating airflow through a vent. Accordingly, the haptic excitation is conveyed to the user body.

U.S. Pat. No. 8,717,152 describes a haptic effect conversion system using a waveform. Audio frames from an audio source are intercepted by the haptic conversion system to generate a haptic signal, which is passed on through an actuator to produce haptic effects. The haptic signal is based on a maximum value of each audio data frame, which defines a magnitude of the haptic signal.

The current state of technology provides different techniques to process audio signals to generate a haptic signal that can be passed on to the actuator to generate a haptic effect. However, no state-of-the-art technology provides additional analytics and processing to amplify suppressed frequencies, handling of transients, dynamic updating of parameters in different dynamic processors for creating a haptic signal that enhances the user experience.

The present invention uses several techniques to enhance the haptic experience of the user by using each digital audio data sample, utilizing side-chaining, resonance and physical modules, utilising the average value of amplitude and other associated modules to provide an improved and continuous haptic experience. Another problem associated with present haptic conversion system is the lack of haptic response in the absence of adequate low frequencies. If the audio signal has a stream of high frequency components, most of the high frequencies are attenuated during filtering of the audio signal, thereby producing no haptic response. In addition, certain low frequency components, although present, might be eliminated during the filtering and the processing stages. This results in deprecated user experience. Ideally, the haptic processing system should provide a real time haptic effect in order to provide an enhanced user experience with an audio-tactile effect. A rich user experience can be provided if the audio signal is processed in real time with minimum delay, each audio signal data sampled is processed and analysed, and low-frequencies are amplified and/or appended to produce a haptic effect.

Accordingly, the technology in the present invention provides methods and systems of efficiently and effectively processing audio signals to produce haptic output by using one or more dynamic processors, physical resonance modules, and mixers for digital signal processing. An analytics module simultaneously monitors and controls the haptic output for enhanced user experience.

SUMMARY OF THE INVENTION

Systems and methods of the present invention disclose a haptic processing system. The haptic processing system includes a digital signal processing chain and an analytics module. The digital processing chain comprises down sampler, a low pass filter, at least one dynamic processor, at least one compressor, at least one envelope follower, at least one oscillator, at least one resonance module, at least one mixer, at least one bell filter, at least one limiter and other modules. The analytics module, which also receives the audio input signal, act independently and controls the digital processing chain. The analytics module passes parameters to control the processing of audio signal in the digital signal processing chain.

In embodiments, there is at least one analytics module. In embodiments, the analytics module controls at least one parameter in the digital processing chain. In embodiment, the at least one parameter may be gain, threshold, RMS/peak value, attack, release, makeup-gain, knee or some other type of parameter associated with the audio signal. In embodiments, the analytics module may modulate the processing of audio signal in the digital signal processing chain. In another embodiment, the analytics module may adjust the processing of audio signal in the digital signal processing chain at specific interval of time. The time interval may vary between 0.01 second to 1 second. In another embodiment, the analytics module may dynamically change the processing of the input audio signal in the digital signal processing chain in real time. In another embodiment, the analytics module may alter the processing of audio signal in the digital signal processing chain in non-real time. The input audio signal is received at the input of the digital signal processing chain, which is passed on to a pre-processing module. The pre-processing module down samples the input audio signal to an acceptable sampling rate that can be processed by at least one dynamic processor. The input audio signal is either a digital input signal or an analog input signal, which is converted into a digital signal using an Analog to Digital (A/D) convertor.

In an embodiment of the present invention, the pre-processing module may filter the input audio signal. Additionally, if required, it may increase the gain of the input audio signal. In an alternate embodiment, when the received audio input signal is at an acceptable sampling rate, the pre-processing module is bypassed from the digital signal processing chain. The output of the pre-processor module is provided to a first dynamic processor. In an embodiment of the present invention, the first dynamic processor is a noise gate. In another embodiment of the present invention, the dynamic processor may be a compressor or a combination of a noise gate and a compressor. The noise gate receives an input audio signal from the pre-processor module. The noise gate includes a detector module, a side chain module, and a threshold module. The threshold module may receive the control parameters from the analytics module. In another embodiment, the side chain module receives a part of the signal from the noise gate module.

When the input signal is received at the side chain module either from the noise gate module or the input audio signal, the detector associated with the side chain module detects whether the received signal is above or below the threshold level. If the signal is above the threshold level, the noise gate opens to pass on the audio signal. However, if the received signal is detected to be below the threshold level, the noise gate closes to attenuate the received signal by a gain factor. The gain factor is a gain reduction, which is applied to the received input signal.

The analytics module simultaneously receives the input audio signal and calculates the threshold parameters based on input audio signal characteristics. The analytics module then passes the parameters on to the noise gate to set the threshold level in real time. In an embodiment of the present invention, the analytics module may set the threshold level and/or gain of the noise gate module. The analytics module dynamically updates the parameters at each instant of time.

In an embodiment of the present invention, the analytics module may receive input audio signal before the digital signal processing chain. For example, the input audio signal feed to the digital signal processing chain is delayed by a pre-determined time. In an embodiment of the present invention, the time delay introduced may vary from 1 millisecond to 100 milliseconds. In another embodiment, a look-ahead mechanism is provided by first passing the signal on to the analytics module and subsequently passing the output signal on to the digital signal processing chain. In yet another embodiment, the look-ahead mechanism may be provided by predictive algorithms implemented in the analytics module. The predictive algorithms monitor the input audio signal in real time and predict the parameters to be provided to at least one or more dynamic processors.

A part of the input audio signal is also provided to a dry/wet module. The dry/wet signal mix may facilitate enhancing the haptic output by the mix of a dry audio signal to a wet audio signal. The dry audio signal mean an unprocessed audio signal or an audio signal without any sound effects. Likewise, the wet audio signal means an audio signal that has been processed with sound effects. When no sound effects can be produced using the dry audio signal, the mix of the dry/wet signal may serve as the basis to produce a haptic output. For example, the wet mixer may process and produce dynamic based-effects, frequency-based effects, and time-based effects, which are mixed with the dry signal to improve the aesthetics and/or technical effects. In preferred embodiments, the time-based effects are utilized in dry/wet signal mix. In an example, the wet signal may produce a single echo or a pitch shift. Such a wet signal will produce little haptic output. A mix of a dry/wet signal will allow to increase the haptic output by introducing a substantial amount of a dry signal. In some embodiments, the ratio of the dry/wet signal is controlled dynamically by the analytics module. In another embodiment, the ratio of the dry/wet signal is controlled by a pre-set module. In yet another embodiment, the ratio of the dry/wet signal is controlled by both the analytics module and the pre-set module. The dry/wet module also receives another input from the output of the noise gate. The dry/wet module then mixes the two received inputs signals, that is, the input audio signal and the output from the noise gate, in a pre-determined proportion and passes it on to the mixer module.

In an embodiment, the pre-determined proportion may be a constant value. In another embodiment, the pre-determined proportion may be adjustable by either the software or through a user interface. The user can access the preset to control the mixing of dry/wet signal through a user interface.

The output signal from the noise gate is passed on to another dynamic processor. In an embodiment of the present invention, the dynamic processor is a compressor. The compressor reduces the dynamic range of the received signal.

In an embodiment of the present invention, the side chain module may be associated with one dynamic processor, for example, the compressor, which may include a detector module and a threshold module. In another embodiment, the detector module and the threshold module may be independent modules associated with the side chain module and the noise gate module. In yet another embodiment, the compressor module may include the side chain module, the detector module, and the threshold module.

The output of the compressor module is provided to an envelope follower module, which converts the high-frequency signal into a low-frequency signal. In addition, it transforms the bipolar input signal into a unipolar output signal. The output of the envelope follower is provided to an oscillator module that modulates the received audio signal. Parallelly, the output signal from the compressor module is also provided to a resonance module that (a) amplifies suppressed low frequencies; (b) excitates physical models of string, membrane, plate or other musical instrument models based on the input audio signal; and (c) adds low frequencies to the output signal.

A mixer module mixes the output signal from the dry/wet module, the oscillator module, and the resonance module.

The output of the mixer module is passed on to a pass filter, a limiter module, a bell filter module and an actuator to produce haptic output.

In another embodiment of the present invention, the haptic processing system comprises a digital signal processing chain and an analytics module. The digital signal processing chain includes an audio input signal, a pre-processing module, a signal detection module, a gain controller module and other modules. The digital signal processing chain is the signal flow path from the input audio signal to the haptic output signal. The gain controller module is coupled to a first gain control processor and a second gain controller processor and other modules illustrated in accompanying drawings. Parallelly, the gain controller module also provides the input audio signal to a dry/wet module and the analytics module.

In an embodiment of the present invention, the digital signal processing chain may include a processor, which is shared by the modules of the digital signal processing chain by sharing or by multithreading or multitasking. In another embodiment, the digital signal processing chain may have multiple processors, which is shared by other modules associated with the digital signal processing chain by sharing multithreading or multitasking. In yet another embodiment, each module in the digital signal processing chain is embodied as a VLSI integration associated with a shared or independent processor.

In this embodiment, the analytics module includes a peak analyzer module, a transient detection module, an RMS generator module, a side chain module, a detector and threshold module, a predictive and intelligence module, a gain controller module, and a frequency gain controller module. The analytics module performs all the calculations related to peak detection, root mean square values, and the transient detection. The analytics module calculates parameters that are required to be passed on to the first gain control processor and the second gain control processor. Furthermore, the analytics module also provides control parameters to the envelope follower module and a dual filter module.

In an embodiment of the present invention, each module has one or more processors. For example, the peak analyzer module may have an independent processor and a memory. In another example, the transient analysis module may have an independent processor and a memory. In yet another example, the input signal analyzer and RMS generator module may have an independent processor and a memory. In yet another example, the sidechain module may have an independent processor and a memory. In yet another example, the predictive and intelligence module may have an independent processor and a memory. In yet another example, the detector and threshold module may have an independent processor and a memory. In yet another example, the gain controller module may have an independent processor and a memory.

In an embodiment of the present invention, the analytics module may include a peak analyzer module, a transient detection module, an RMS generator module, a side chain module, a detector and threshold module, a predictive and intelligence module, a gain controller module, and a frequency gain controller module which are directly connected to each other. In another embodiment of the present invention, some of the modules in the analytics module are directly connected to each other, whereas other modules are indirectly connected to each other, that is, these modules exchange parameters by function calls, memory referencing, shared memory or pointers. In another embodiment of the present invention, all the modules are directly and indirectly connected to each other.

In an embodiment of the present invention, the parameters passed on by the analytics module are related to at least a threshold level and a gain reduction. In another embodiment, the parameters passed on by the analytics module are related to at least a threshold level and gain.

The output from the second gain control processor is provided to an envelope follower module, a physical resonance module, and a dry/wet module. The oscillator module modulates the envelope follower output. The output of the oscillator module, the resonance module and the dry/wet module is mixed together in a mixer module. The output of the mixer module is provided to a dual filter module, a limiter module, a filter module and an up-sampling module before it is passed on to an actuator to produce haptic output.

A pre-set module passes a parameter on to control the dry/wet module, the mixer module, the dual filter module, the limiter module, the filter module, and the up-sampling module. The parameter provided by the pre-set module is utilised to control the input audio signal without interfering with the digital signal processing chain.

In an embodiment of the present invention, the input audio signal passed on to the root mean square module, which is temporarily set to zero when a transient is detected in the input audio signal. Subsequently, the RMS generator module sets the calculation related to the RMS values to zero on detection of a transient signal.

In an embodiment of the invention, the dual filter module receives parameters from the analytics module and the pre-set module independent of the digital signal processing chain.

In an embodiment of the present invention, a haptic processing system for real-time and non-real-time signal processing of an input audio signal comprises: an analytics module further comprising a transient detection and analysis module; a peak analyzer module; an input signal analyzer and root mean square module; a side chain module and a detector and threshold module configured to detect if the input audio signal is below or above a threshold value, wherein the determined values are passed on to a predictive and intelligence module; a gain controller module associated with the predictive and intelligence module determines gain reduction parameters, wherein the predictive and intelligence module applies predictive algorithms to determine parameters to be applied to at least one dynamic processor associated with a digital signal processing chain to modulate a threshold level and a gain reduction in real time to produce a haptic output.

In an embodiment of the present invention, a haptic processing system for producing haptic output from an input audio signal comprises a detection module; a noise gate module configured to a first sidechain module further comprising a detector module and a threshold module; a dry/wet module configured to mix an input audio signal with a signal output of the noise gate module in a pre-determined proportion; a compressor module configured to a second sidechain module; an envelope module associated with a fixed frequency oscillator; a resonance module configured to (a) amplify suppressed low frequencies, (b) excitate physical models of string, membrane, plate or other musical instrument models based on the input audio signal, and (c) add low frequencies to the output signal; a mixer module configured to mix an output signal from the dry/wet module, the fixed frequency oscillator module, and the resonance module; and an analytics module configured to independently process the input audio signal to assimilate intelligence and to provide parameters to the noise gate module and the compressor module.

In an embodiment of the present invention, a computer readable medium has instruction encoded thereon, that, when executed by a processor, provides a haptic feedback based on an input audio signal, the instructions performing the steps of (a) processing the input audio signal into a first dynamic processor, the first dynamic processor configured to a first sidechain to control a threshold level and a gain reduction of the input audio signal based on parameters received from an analytics module; (b) inputting the processed audio signal to a second dynamic processor, the second dynamic processor configured to a second sidechain to modulate the gain reduction of the received audio signal based on the parameters received from the analytics module; (c) passing the received audio signal from the second dynamic processor on to (i) an envelope follower module to extract the audio signal envelope and modulate the amplitude of the extracted audio signal envelope using a fixed frequency oscillator and (ii) a resonance module configured to excite physical models of string, membrane, plate or other musical instrument models from the input audio signal, (d) mixing the signal output from the envelope module, the resonance module, and a dry/wet module signal, (e) providing the output to a low pass filter, a limiter and a bell filter to produce a haptic signal; and (f) sending the haptic signal to an actuator for generating a haptic output.

Systems and methods in embodiments of the present invention disclose a transient detection process to produce a haptic output using a digital signal processing chain further comprising at least one or more dynamic processors and a dual filter having a first filter and a second filter. An analytics module comprises a transient detection module, the transient detection module performing the steps of: (a) detecting the transient signal in the input audio signal by passing the input audio signal simultaneously on to a high pass envelope follower and a low pass envelope follower and calculating the difference in gain between the high pass envelope follower and low pass envelope follower; (b) calculating a transient score based on the difference in the gain; (c) receiving a transient threshold; (d) deriving a transient binary based on the transient score, wherein the transient binary is one when the transient score is above the transient threshold and zero when the transient score is below the transient threshold; (e) calculating a transient output by multiplying the transient binary with the transient score; and (f) providing the transient output to an envelope follower and a dual filter and the binary score to the RMS detection module.

In an embodiment of the present invention, the transient detection algorithm can be implemented in a medical device, an audio device, an electronic device or some other device.

In an embodiment of the present invention, a haptic processing system and/or method configured to produce haptic output from an input audio signal, comprises: a digital signal processing chain comprising: at least one or more dynamic processors, the at least one dynamic processor enabled to receive an input audio signal having a threshold level or a gain reduction and configured to receive parameters to dynamically control at least the threshold level or the gain reduction of the at least one dynamic processor; an envelope follower configured to receive and convert a bipolar signal into a unipolar signal and to convert the input audio signal into a low frequency signal; a fixed frequency oscillator to modulate the low-frequency audio signal at or near the tuned resonant frequency; a resonance model enabled to enhance the low-frequency signal and to excitate at least one musical instrument; a mixer configured to mix the received audio signal from a pre-set module, the resonance model, and the fixed frequency oscillator; a low pass filter coupled to a bell filter and a limiter; and an actuator to produce haptic output. The system further comprises an analytics processing unit comprising: a peak detector to calculate peak values from the received input audio signal for a fixed time; a root mean square calculator to calculate the root mean square values for a fixed time; a predictive calculator configured to calculate the parameters to be passed on to at the least one dynamic processor based on the calculated root mean square values and the calculated peak values; and means for passing on the calculated parameters for controlling the threshold level or the gain reduction of the at least one dynamic processor to produce haptic output.

DETAILED DESCRIPTION OF THE INVENTION

As used herein, the term "input audio signal", "received signal", "processed signal" are intended to broadly encompass any type of audio signal including analog audio signals, digital audio signals, audio data, audio signals embedded in media programs including signals embedded in video or audio programs that can be rendered using a rendering device capable of reproducing any other type of audio or media program connected to a network or operating independently. It also encompasses live media, linear media and interactive media programs such as music, games, online video games or any other type of streamed media program with embedded audio.

The term "haptic output" or "haptic signal" or haptic experience as used herein shall include a haptic signal produced by processing an input audio signal or derived by utilizing digital signal processing, analog signal processing or digital and analog signal processing of the input-output signal. The haptic output or haptic signal relates to the sense of touch, in particular to the perception and manipulation of objects using the senses of touch and perception to provide an enhanced experience to a user.

The term "digital signal processing" or "haptic signal processing" is intended to be interpreted broadly to include the processing of a digital signal or an analog signal to derive haptic data, haptic feedback, haptic experience or haptic output to the user.

Unless explicitly stated otherwise, the term "module" as used herein includes one or more processors described in the present disclosure (or one or more portions of the one or more processors), which are performing the described functions and/or operations. For example, a digital signal processing module includes one or more processors described in the present disclosure (or one or more portions of the one or more processors), which are performing the digital signal processing (e.g., processor(s) 110 and/or coprocessor 118 described below). Two or more modules may share the same processor(s) or the same portion(s) of the processor(s) described in the present disclosure. The modules may sometimes be referred to herein as processors, such as a digital signal processor.

Furthermore, the present invention and its advantages are best understood by referring to the illustrated embodiments depicted in the accompanying drawings, in which like numbers designate like parts. The present invention may, however, be embodied in numerous devices for haptic signal processing and should not be construed as being limited to the exemplary embodiments set forth herein. Exemplary embodiments are described below to illustrate the present invention by referring to the figures.

Figure 1A:
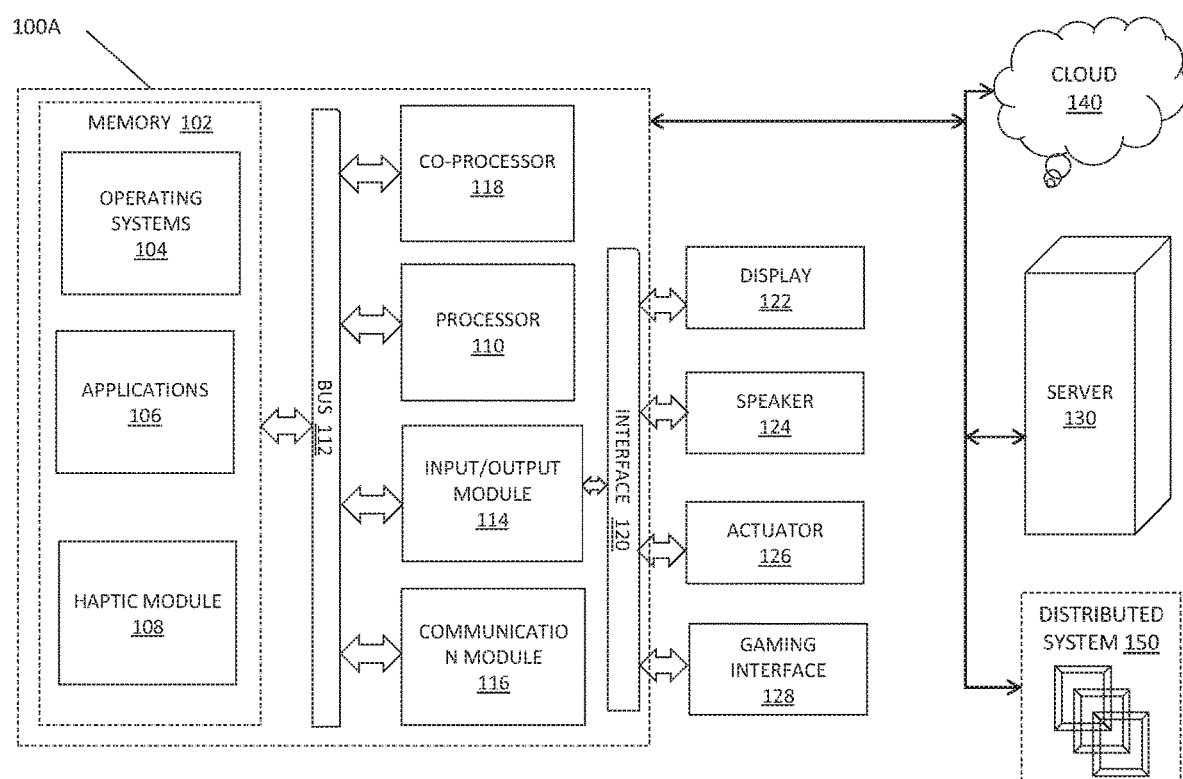
FIG. 1A illustrates a haptic processing system in an embodiment of the present invention.

FIG. 1 depicts a haptic processing system 100A in an embodiment of the present invention. The haptic processing system 100A includes at least one processor 110, a coprocessor 118, a communication module 116 and an input/output module 114, memory 102 and some other modules. The memory 102 comprises an operating system 104, one or more applications 106, and a haptic module 108. The haptic module 108 may include executable instructions to produce a haptic signal from an audio signal for providing haptic feedback or haptic experience. An interface bus 112 provides data communication between the memory 102, the at least one processor 110, the coprocessor 118, the input/output module 114 (also referred to as I/O module 114), the communication module 116 and other modules not shown in FIG. 1.

The interface bus 112 may facilitate the transfer of digital and analog data among various interconnected modules. Additionally, it may provide power to different modules through a power supply and also enable the exchange of data, information, trigger interrupts and perform some other type of functions.

The at least one processor 110 and coprocessor 118 may be enabled to provide hyper-threading, multi-tasking, and multi-processing. Alternatively, the processor 110 may be a special purpose processor or some other type of microprocessor capable of processing analog or digitalized audio signals. The processor 110 and the coprocessor 118 may implement special hardware that may enable digital signal processing, for example, MMX technology provided by Intel®. MMX technology provides an additional instruction set to manipulate audio, video, and multimedia.

In embodiments of the present invention, the processor 110 may be a MMX, SSE, SSE2 (Streaming SIMD Extensions 2), SSE3 (Streaming SIMD Extensions 3), SSSE3 (Supplemental Streaming SIMD Extensions 3), SSE4 (Streaming SIMD Extensions 4) including the variants SSE 4.1 and SSE4.2, AVX (Advanced Vector Extensions), AVX2 (Haswell New Instructions), FMA (Fused multiply-add) including FMA3, SGX (Software Guard Extensions), MPX (Memory Protection Extensions), Enhanced Intel SpeedStep Technology (EIST), Intel® 64, XD bit (an NX bit implementation), Intel® VT-x, Intel® VT-d, Turbo Boost, Hyper-threading, AES-NI, Intel® TSX-NI, Intel® vPro, Intel® TXT, Smart Cache or some other type of implementation for processor.

In embodiments of the present invention, the processor 110 or the coprocessor 118 may be a soft processor such as the MicroBlaze® processor that may include at least a microcontroller, real-time processor, an application processor and the like.

The coprocessor 118 may enhance haptic signal processing in gaming consoles or act in unison with the processor 110 to speed up the haptic signal processing for real-time haptic feedback. The haptic processing system 100A may include a graphics co-processor, a motion-coprocessor, a DSP co-processor or some other type of co-processor that facilitates processing of digital signal processing or some other type of processor.

In an embodiment of the present invention, the haptic processing system 100A may be implemented using a single processor or a microprocessor with a general-purpose instruction set to reduce overheads and memory usage. Furthermore, the single processor implementation may be easy to maintain, concentrated on executing the single task, for example, haptic signal processing, and more durable due to simple architecture. Also, the single processor may allow embedding a haptic processing system into small consumer electronics such as electronic watches, fitness bands, wearable sub-woofer, earphones and the like.

The memory 102 may be a Read-Only Memory (ROM), Random-Access Memory (RAM), digital storage, magnetic tape storage, flash storage, solid-state device storage or some other type of storage device. The program instructions may be stored in the memory 102 as encoded instructions. In other embodiments, the memory 102 may store encrypted instructions, source code, binary code, object code, encrypted compiled code, encoded executable code, executable instructions, assembly language code or some other type of computer readable instructions. Furthermore, those skilled in the art will appreciate that the type of memory utilised for storing the haptic module 108 in a device may depend upon various parameters. In embodiments, these parameters may include shape, size, function, and configuration of the device implementing haptic processing system 100A. For example, the device may be a headphone, headset, gaming console, laptop, wearable device, electronic pad, mobile phone, phablet, tablet, iPad, gaming pad, wearable electronic device, Bluetooth watch, haptic band or medical device implementing haptic feedback such as, but not limited to, blood pressure meters, glucose meters, blood counters or some other type of electronic device.

The at least one processor 110 and the coprocessor 118 may operate in synchronization to execute instructions stored in haptic module 108. For example, the co-processor 118 may execute complex mathematical instructions to reduce execution load on the processor 110. Alternatively, the processing workload may be hardcoded in the program instructions stored in the haptic module 108 and may be executed in the sequence as provided in the program. In another embodiment, the haptic module 108 may have associated specialized hardware for digital signal processing. For example, an Attack Hold Release Filter (AHR) Filter, IIR filter for interpolation, and extrapolation of real-time audio signals may be implemented by using predictive algorithms or the like.

Moving to the communication module 116, the communication module 116 may interface with external devices/applications via wired or wireless communication. For example, the communication module 116 may connect to a server 130 via wired cable. Likewise, the communication module 116 may facilitate the transfer of data and information or update any application in the haptic processing module 100A via cloud 140.

In another embodiment, the haptic module 108 may be connected to a distributed network 150 via a wireless or wired network for updating the binary code as and when the updates to the software are available. In embodiments, the updates might be available over a secure wireless connection over the Internet implementing well known encryption techniques and protocols. The communication module 116 may connect with one or more different servers to download updates.

In an embodiment of the present invention, the communication module 116 may be connected to an electronic device, which may download the binary code for updating the haptic processing module 100A. The haptic processing module 100A may be connected to any electronic device such as a laptop, mobile device, desktop and the like. In an alternate embodiment, the electronic device may be connected by a wired connection such as but not limited to a Universal Asynchronous Receiver-Transmitter (UART) or via some other serial communication mode. Alternatively, it may be updated using a Universal Serial Bus (USB) and the like.

In an embodiment of the present invention, the I/O module 114 may be connected to one or more input/output devices like a display 122, a speaker 124, an actuator 126 and a gaming interface 128 using a wired connection. For example, the I/O module 114 may be implemented in a single device and all I/O devices are connected with each other using a wired connection.

The I/O module 114 may connect with display 122 using a mini display port, microdisplay port, DDM, display stream compression, eDP, iDP, PDMI, wDP, SlimPort, DisplayID, DockPort, USB-C, HDMI, DVI, VGA, FPD-Link or some other type of connection.

In an alternate embodiment, the I/O module 114 may be connected wirelessly to one or more input/output devices like the display 122, the speaker 124, the actuator 126 and the gaming interface 128. For example, the haptic module 108 may be implemented in a distributed environment. The haptic module 108 may be implemented in a modular form, wherein some modules may be implemented in the actuator 126. Other modules may be implemented in memory 106. The actuator 126 may communicate wirelessly with the haptic processing system 100A to produce haptic feedback. In some embodiments, the communication module 116 may be implemented using a wireless protocol such as but not limited to Bluetooth, Bluetooth Low Energy (BLE), ZigBee, Z-Wave, 6LoWPAN, Thread, WiFi-ah (HaLow), IEEE 802.11, GSM including 2G, 3G, 4G and 5G, LTE Cat 0, 1, & 3, LTE-M1, RFID, NFC, ANT & ANT+ (Samsung Devices), WirelessHART (open wireless standard), DigiMesh, and MiWi.

In one embodiment of the present invention, the haptic processing modules 100A may implement wireless protocols such as 802.11 a/b/g/n and other variants of the 802.11.

In another embodiment of the present invention, the haptic processing modules 100A may implement wireless audio standards such as but not limited to Bluesound, Bose SoundTouch, Denon HEOS, NuVo Gateway, Pure Audio Jongo, Samsung Shape, and LG's NP8740.

In another embodiment of the present invention, the haptic processing modules 100A may implement amplitude modulation or frequency modulation to receive a radio signal, which may be broadcasted by a broadcasting device or broadcasting station.

The I/O module 114 is enabled to support one or more actuators like the actuator 126. The actuator 126 may include at least one sensor or at least one transducer. In some embodiments of the present invention, the actuator 126 may be a piezoelectric actuator, electroactive polymer (EAP) actuator, an electromagnetic actuator, voice-coil actuator, a solenoid, a linear resonant actuator (LRA), a motor or some other type of transducer capable of providing haptic output. However, for the sake of simplicity, only one actuator 126 has been shown in illustrative FIG. 1.

In other embodiments, the haptic module 108 may be integrated into one or more devices. For example, the haptic processing system 100A may be implemented in an embedded device. Examples of the embedded devices include but are not limited to headsets, headphones, mobile devices, gaming consoles, gaming controllers, virtual/augmented/mixed reality controllers, virtual/augmented/mixed reality headsets, handheld electronic devices, wearable electronic devices, cameras, joysticks, tablets and PDAs.

In some embodiments, the haptic processing system 100A may be embedded in the microchip or a micro-controller without deviating from the scope and spirit of the invention.

In an embodiment of the present invention, the haptic processing system 100A may be implemented on a system on chip (SoC). The implementation of the haptic processing system 100A in the system on chip may be around a microcontroller or around a microprocessor.

In another embodiment, the haptic processing system 100A may be implemented on a programmable system on chip (PSoC).

In yet another embodiment, the haptic processing system 100A may be implemented in a field-programmable gate array (FPGA).

In yet another embodiment, the haptic processing system 100A may be implemented in a complex programmable logic device (CPLD).

In yet another embodiment, the haptic processing system 100A may be implemented in a system in package (SiP) comprising a one or more chips in a single package.

In yet another embodiment, the haptic processing system 100A may be implemented in an application-specific integrated circuit (ASIC).

In yet another embodiment, the haptic processing system 100A may be implemented in an application-specific standard product (ASSP).

In yet another embodiment, the haptic processing system 100A may be implemented using analog components such as but not limited to FET, Transistors, Integrated circuits, capacitors, resistors, inductances or any combination thereof.

In yet another embodiment, the haptic processing module 100A may be implemented in software in the haptic module 108. In one embodiment, the software instructions implemented in haptic module 108 may be encoded in the memory.

In yet another embodiment, the processing module 108 may be programmed in the memory. The software instructions may be implemented assembly language, binary code, machine language, high-level programming language or any combination of these languages.

In another example, the haptic processing system 100A may be implemented as a combination of software and hardware without deviating from the scope and spirit of the invention.

Figure 1B:
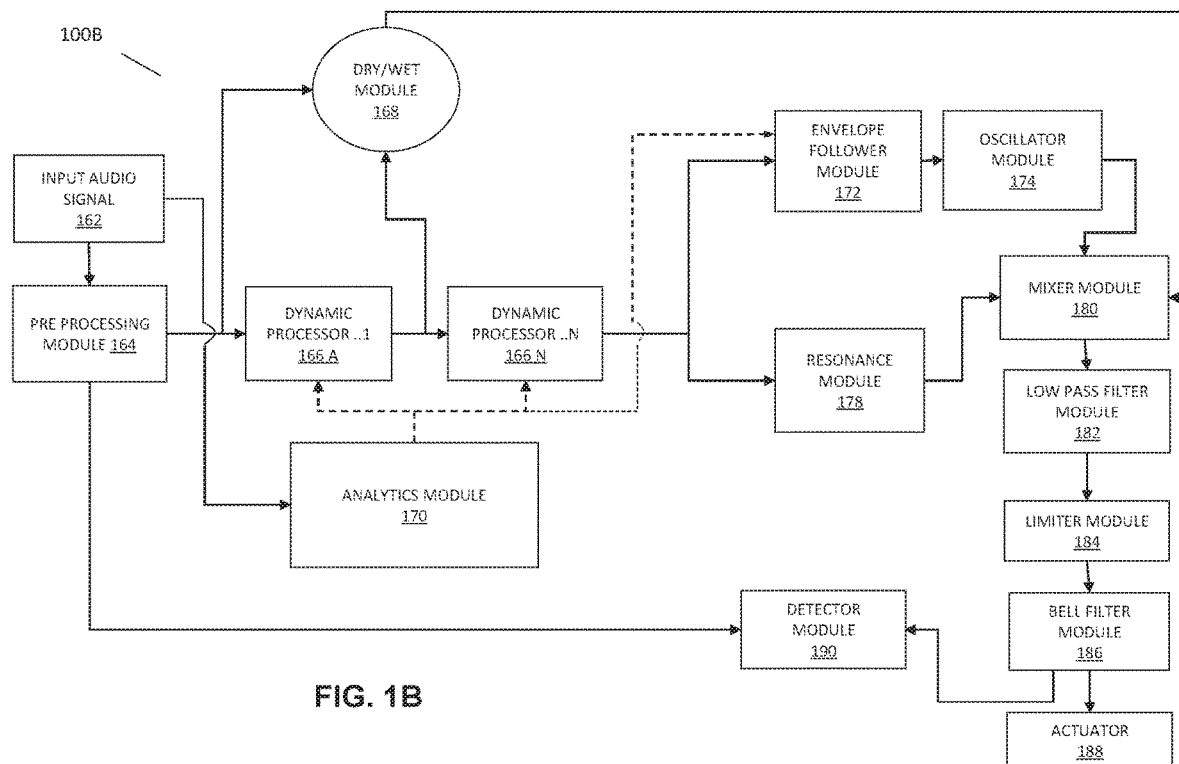
FIG. 1B illustrates a haptic module of a haptic processing system in an embodiment of the present invention.

Referring to FIG. 1B, in an embodiment of the present invention, a high-level modular architecture of the haptic module 108 is provided. The haptic module 108 may be implemented as software or as a combination of software and hardware. Alternatively, the haptic module 108 may be implemented in a modular arrangement, wherein some of the modules may be implemented in a device A and other modules may remotely implemented in another device B. For example, one or more modules may be implemented in a headphone or headset (device A), while other modules may be implemented in another device B. The device B may be a wearable watch, a base station, an electronic processing device, a gaming console, a musical instrument or some other type of electronic processing device.

The haptic module 108 receives an audio input signal 162. The audio input signal 162 may be a digital signal or an analog signal. The audio input signal 162 may be monophonic, stereophonic, quadraphonic, multichannel audio formats (e.g. 2.1, 4.1, 5.1, 7.1 or some other type of surround sound formats), or a digital standard such as S/PDIF, HDMI, TOSLINK, I²S, Dolby Digital Plus, AES50, HyperMAC, USB, Firewire, Thunderbolt, Apple Lightning or some other type of digital formats.

The input audio signal 162 is passed on to the pre-processing module 164. The pre-processing module 164 processes and transforms the input audio signal 162 and converts it into a suitable form for producing haptic output. In some embodiments, the preprocessoring module 164 may filter, transform, down-sample, up-sample or perform some other type of processing. The preprocessoring module 164 then passes the processed signal on to one or more dynamic processors 166A to 166N. In addition, the input audio signal 162 may also be provided to an analytics processor or analytics module 170. The dynamic processor 166 may be a specialised type of processor including but not limited to a noise gate, a compressor, and a limiter, which are described in detail in the subsequent figures in different embodiments.

The output from the one or more dynamic processor 166 may be passed on to a dry/wet processor or dry/wet module 168. The dry/wet module 168 also receives the input audio signal 162. The output received from the dynamic processor 166A and the input audio signal 162 are combined in a fixed ratio in the dry/wet module 168. The ratio of the input audio signal 162 and the output signal from the dynamic processor 166A is referred to as "dry/wet" ratio. In some embodiments, the dry/wet ratio may be pre-programmed or may be dynamically determined based on parameters of input signal 162 that may be but are not limited to phase, frequency, and amplitude. The dry signal to wet signal ratio may be programmable based on input received from a user interface. Alternatively, the dry/wet ratio may be set to one of the selectable ratios in available in the user interface.

In some embodiments, the output signal from the dynamic processor 166A is passed on to the dynamic processors 166B . . . 166N. In one embodiment of the present invention, there are at least two dynamic processors 166. In yet another embodiment, there may be at least three dynamic processors 166. In yet another embodiment, there may be at least four dynamic processors 166. It may be noted that the dynamic processors 166 may all be different in functionality but are collectively referred to as dynamic processors 166. In some embodiments of the present invention, the dynamic processors 166 may be a noise gate, a compressor, a decompressor, an expander, a limiter, a multi-band compressor, a look-ahead compressor, a sidechain compressor, a brick wall limiting compressor, a parallel compressor or some other type of compressor.

The output from the dynamic processor 166N is fed to an envelope detector or envelope detector module 172. The envelope detector module 172 produces a low-frequency waveform of the input signal received from the dynamic processor 166N module. The low-frequency waveform from the envelope detector module 172 is modulated using a fixed frequency oscillator module 174 to produce a low frequency modulated waveform. Simultaneously, the output from the dynamic processor 166N is passed on to a resonance processor or resonance module 178. The resonance module 178 then amplifies the low-frequency components corresponding to strings, membrane or other musical instruments for passing on to a mixer or mixer module 180. In another embodiment of the present invention, the resonance module 178 may create additional new frequencies corresponding to strings, membrane or other musical instruments for passing on to a mixer module 180. In yet another embodiment, the resonance module 178 may amplify as well as append additional new frequencies corresponding to string, membrane, or other musical instruments for passing on to a mixer module 180. The mixer module 180 receives the input signals from the dry/wet module 168, the fixed frequency oscillator module 174, and the resonance module 180 and mixes them in a pre-defined ratio. In some embodiments, the pre-defined ratio may be determined using a fuzzy logic module, an artificial intelligence module, a programmed instruction, or may be at least dependent on one parameter of the input signal, namely, gain, phase, frequency, or amplitude. The output from the mixer module is passed on to a low pass filter module 182, a limiter module 184 and a bell filter module 186 and finally to an actuator 188 to produce a haptic output.

The output of the bell filter module 186 is also passed on to a detector or detector module 190, which probes the presence of signals at the pre-processing module 164 and the output signal from the bell filter 186. When the detector module 190 detects a signal at the input and the output, it ensures that the haptic processing module 100B is kept in an active power ON mode. In the absence of the input signal at pre-processing module 164 and the output signal at the bell filter 186, the detector module 190 may direct the haptic processing module 100B to enter power saving state to save battery.

In some embodiments of the present invention, the haptic processing module 100B may be powered by power supply from an external source with the appropriate voltage and current. Alternatively, the power supply may be provided by a battery. The battery may either be a chargeable or a non-chargeable battery. In some embodiments, the battery may be a Small Sealed Lead Acid (SSLA) battery, Absorbed Glass Mat (AGM) battery, Gel battery ("gel cell"), nickel metal hydride battery, nickel cadmium battery, lithium ion battery or some other type of rechargeable battery.

In one embodiment of the present invention, the detector module 190 may receive an input audio signal 162 and an output signal from the pre-processing module 164 to decide when to move to power saving mode or remain in power active state. For example, based on specific parameters such as but not limited to the presence of an input audio signal 162 and output from pre-processing module 164, the detector module 190 may decide to keep the active power ON state of the haptic processing module 100B.

In another embodiment of the present invention, the detector module 190 may receive the input audio signal 162 and the output signal from the bell filter module 186 to decide upon the power state of the haptic processing module 100B. For example, the detector module 190 may probe the presence of the input audio signal 162 and the output signal at the bell filter module 186. If the detector module 190 detects the input audio signal 162 and the output signal at the bell filter module 186, the detector module 190 keeps the haptic processing module 100B in power ON state. However, in the absence of the input audio signal 162 and the output signal at the bell filter 186, the detector module 190 puts the haptic processing module 100B into a power saving or power off mode. In another example, in the absence of the input audio signal 162 and presence of the output signal at the bell filter module 186, the detector module 190 initiates a counter that counts till a pre-determined period before entering into the power off state or power saving mode. In some embodiments, the pre-determined period may vary from 1 to 20 seconds. In a preferred embodiment of the present invention, the pre-determined period may be 10 seconds.

In yet another embodiment of the present invention, the detector module 190 may receive a signal from the pre-processing module 164 and the output signal from the bell filter module 186 to decide whether to enter the power saving mode or remain power ON state.

In yet another embodiment of the present invention, the detector module 190 may receive the input audio signal 162 and the output signal from the analytics module 170 and the bell filter module 186 to decide upon the power state.

According to one aspect of the invention, each data segment of the input audio signal is analysed to generate the haptic signal. The invention utilises a digital signal processing chain and an analytics module to produce haptic output. In some embodiments, the digital signal processing chain is the flow path of the input audio signal to produce a haptic output. For example, the direct flow of signal through various modules to produce the haptic output may be a digital signal processing chain. Investigating each data segment of the input audio signal reduces response time and synchronises the haptic output with the input audio signal. The invention utilises the analytics module to calculate and store peak and root mean square values associated with the input audio signal. At least one dynamic processor may be employed to remove noise and reduce the dynamic range of the input audio signal. A sidechain is provided as a feedback to control the threshold values and the gain of the at least one dynamic processor. The at least one dynamic processor may be a noise gate, a compressor, or two noise gates or two compressors or the like. The low-frequency components received from the at least one dynamic processor may be enhanced by a resonance model, which adds or amplifies the low-frequencies that may be suppressed or reduced in the received signal. An envelope follower converts the received high-frequency signal into a low frequency signal, which is passed on to the fixed frequency oscillator. The received signal is mixed with signals from other modules to produce a haptic output signal.

The haptic module 108 calculates the root mean square amplitude values of the signal using differently sized averaging windows of the input audio data segments. The input audio signal may be analysed using one or more data segments. In one embodiment, the number of data segments of the input audio signal may vary with time. For example, the number of data segments in the single window may be 50. Likewise, the number of data segments in the next window may be 75. Accordingly, the average amplitude of the different windows may vary according to the size of the data segments. Further, the haptic processing module calculates the peak amplitude values and root mean square amplitude values of the input audio signal. The haptic processing module buffers and stores the peak amplitude values and the corresponding root mean square values for the fixed period. These buffered values are utilised to control the settings of one or more dynamic processors such as a noise gate, compressor, and sidechain. These settings are continuously updated with new values to modulate the processing of the input audio signal for producing the haptic output. Advantageously, this novel and unique method and system architecture provides enhanced user experience.

In an embodiment of the present invention, the calculation of root mean square values and the peak values is performed in the analytics module 170.

In addition, the haptic processing module may apply a fast onset/transient detection mechanism to enhance or compensate the haptic signal in presence of transients. For example, the transient may be an event such as a kick-drum in music or a gunshot in a game audio signal. The onset detection mechanism is utilised to enhance the intensity of the haptic signal for providing a higher level of haptic experience to the user. In embodiment of the present invention, the transient detection mechanism is performed in the analytics module 170.

Figure 2:
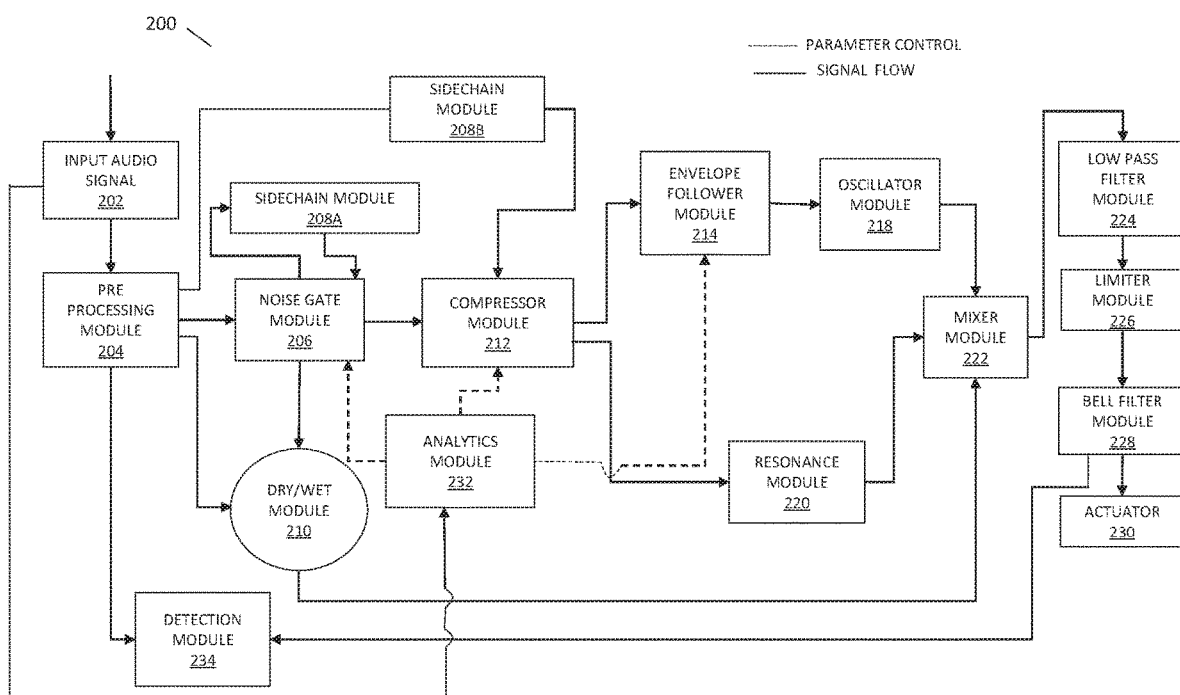
FIG. 2 illustrates a haptic processing module with at least two dynamic processors in an embodiment of the present invention.

FIG. 2 provides a detailed architecture of a haptic processing module in a preferred embodiment 200 with at least two dynamic processors. The haptic processing module 200 may be implemented as hardware, software, or as a combination of hardware and software.

The haptic processing module 200 illustrates two dynamic processors in an embodiment of the present invention. In this embodiment, the first and second dynamic processors are shown as a noise gate and a compressor, respectively. For the sake of detailing and clarity, the dynamic processors have been named based on the functionality provided by them. However, those skilled in the art will appreciate that in other implementations more than two noise gates or more than two compressors may be provided without deviating from the scope and spirit of the invention.

The haptic processing module 200 may receive the input audio signal 202 to produce a haptic signal as an output. The input audio signal 202 may be an analog or a digital signal or a digital data. In a preferred embodiment, the input audio signal 202 is a sampled digital signal, a monophonic digital signal, a stereophonic digital signal, a quadraphonic digital signal or some other type of sampled digital signal.

The input audio signal 202 is passed on to a pre-processing module 204. The pre-processing module 204 processes the input audio signal 202 and transforms it into a suitable form for further processing. In one embodiment, the pre-processing module 204 may include a down-sampler module, an Analog to Digital (A/D) converter module and other modules. If the received input audio signal 202 is an analog signal, an Analog to Digital (A/D) converter module may be utilised to convert the analog signal into a digital audio data stream before further processing. Likewise, the down-sampler module may down sample the input audio signal 202 to a lower sampling rate for processing of the input audio signal 202. For example, the input digital audio data sampled at 44.1 kHz may be down-sampled to 4.9 kHz. Preferably, the received digital signal at the pre-processing module 204 should be sampled at less than 4 kHz to bypass down-sampling of the input audio signal 202. When the input audio signal 202 does not requires down-sampling, the input digital signal 202 can be directly fed to the dynamic processor, for example, a noise gate module 206.

The noise gate module 206 is associated with a sidechain module 208A. The main function of the noise gate module 206 is to reduce noise in the input audio signal 202. The input audio signal 202 is simultaneously passed on to the noise gate module 206 and the sidechain module 208A. The sidechain module 208A includes a detector module, a threshold module, a low pass filter module apart from other modules (not shown in FIG. 2). A threshold value can be programmed into the threshold module. The threshold value may be controlled by an analytics module 232. The analytics module 232 may pass on a one or more parameters to the threshold module to adjust the threshold value or threshold in the noise gate module 206. In one example, the analytics module 232 may analyse the input audio signal 202 to ascertain the amount of noise present in the signal and accordingly pass on a parameter to modulate the threshold value in the threshold module associated with the sidechain module 208A.

In another example, the threshold value or the threshold may be set by a function call from the sidechain module 208A at regular time intervals. For example, a function call to set the threshold value may be initiated after every 10 milliseconds. The analytics module 232, in response to the function call, passes on one or more parameters for setting the threshold value in the sidechain module 208A. In some embodiments, the function call made by the sidechain module 208A to the analytics module 232 may vary from 1 millisecond to 200 milliseconds.

In some embodiments of the present invention, the function call made by the threshold module associated with sidechain module 208A to the analytics module 232 may return an integer value, a float value, a double value, a reference to memory, a sub-routine, a function, or a pointer. These terms are well known in a programming language such as C, C++, JAVA, JavaScript and other programming languages.

In an alternate embodiment, the analytics module 232 may perform a function call to the threshold module associated with the sidechain module 208A at appropriate time intervals to set the threshold value without deviating from the scope and spirit of the invention.

In some embodiments, the threshold value or the threshold may be set using a pre-set control accessible to the user via a software or hardware switch.

The noise gate module 206 may modulate the gain of the received signal based on the threshold value. The threshold value is adjusted by the threshold module, which is associated with the sidechain module 208A based on parameters provided by the analytics module 232. The analytics module 232 may receive a request for the threshold module associated with the sidechain module 208A by a function call. The function call may request for one or more parameters to set the threshold value. The detector module associated with the sidechain module 208A may detect the input signal received at the noise gate module 206 to adjust the gain applied to the signal in the noise gate module 206. When the input audio signal 202 crosses the threshold value, the detector module gets activated. The detector module then applies a gain factor to the noise gate module 206 to attenuate the input audio signal 202. The input audio signal 202 is attenuated or amplified by a gain factor depending on the applied gain. In some embodiments, the gain factor may be between 0 and 1 and the threshold value can be set at a pre-determined value at the time of programming or may be dynamically changed depending on various parameters associated with the input audio signal 202. In a preferred embodiment, the threshold value is programmed and set to a pre-determined value, and the gain factor may be set between 0 and 1. Other variations and implementations such as dynamically changing the threshold value, pre-setting the threshold value, selecting the threshold value using an interface fall within the scope of the present invention.

In a preferred embodiment of the present invention, the noise gate 206 may attenuate the input audio signal 202 by applying a gain factor/gain reduction in association with the sidechain module 208A. The threshold value in the threshold module may be set to (minus) −20 dB. The input audio signal 202 is completely passed for a gain of more than −20 dB or when the input audio signal 202 is above the threshold value. However, the input audio signal 202 is below the threshold value, that is, −20 dB, the input signal is attenuated, and a gain factor is of less than one is applied. The "gain factor" may also be referred to as the "attenuation factor". The gain factor may be any value between 0 and 1. For example, the gain factor may be 0.5, 0.75, 0.81, 0.93 and the like.

In some embodiments of the present invention, the gain in decibel associated with threshold module may vary from −10 dB to −30 dB.

An analytics module 232 may be associated with the noise gate module 206 to control or adjust various parameters associated with the haptic signal processing. The analytics module 232 detects the transient signal in the input audio signal 202. If a transient signal is detected, the analytics module 232 temporarily stops the Root Mean Square (RMS) value from adding any audio signal peaks to the RMS value of the input audio signal 202. The RMS signal value is set to Zero at this instance. In an embodiment of the present invention, the RMS value is reset to Zero when the transient is detected. Subsequently, the analytics module 232 performs two different calculations, i.e., (a) analyses the RMS values in decibels from the input audio signal 202 in the last 1 second, wherein the RMS values are sampled several times over a period of 1 second and then averaged to get a mean average value, and (b) checks the peak signal value in decibels in the last 10 seconds in the input audio signal 202. The analytics module 232 then (a) adds a pre-defined constant value in decibels to the calculated RMS value in decibels in the last 1 second and (b) subtracts a pre-defined constant value in decibels from the calculated signal peak value in decibels obtained in 10 seconds. The pre-defined constant is preferably 6 dB but may be vary in other embodiments. Subsequently, the two values, that is, the values calculated at (a) and (b), are compared, and the minimum of the two values is set as the threshold value at the noise gate 206. For example, if the root mean square value calculated by the analytics module 232 is −18 dB and the peak signal value calculated is −2 dB, the analytics module 232 adds +6 dB to the RMS value, which is −18 dB+6 dB=−12 dB. Likewise, the analytics module 232 subtracts −6 dB from the peak value, that is, −2 dB−6 dB=−8 dB. The minimum of the two values is utilised to set the threshold value at the noise gate.

In another embodiment of the present invention, the RMS values may be calculated every 10 milliseconds and the average of all the values calculated in the last 1 second may be determined to be added to 6 dB gain. In yet another embodiment, the median of the all the values calculated in last 1 second may be calculated and added to 6 dB gain. In yet another embodiment, the RMS values may be calculated every 5 milliseconds, and the root mean square of all the values may be calculated and added to 6 dB gain. In yet another embodiment, the root mean square values may be calculated between 2-10 times in 1 second. In a different implementation, the root mean square values may be calculated for a pre-defined time, which may vary from 1 second to 10 seconds.

In some embodiments of the present invention, the peak signal values may be calculated at equal time intervals in a pre-defined time. For example, the peak signal values may be calculated every second, and highest value is taken as peak signal value.

In an embodiment of the present invention, the pre-defined constant value in decibels may vary from 6 dB to 20 dB depending upon the characteristics of the input audio signal 202. The characteristics may include amplitude, frequency, and phase. The analytics module 232 controls and adjusts various parameters in the noise gate 206 module and the associated sidechain module 208A without interfering with the haptic signal processing as shown in FIG. 2.

The output signal from the noise gate 206 has reduced noise level, which is passed on to a compressor module 212 for reducing the dynamic range of the input audio signal 202. Simultaneously, the output signal from the noise gate 206 is also passed on to a dry/wet module 210. The dry/wet module 210 also receives the input audio signal 202 and mixes the output signal from the noise gate 206 and the input audio signal 202 in the pre-defined ratio (referred as "dry/wet ratio").

The compressor module 212 reduces the dynamic range between the loudest and the quietest parts of the input audio signal 202. The compressor module 212 compresses the louder parts and amplifies the quieter parts in the digital audio data/signal. The output signal from the noise gate 206 is also simultaneously passed on to the sidechain module 208B. The sidechain module 208B comprises a detector module, a threshold module and other modules to control and adjust the input audio signal 202 in the compressor module 212. The sidechain module 208B receives the audio signal from the noise gate module 206. The threshold module associated with the sidechain module 208B is programmed to set the threshold value or the threshold. When the received signal crosses the threshold value, the detector module gets activated. On activation, the detector triggers the compression of the input audio signal 202 being processed in the compressor module 212. For example, if the amplitude of the received signal is above the threshold value or the threshold, then the detector gets activated, and the compressor module 212 reduces the amplitude of the received signal by a specific amount. The compression ratio defines the amount of compression. When the input audio signal 202 is below the threshold level, the detector is deactivated and the input audio signal 202 processed in the compressor module 212 is passed on without any compression. In addition to compression, the compressor module 212 may amplify the input audio signal 202 by a gain factor that may be pre-programmed or dynamically controlled by the analytics module 232. In this scenario, the compressor module 212 may apply gain and amplify the signal that is below the threshold value.

The analytics module 232 may control the gain applied to the compressor module 212. The compressor module 212 may make a function call to the analytics module 232 to request for one or more parameters to set the gain to be applied at the compressor module 212. In response to the request, the analytics module 232 may provide one or more parameters to the compressor module 212 to set the gain. The one or more parameters may be provided by a function call, a sub-routine call, a procedure call or a sub-procedure as known in the field of programming languages. In some embodiments, the one or more parameters returned to the compressor module 212 from the analytics module may be a variable of data types such as a float, a double, an integer, a pointer, or a reference to memory.

The compressor module 212 and the sidechain module 208B may utilise several control parameters to modulate the input audio signal 202 for generating haptic output. These parameters include a threshold value, a compression ratio, an attack time, a release time, a knee, a make-up gain or some other type of parameters. In one example, vocal audio has some words that are mumbled. If the compressor module 212 is set to level such that the vocal is clearly audible, then the lower mumbled works are likely to be left out. Likewise, if the compression module 212 is set to a level where lower level mumbled words are clearly audible, then the vocal signal will override the track. A right mix of parameters is required to produce an output signal that can provide best haptic experience. Therefore, the parameter values need to be set and optimised for producing haptic output that enhances the user experience.

In one embodiment of the present invention, the compressor module 212 may have at least one parameter to reduce the dynamic range and to apply gain on the input audio signal 202. In this embodiment, the at least one parameter may be a compression ratio. The compression is an operational control defined by the compression ratio that reduces the peak value of the input audio signal 202. The higher the compression, the higher is a reduction of peaks. In some embodiments, the compression may be a pre-set value, a constant value, a value dependent upon the digital audio data or a variable that dynamically changes depending on at least one pre-determined factor. For example, the factor may be time, input digital audio data, the amplitude of the input digital audio data and some other parameters known in state of the art.

In another embodiment of the present invention, the compressor module 212 may have at least one parameter to reduce the dynamic range and to apply gain on the input audio signal 202. In this embodiment, the at least one parameter may be referred to as the threshold value. The threshold value triggers the compression in the compressor module 212. As the threshold value is increased, a significant part of the input audio signal 202 falls below the threshold value, and hence no compression is applied. As the threshold level is decreased more input audio signal 202 falls above the threshold level, and compression is applied. The threshold level may depend upon at least one factor. In some embodiments, the factor may be digital audio data, the amplitude of the analog signal, the amplitude of the digital audio data, and type of audio signal, frequency characteristics of an actuator or some other parameters.

In another embodiment, the compressor module 212 may have at least one parameter to reduce the dynamic range and to apply gain on the input audio signal 202. In this embodiment, the at least one parameter may be referred to as the gain control. In this embodiment, the compressor module 212 may apply gain based on at least one parameter provided by the analytics module 232. The degree of compression may be controlled by adjusting the input audio signal 202 with an input-gain control. The gain control may amplify the low frequency components in the input audio signal 202 to normalise the audio signal for haptic processing.

In some embodiments of the present invention, the analytics module 232 is associated with the compressor module 212 and the sidechain module 208B. The analytics module 232 may indirectly adjust the gain of the compressor module 212 by modulating the sub-bass control of the sidechain module 208B. The analytics module 232 detects the transient signal in the input audio signal 202 and monitors the occurrence of an audio peak in the input audio signal 202 for a pre-determined time. In a preferred embodiment, the time is 10 seconds but may vary from 5 seconds to 60 seconds. Further, the analytics module calculates the distance of occurrence of a signal peak in the last 10 seconds of −6 dB of the input signal value, which is passed on to the compressor module 212 and the sidechain 208B to vary the compressor sidechain sub bass control.

In yet another embodiment, the threshold value may be defined as a range defined between an open threshold value and a closed threshold value. In other embodiments, the threshold level may be a multi-level threshold with advanced processing features as known in the art of digital signal processing.

The noise gate module 206 and the compressor module 212 may be associated with the sidechain module 208A and the sidechain module 208B, respectively, also referred to as sidechain modules 208. The sidechain module 208A and the sidechain module 208B may be identical in function. In other embodiments, the sidechain modules 208A and 208B may be different and provide different functions. For example, the sidechain 208A module may be pre-programmed for controlling the operations of the noise gate module 206. In another example, the sidechain 208B module may be programmed for controlling the chopping of continuous digital audio data.

In another embodiment, a different type of implementation of the sidechain module 208 may be provided. Examples of this variation are well known in the art, for example, a trance gate, where the opening and closing of the noise gate 206 is not controlled by the digital audio data 306 but by a pre-programmed control. In some embodiments, the pre-programmed control may be a software code, a set of instructions, a programmed audio controller, an integrated circuit or the like.

In one implementation of the present invention, at least one band pass filter or low pass filter may be provided in either the sidechain module 208A or the sidechain module 208B to enhance the overall haptic experience of the user. The inclusion of these filters may not affect the tonal quality of the sound but may affect the response of the sidechain modules 208A and 208B. For example, the inclusion of filters may prevent the compressor module 212 or the associated noise gate 206 from generating false triggers while processing cymbal on a tom track.

In another implementations, the pre-determined settings associated with the dry/wet module 210 may be controlled using a user interface. In an embodiment, the user interface may be a rotary switch, a digital switch, an analog switch, an intelligent module or some other type of variable switch. In some embodiments, the pre-determined settings may be based on various parameters, such as but not limited to settings controlled by a user, frequently used settings by a user, automated settings based on the analysis of input digital audio data, a fuzzy logic with pre-programmed settings or some other type of settings.

The sidechain module 208B will monitor the level of the input audio signal 202 of the compressor module 212. In this embodiment, the sidechain module 208B utilises the input audio signal 202 to modulate the response of the compressor module 212. In other embodiments, the sidechain module 208B may be provided with a separate external input signal source different from the input audio signal 202. In one implementation of the present invention, dance music may have kick and bass occupying the same frequency range. Therefore, it becomes essential to emphasize the effect of both kick and bass to enhance haptic user experience. In this embodiment of the present invention, the haptic processing module 200 may utilise the kick as an input to the sidechain module 212 and the bass as an input to the compressor module 212 causing the bass to duck when the kick is hit thereby avoiding phase and muddiness in that frequency range.

The output signal from the compressor module 212 is passed simultaneously on to an envelope follower module (or envelope follower) 214 and a resonance module (or resonance processor) 220. The main function of the envelope follower module 214 is to convert the bipolar signal to a unipolar signal. Further, the envelope follower module 214 may decrease the variation of the high frequency digital audio data into low frequency digital audio data without distorting the input waveform. For example, the envelope follower module 214 may produce a low frequency signal as an output, which is the exact replica of the high frequency digital audio data. In another embodiment, the envelope follower 214 may produce a control signal that resembles the high frequency digital audio data into low frequency analog audio data. The output of the envelope follower module 214 is a low frequency digital or analog signal, which is the low frequency envelope of the input digital audio data received from the compressor module 212. The low frequency signal processed by the envelope follower module 214 may include ripples that may require filtering. In an alternate embodiment, the ripples produced in the low frequency digital audio data may be filtered using digital or analog filters; these filters are well known in the art and are utilised to smoothen the low frequency digital audio data. Furthermore, in order to smoothen and reproduce an exact replica of the low frequency digital audio data, a series of filters may be employed. The smoothing of the low frequency digital audio data may affect the responsiveness. The invention utilises various techniques to balance the smoothening and responsiveness of the low frequency digital audio data produced by the envelope follower module 214.

The gain of the envelope follower module 214 may be modulated by the analytics module 232. The analytics module 232 receives the input audio signal 202 and may analyse the input audio signal 202 to adjust the gain applied to the signal being processed in the envelope follower module 214. The envelope follower module 214 may implement a function call in C, C++, Java or any other programming language to call for one or more parameters. The analytics module 232 may, in response to the function call, provide one or more parameters that may be utilised to set the gain in the envelope follower module 214. In some embodiments, the function call may ask for one or more return parameters. The one or more return parameters in response to the function call by the envelope module 214 may be of primitive datatypes such as but not limited to a float, a double, an integer, a pointer, a reference to a memory location.

The output of the envelope follower module 214 is superimposed over a fixed frequency oscillator module 218. The low frequency audio output signal from the envelope follower module 214 modulated by the fixed frequency oscillator module 218 is tuned at a fixed resonant frequency of the actuator 230. In another embodiment, the fixed frequency oscillator module 218 is tuned near or around the resonant frequency of the oscillator. In some embodiments of the present invention, the resonant frequency of the fixed frequency oscillator 218 may vary between 50 Hz and 120 Hz. The resonant frequency of the fixed frequency oscillator module 218 is tuned near or around the resonant frequency of an actuator 230. The resonant frequencies of different actuators may vary slightly from each other. In one implementation of the present invention, a gaming device may have one or more actuators, each actuator having a different resonant frequency. A first actuator may have a resonant frequency of 60 Hz and a second actuator may have a resonant frequency of 72 Hz. In this implementation, the oscillator module 218 may be tuned at 66 Hz. In another embodiment, the oscillator module 218 may be tuned at 72 Hz or at 60 Hz depending upon the input data characteristics and the type of haptic output required.

In a preferred embodiment of the invention, the predetermined frequency may be set at 60 Hz.

The output signal from the compressor module 212 is also simultaneously passed on to a resonance module 220. The resonance module 220 produces simulations of basic musical instruments such as a string or membrane. The resonance module 220 is configured to excitate physical models of string, membrane, plate or some other musical instrument models. The simulation of basic instruments helps in the correction and enhancement of the audio signal to amplify and enhance low frequencies that have been suppressed. The resonance module 220 may also append the low frequency components in the audio signal that have been suppressed due to the presence of other frequency components. For example, the resonance module 220 may identify suppressed low frequency components in the audio signal and append fundamental frequency components of the identified low frequency components to enhance the haptic experience of the user. In another example, the resonance module 220 may simulate audio signals to emphasize and create a better haptic experience.

The output of the fixed frequency oscillator module 222, the resonance module 220 and dry/wet module 210 is aggregated and summed in a mixer module 222. The mixer module 222 adds the input from different modules in predetermined ratio.

In an embodiment of the present invention, the analytics module 232 may be associated with the noise gate module 206, the compressor module 212, the sidechain modules 208A and 208B, the resonance module 220, the envelope follower module 214 and other modules for analysing the input audio signal 202 to provide automatic gain control.

The analytics module 232 receives the input audio signal 202 and then analyses the input audio signal 202 to extract various parameters to control at least one parameter in the haptic signal processing flow as shown in FIG. 2. The analytics module 232 may produce an output control signal to adjust at least one or more parameters associated with the compressor module 212, the side chain module 208A and 208B, the resonance module 220, the envelope follower module 214 and some other modules.

The output signal from the mixer module 222 is passed on to a low pass filter 224 that filters out any high frequency components. In addition, the low pass filter 224 also cut-off the harmonics that may lead to signal distortion. In some embodiments, the low pass filter 224 may be designed to differentiate between the low frequency components produced by kick drum and the low frequency components produced by bass guitar to avoid continuous haptic response from the actuator 230. The low pass filter module 224 may be a first order filter, a second order filter, a third order filter or some other type of filter. In some embodiments of the present invention, a band pass filter may be utilised to filter high frequencies along with unwanted low frequencies.

The output signal of the low pass filter 224 is passed on to a limiter module 226. The limiter module 226 limits the amplitude of the output signal to avoid any damage to the actuator 230 due to the passing on of excessive voltage or current. In an embodiment of the present invention, the limiter module 226 may be a type of compressor with a compression ratio of ∞:1. The threshold value at the output may be set at a threshold value of −3 dB. In this case, the output level is restricted to −3 dB irrespective of the input level.

The output signal from the limiter module 226 may be passed on to the bell filter 228, which may increase the frequency response of the voice coil and/or the actuator 230 over the range of low frequencies. In contrast to linear resonant filters, which are tuned to respond at a resonant tuned frequency, the haptic processing module 200 may be utilised to respond to a wide frequency range thereby enhancing the haptic response of the actuator 230. In this regard, the voice coil or the actuator 230 discussed herein can operate over a wide range of frequencies rather than responding to the resonant frequency. This is provided in U.S. patent application Ser. No. 14/828,954, which is incorporated herein by reference. To extend the frequency response of the voice coil or the actuator 230, the bell filter module 228 may provide a flat frequency curve to the actuator 230. The bell filter module 228 is designed to provide the exact replica of the actuator 230 frequency curve with a phase inversion, which is combined with an aggregated curve having a plateau over a range of frequencies defined between frequency f1 and frequency f2. For example, if the low pass filter module has a resonant at frequency f, and the bell filter has a maximum suppression of frequency f, then the sum total of both curves will be a flat frequency curve between frequency f1 and frequency f2. Accordingly, the overall effect of the low pass filter module 224 and the bell filter module 228 is to produce a response over a wide range of frequencies that is between frequencies f1 and f2. This results in an enhanced haptic response that may be experienced over a large range of low frequencies.

A detection module 234 is associated with the bell filter module 228 that continuously probes the output haptic signal. The detection module 234 is also associated with the input audio signal 202 and continuously detects the presence of the input signal. The detection module 234 probes the signal both at the bell filter 228 and the input audio signal 202, analyses the presence of a signal, and utilises an OR logic to decide the ON/OFF state of the haptic processing system 200. When the signal is detected either at the bell filter 228 or the input audio signal 202, the detection module 234 keeps the haptic processing module 200 in the ON state. If no signal is detected either at the input or at the output of the haptic processing module 200, the detection module 234 moves the haptic processing module 200 to power saving mode. It may be noted that the detection module 234 never enters the OFF state but controls the state of various modules associated with the haptic processing module 200 to control the power ON state or power OFF state to save battery. In an embodiment of the present invention, the probing of signals at input and output of the haptic processing module 200 may vary between 1 microsecond to 10 seconds. When no input is detected at the input audio signal 202 but a signal is detected at the bell filter module 228, the haptic processing module 200 may wait for a predefined time before entering the power saving mode or probing the inputs again. This is required to pass off any unprocessed haptic signal that remains in the haptic processing module 200 due to a delay in signal processing.

In an embodiment of the present invention, the haptic processing system 200 may have a processor shared among all or less than all the associated modules or a separate independent processor for each of the modules. For example, the preprocessor module 164 and the preprocessor module 204, the detector module 190 and the detector module 234, the dynamic processors 166, the noise gate module 206, the compressor module 212, the resonance module 178 and the resonance module 220, the envelope follower module 172 and envelope follower module 214, the oscillator module 174 and the oscillator module 218, the dry/wet module 168 and the dry/wet module 210, the mixer module 180 and the mixer module 222, and the low pass filter module 182 and/or the low pass filter module 224, may have separate and independent processors. In other embodiments, the preprocessor module 164 and the preprocessor module 204, the detector module 190 and the detector module 234, the dynamic processors 166, the noise gate module 206, the compressor module 212, the resonance module 178 and the resonance module 220, the envelope follower module 172 and envelope follower module 214, the oscillator module 174 and the oscillator module 218, the dry/wet module 168 and the dry/wet module 210, the mixer module 180 and the mixer module 222, and the low pass filter module 182 and/or the low pass filter module 224, may have separate processors or may share a processor by multitasking and/or multithreading.

The advantages of using a voice coil actuator 230 over the conventional LRA actuator is to provide response over a wide range of frequencies, which can be understood by way of example. In a normal linear resonant actuator, the actuator operates over its resonant frequency, say 70 Hz. If a low frequency, say 50 Hz, is fed to a linear resonant actuator operating at the resonant frequency of 70 Hz, then a frequency transformation/shifting is required to generate a haptic response. This deficiency is eliminated in the present invention by providing a frequency range over which the actuator 230 can operate without requiring any frequency shift. Advantageously, this allows the actuator 230 to operate over a varied range of frequencies without requiring frequency shift.

Figure 3:
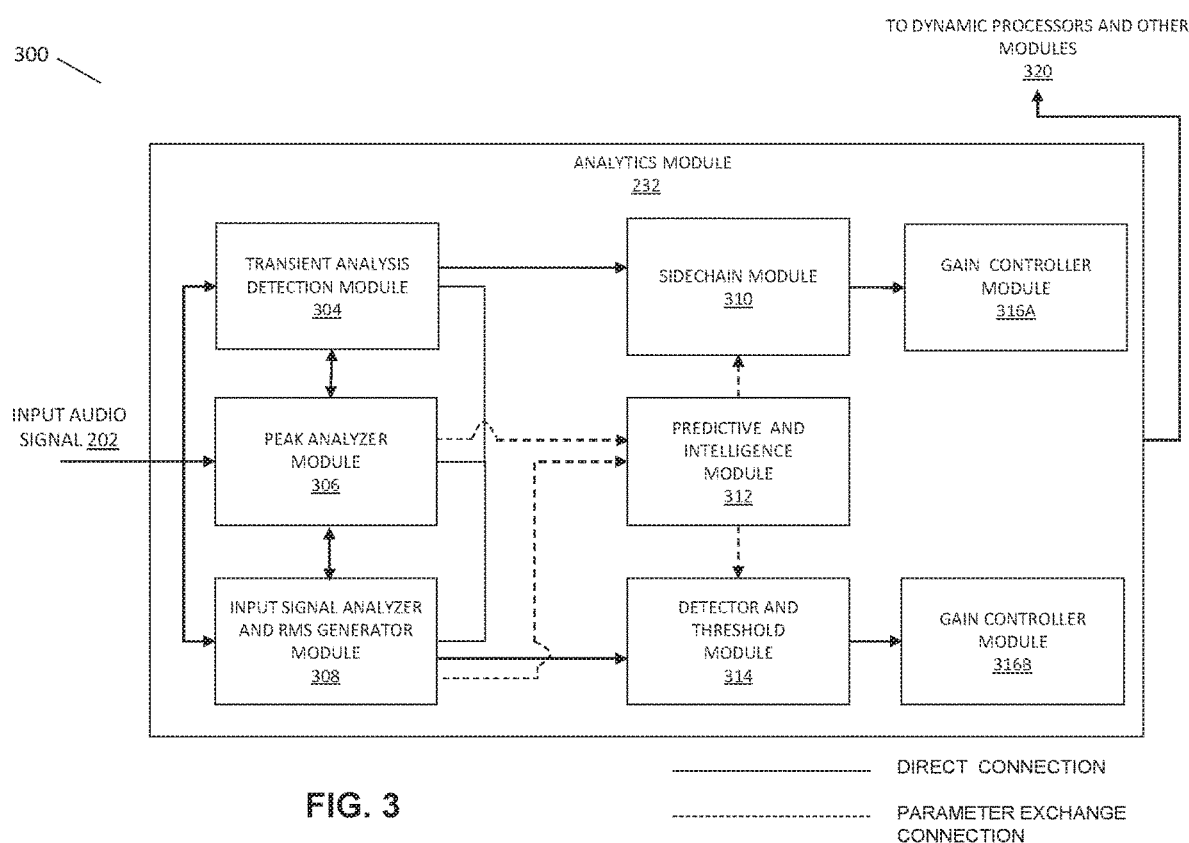
FIG. 3 illustrates an expanded view of an analytics module with parameter passing on in an embodiment of the present invention.
Figure 3B:
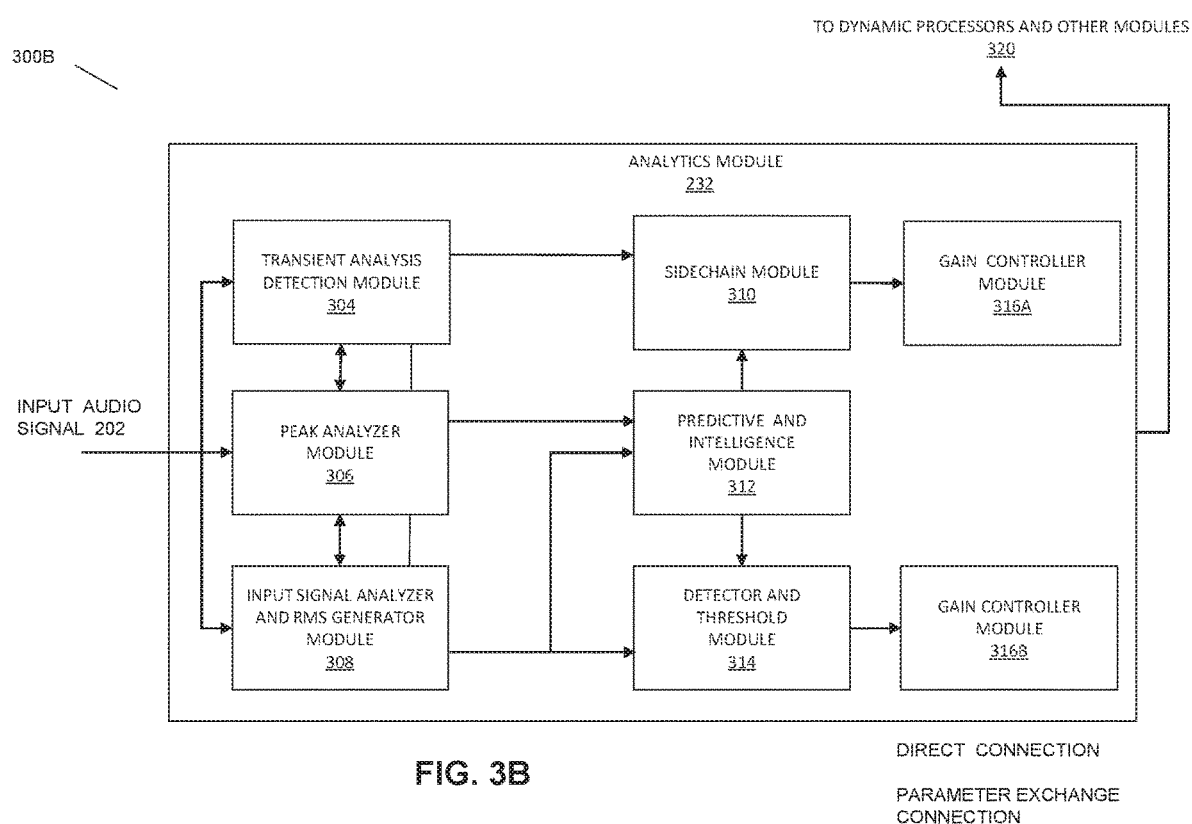
FIG. 3B illustrates an analytics module with parameter passing in an embodiment of the present invention.

FIG. 3 provides an expanded view of the analytics module 300 in a preferred embodiment of the present invention with parameter exchange. Similarly, FIG. 3B provided an expanded view of the analytics module 300 in a preferred embodiment of the present invention without parameter exchange. The expanded view of the analytics module 300 comprises of the analytics module 232. The analytics module 232 may include a transient analysis module and detection module 304, a peak analyser module 306, an input signal analyser and RMS generator module 308, a sidechain module 310, a predictive and intelligence module 312, a detection and threshold module 314 and gain controller modules 316A and 316B (collectively or individually referred as the gain controller module 316).

The analytics module 232 receives the input signal 202, which may be either an analog or a digital signal. The received input audio signal is simultaneously passed on to the transient analysis and detection module 304, the peak analyser module 308, and the input signal analyser and RMS module 310. The transient analysis and detection module 304 may investigate the presence of transients in the input audio signal 202. A transient is a short burst of energy caused by a sudden change of state of the sound and shows fast changes in sound characteristics with a non-harmonic attack phase. In addition, the transients in a signal contain a high degree of non-periodic components and a higher magnitude of high frequencies. The presence of transients in the signal may distort the output quality of the sound. In some embodiments, the transient analysis and detection module 304 is implemented using a plurality of envelope followers. For example, the analysis transient detection module 304 may contain a low pass filter (optional), a fast envelope follower, a slow enveloper follower and a transient sensitivity analyser.

In an embodiment of the present invention, the fast envelope follower and the slow envelope follower may be implemented as hardware or software. In software implementation, the fast envelope follower may be implemented by fast attack time and a fast release time. Similarly, the slow envelope follower may be implemented by using slow release time. For example, a fast attack time and fast release time will enable the fast envelope follower to follow the input waveform. The fast envelope follower approximates the replica of the input waveform. Likewise, the slow envelope follower will have fast attack time and slow release time, which enables the slow envelope follower to initially follow the rise of the waveform but fall time is slowed down resulting in a ramp type decay. In another embodiment of the present invention, the fast envelope follower and the slow envelope follower may be implemented as a hardware. One way of achieving the same is using small capacitor values for the fast envelope follower and large capacitor values for the slow envelope follower. Other implementations are possible using integrated circuits, timing circuits and MOSFETs.

In another embodiment of the present invention, the fast envelope follower may be implemented as a software using an attack coefficient. The attack coefficient may be proportional to one or more parameters. In an embodiment, the attack coefficient is proportional to sampling rate, attack rate in milliseconds and other parameters. In another embodiment, the attack coefficient may be inversely proportional to attack time, sample rate and other parameters with a proportionality constant. Likewise, the slow envelope follower may be implemented as a software using a release constant. The release constant may be proportional to one or more parameters such as but not limited to release time, sample rate and other similar parameters. In an embodiment, the release constant may be inversely proportional to the release time, sampling rate and the like with a proportionality constant. For example, the attack coefficient may be 0.94912685796 with an attack time of 2 milliseconds and a sampling rate of 44,100 with a proportionality constant that depends upon the characteristics of input waveform. Similarly, in another example, the release coefficient may be 0.99652519689 for a release time of 30 milliseconds and sampling rate of 44,100. The output values of the fast envelope follower may be calculated by multiplying attack coefficient with past and current input audio data points. Similarly, the output values of the slow envelope follower may be calculated using the release coefficient and the release time.

The transient analysis and detection module 304 is entrusted to detect transients in the input audio signal 202 for controlling different parameters during processing of the haptic signal.

The peak analyser module 306 may include a low pass filter, a peak detector, and other modules. The main function of the peak detector module 306 is to identify the peaks in the input audio signal 202.

The input signals analyser and RMS generator module 308 performs the task of analysing the signal and calculating the RMS value of the input audio signal 202. The calculated RMS values may be utilised to modulate the threshold and gain in dynamic processors associated with the analytics module 232.

The transient, the signal peaks, and the RMS values of the input audio signal 202 are analysed by the transient analysis and detection module 304, the peak analyser module 306, and the input signal analyser and RMS generator module 308, these are passed on to the sidechain module 310 for setting the gain of one or more dynamic processors and the envelope modules associated with haptic processing. For example, in one implementation, the side chain module 310 may set the gain of the compressor module 212 and the envelope follower module 214 based on the analysis of the input received from the transient analysis and detection module 304, the peak analyser module 306, and the input signal analyser and RMS generator module 308.

The RMS values of the input audio signal 202 are utilised to set a threshold value or the threshold of one or more dynamic processors. For example, the detector and threshold module 314 may set the threshold value at the noise gate based at least on the analysed RMS values. In other embodiments, at least one of the parameters such as transients, signal peaks, and the RMS values of the input audio signal 202 may be analysed to set the threshold or gain in one or more dynamic processors.

The predictive and intelligence module 318 may receive the signal peak information and the RMS values from the peak analyser module 306 and the input signal analyser and RMS generator module 308, respectively. The received signal peak information and RMS values are processed and analysed to control the gain in the side chain module 312 and the threshold in the detector and threshold module to adjust haptic signal processing in one or more dynamic processors.

In an embodiment of the present invention, the analytics module 232 may receive signal before the digital signal processing chain. For example, the input audio signal 202 is fed to the digital signal processing chain is delayed by a pre-determined time. In an embodiment of the present invention, the time delay introduced may vary from 1 millisecond to 100 milliseconds. In another embodiment, the look-ahead mechanism is provided by first providing the input audio signal 202 to the analytics module 232 and subsequently passing the input audio signal 202 on to the digital signal processing chain. In yet another embodiment, the look-ahead mechanism may be provided by the predictive algorithms implemented in the analytics module 232. The predictive algorithms monitor the input audio signal 202 in real time and predict the parameters to be provided to the at least one dynamic processor.

The output of the sidechain module 312 is passed on to the gain controller module 316A to adjust the gain of the at least one dynamic processor in real time. Similarly, the output of the detector and threshold module 314 may be passed on to the gain controller module 316B for setting the gain of the at least one dynamic processor.

The transient analysis and detection module 304 may detect the transients in the input audio signal and provide a parameter to the digital signal processing chain to control the effect of the transients. The transient analysis and detection module 304 may include a low pass filter, a fast envelope follower, and a slow envelope follower and a transient score generator. In one embodiment of the present invention, the low pass filter may be optional. The fast envelope follower and the slow envelope follower may enable detection of the transients in the input audio signal 202. The average amplitude of the signal processed by the slow envelope follower and the fast envelope follower may be calculated. The difference between the average amplitude is used to calculate the presence of transients in the input audio signal. In some embodiments of the present invention, the transient in the input audio signal 202 may be converted into a transient score. The transient score may be utilised to derive a transient binary. In addition, the transient analysis and detection module 304 may have a transient threshold. In one implementation, when the transient score is greater than the transient threshold, the transient binary is set to 1, else the transient binary is set to 0.

The peak analyser module 306 determines the peak signal values of the input audio signal 202. The peak analyser module 306 may be associated with the transient analysis and detection module 304, the input signal analyser and root mean square generator module 308, the sidechain module 310, and the detector and threshold module 314. In one embodiment of the present invention, the input signal is analysed for the peak signal values for a fixed time period. The fixed time period may vary between 5 seconds and 15 seconds, however, in the preferred embodiment, the fixed time period is 10 seconds. The peak signal values may be stored or buffered in the memory in the predictive and intelligence module 312.

The input signal analyser and root mean square generator module 308 analyzes the input audio signal 202 for a fixed time period and determines the root mean square values. The root mean square values are buffered or stored in the memory in the predictive and intelligence module 312.

The predictive and intelligence module 312 accesses the peak signal values and the root mean square values buffered in the memory. In some embodiments, the memory may be located in the predictive and intelligence module 312.

In one embodiment of the present invention, the predictive and intelligence module 312 may have pre-stored values for handling exceptional high noise at a specific frequency. The predictive and intelligence module 312 may switch to pre-stored parameters to enable the haptic processing module to process the haptic output in exceptionally high noise.

In some embodiments of the present invention, the predictive and intelligence module 312 may instantaneously update the parameters without latency. For example, at time t1, the parameter values passed on to the noise gate may be x1, x2, . . . xn and the parameter values passed on to the compressor may be y1, y2, . . . yn. At another instance of time t2, the parameter values passed on to the noise gate may be q1, q2, . . . qn and the parameter values passed on to the compressor may be r1, r2, . . . rn. The predictive and intelligence module 312 may in real time pass these parameter values on to the digital signal processing chain to control the haptic output. It may be noted that such an implementation ensures almost no latency and enables real time control of the input audio signal 202 for producing enhanced user experience.

In an alternate implementation, the analytics module 232 may be provided after the pre-processing module and before the digital signal processing chain for eliminating the latency. In this implementation, the input audio signal 202 may be first processed by the analytics module 232 and subsequently passed on to one or more dynamic processors 166A . . . 166N, an envelope follower 172, a fixed frequency oscillator 174, a resonance module 178, a low pass filter 182, a limiter 184, a bell filter 186, and an actuator 188. The analytics module 232 may look ahead and optimise parameters in advance for producing enhanced haptic output.

Figure 3C:
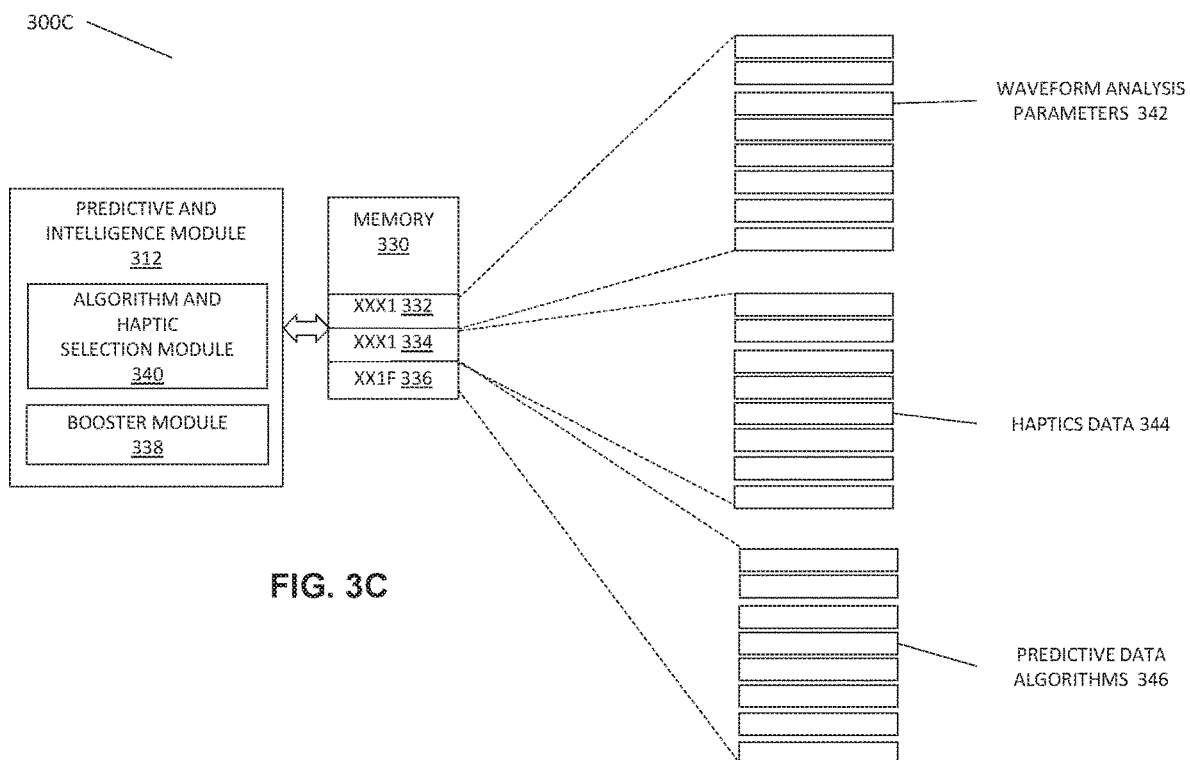
FIG. 3C illustrates a predictive and intelligence module associated with the analytics module in an embodiment of the present invention.

FIG. 3C illustrates different modules in the predictive and intelligence module 312. The predictive and intelligence module 312 may be associated with memory 330 with multiple segments, a booster module 338 and other modules. The memory 330 may reside in the haptic module 108, the memory 102, the cloud 140, the server 130, or the distributed system 150. In another embodiment, the memory 330 may be stored in a microchip, a microcontroller, a computer program product, or in an external memory associated with the haptic system 100. Additionally, the predictive and intelligence module 312 includes an algorithm and haptic data selection module 340. The memory 330 is divided into multiple segments such as segments 332, 334, and 336. For example, a memory segment 332 stores audio waveform analysis parameters 342, a memory segment 334 stores haptics data 344, and a memory segment 336 stores predictive data algorithms 346. The memory segments such as memory segment 332, memory segment 334, and memory segment 336 are for representation only. There may be multiple memory segments, which may be allocated in a different order either in a single memory or multiple memory banks. The waveform analysis parameters 342 stores information related to waveform characteristics of the input audio signal 202. The waveform characteristics include but not limited to, loudness, pitch, tone, propagation speed, tonalness, autocorrelation coefficients, zero crossing rate, peak envelope, onsets, tempo and meter, rhythm, timing and wavelength.

Similarly, the haptic data 344 stores different haptic signals. The haptic data 344 is a pre-stored haptic signal or may be a haptic digital data to control the digital signal processing chain. Alternatively, the haptic data 344 is audio signal characteristics to produce haptic experience. Preferably, the haptic data 344 is a set of digital values for providing haptic experience to a user.

For example, the haptic data 344 may be obtained by classifying different events in a game corresponding to different haptic signals to produce desired haptic effect. A classification algorithm, for example, a random forest may be used to train at least one predictive data algorithm 346 to different events in a computer game for producing haptic experience. The haptic experience is stored as haptic data 344. The predictive data algorithms 348 then utilizes one or more parameters of the waveform characteristics to predict haptic data 344 for producing haptic experience though one or more actuators.

In an embodiment of the present invention, the haptic data 344 can be dynamically updated by the predictive and intelligence module 312. The predictive and intelligence module 312 may send a request to the analytics module 232 for enabling memory write operation. The analytics module 232 may grant a write permission enabling the predictive and intelligence module 312 to write haptic data 344 into the memory 330. The predictive and intelligence module 312 writes haptic data 344 into the memory 330. Alternatively, the predictive and analytics module 312 can directly read/write into the memory 330. In another embodiment, the predictive and analytics module 312 may connect to the internet to download haptic data from the server 130, the cloud 140 or the distributed system 150 related with a user's game in the memory 330.

In one implementation, the predictive and intelligence module 312 learns from the instantaneous values generated by the analytics module 232 by implementing a set of procedures/algorithms to calculate the gain and/or the threshold to be applied to one or more dynamic processors 166 and by using RMS values and peak values. The predictive and intelligence module 312 initially selects at least one predictive data algorithm 346 based on input audio waveform characteristics. Alternatively, the predictive and intelligence module 312 can select at least one predictive data algorithm 346 based on game attributes such as type of game, game metadata and the like. If no attributes can be ascertained, the predictive and intelligence module 312 uses the mostly likely used predictive algorithm based on the last 10 games. The predictive and intelligence module 312 learns from real-time data, that is, RMS values, peak values, the gain and the threshold value. Once the learning process has been completed, the prediction algorithm can independently predict the gain and the threshold in one or more digital signal processing chains. This reduces processing overheads and reduces time lag between audio and haptic experience. In addition, the predictive analysis also provides a look ahead to the analytics module 232 for setting different parameters such as gain, threshold, presets and controlling the different modules such as presets, dual filter module, physical resonance module, and other modules of the digital signal processing chain.

The predictive and intelligence module 312 receives the instantaneous RMS values and the peak values of the input audio signal 202 to determine the gain and/or threshold and to modulate/control at least one of the dynamic processors 166. In addition, the predictive and intelligence module 312 also receives the instantaneous waveform characteristics of the input audio signal 202. At the next step, the predictive and intelligence module 312 determines the best algorithm from the list of a stored predictive data algorithms 346 based at least on one parameter comprising, input audio waveform characteristics, type of game, embedded metadata in the game and other parameters such as audio clues embedded inside game, number of different types of events in a game, frequency of events and other types of parameters related to gaming. The predictive and intelligence module 312 then uses the selected algorithm and the instantaneous RMS values, the peak values and the instantaneous waveform characteristics of the input audio signal 202 to train itself to predict haptic output. Subsequently the predictive and intelligence module can predict haptic output to control the digital signal processing chain. Alternatively, the predictive and intelligence module 312 can directly pass the haptic data 344 to one or more actuators for providing haptic experience. The haptic data 344 in this case stores different haptic signals to provide wideband or high definition haptic experience.

In a different embodiment, the training of predictive algorithm using instantaneous RMS values, the peak values and the instantaneous waveform characteristics of the input audio signal 202 and also includes a user feedback. The learning of the predictive algorithm is a multi-level process. At each level, the user feedback is provided with respect to haptic experience. The feedback is utilised to correct the haptic data 344 for optimum haptic experience. Once the multi-level training of the predictive algorithm is completed, the predictive and intelligence module 312 can then start predicting data for optimal haptic experience. The prediction is related to controlling parameters in the digital signal processing chain or the prediction may initiate at least one haptic data 344 to one or more actuators.

Alternatively, the predictive and intelligence module 312 is provided with a user feedback to correct the haptic experience. The feedback loop receives the user feedback and actual haptic output signal; the difference between the user feedback and the actual haptic output signal is a differential signal corresponding to deviation from the optimal haptic experience. The predictive and intelligence module 312 uses this differential signal to correct the haptic experience. For example, the feedback provided by the user is a score. The score may correspond to deviation of haptic signal from the desired haptic experience. The user may select a score to quantify the haptic experience. The predictive and intelligence module 312 may analyze the score and take corrective action to optimise the haptic experience.

The predictive and intelligence module 312 may also implement predictive algorithm from the predictive data algorithms 346 with a provision to predict the output accuracy. For example, the predictive algorithm may provide a confidence level for prediction accuracy. When the predictive algorithm has a low confidence level (less than 0.6 in a scale of 0 to 1) for prediction, the predictive and intelligence module 312 may switch to the analytics module 232 for providing parameters to control the digital signal processing chain. However, if the confidence level is greater than 0.6, the predictive and intelligence module will be enabled to provide haptic output.

A dataset for training the predicted algorithms is pre-stored in the memory 330 associated with the predictive and intelligence module 312. The dataset may be provided in a memory segment or it can be downloaded from a cloud, a server, or network location. The predictive and intelligence module 312 utilizes the pre-stored dataset to train itself to predict the haptic output or can correlate the waveform analysis parameters 342 with haptic data 344. This correlation is useful in predicting real time input audio signal for haptic output. In another implementation, the predictive and intelligence module 312 may utilize waveform analysis parameters 342 and the pre-stored data in the memory 330 to train itself and to learn the prediction of haptic output. The predictive and intelligence module 312 determines audio waveform characteristics and other parameters to select the best and/or the closest dataset to train itself for predicting the haptic output. Additionally, the predictive and intelligence module 312 may also determine at least one predictive algorithm to be utilized for self-training and classification of haptic data. The predictive and intelligence module 312 then determines each haptic event from the audio, utilizes at least one predictive algorithm from predictive data algorithms 346, identifies the haptic data output 344 to be provided to one or more actuators.

The memory 330, the algorithm and haptic selection module 340 are directly associated with the booster module 338. The booster module 338 drives one or more secondary actuators (also known as) booster actuators. The main function of the booster module 338 is to ramp up or provide an additional boost by driving the booster actuator.

The predictive and intelligence module 312 may utilize the pre-stored haptic data in the memory 330 and the parameters determined from the waveform characteristics of the audio signal to train at least one prediction algorithms to predict the haptic output. The predicted haptic experience is correlated with the haptic data 344 to form a linkage between the predicted haptic data 344 and waveform analysis characteristics 342. The prediction algorithm maintains a table between the audio signal and the haptic data 344 to be passed to one or more actuators to reduce computational time. In certain situations when confidence level is high (>0.6), the prediction algorithm may directly stream the haptic data 344 pre-stored in the memory 330 to one or more actuator, for example, the actuator 230.

In yet another implementation, the predictive and intelligence module 312 may utilize all or some of the parameters such as but not limited to RMS values, peak values, pitch, loudness, tonalness, autocorrelation coefficients, zero crossing rate, peak envelope, onsets, tempo and meter, rhythm, timing and wavelength alone or in combination to predict haptic data. Additionally, the selection of the training data stored in memory 330 and/or the prediction algorithms stored as predictive data algorithms 346 may depend on RMS values, peak values, pitch, loudness, tonalness, autocorrelation coefficients, zero crossing rate, peak envelope, onsets, tempo and meter, rhythm, timing and wavelength and other input audio signal characteristics.

The predictive and intelligence module 312 in one implementation may predict gain and/or threshold values in real time to control the digital signal processing chain. In addition, the predictive and intelligence module 312 receives audio signal characteristics; the audio signal characteristics are calculated in real time at each instance of time. The predictive and intelligence module 312 analyses the audio signal characteristics and the real-time calculation of threshold and/or gain to perform machine learning in real time. Subsequently, the predictive and intelligence module 312 may predict the gain and/or threshold to be provided to the digital signal processing chain to produce enhanced haptic output.

The predictive and intelligence module can implement different algorithms for supervised learning including linear classifiers such as linear adaptive filters, kernel adaptive filters, logistic regression, ordinary least squares regression, naive Bayes classifier, ensemble methods, support vector machines, decision trees, boosted trees, random forest, neural networks, nearest neighbour, Gaussian mixture models, component analysis and some other type of algorithms.

The predictive and intelligence module 312 may store parameters corresponding to button press events associated with a gamepad, which are passed to the digital signal processing chain for the optimal haptic experience. For example, a game controller may provide a button press event corresponding to an explosion in a video game. The button press event and associated parameters is passed to the analytics module 232. The analytics module 232 processes the input audio signal 202 via the input signal analyzer and RMS generator module 308 to determine different characteristics of the audio signal. For example, the input signal analyzer and RMS generator module 308 determines the peak signal values, the RMS values and other audio signal characteristics. This is done in parallel with the processing of the button press events received from a gamepad or the game controller by the predictive and intelligence module 312. The parameters determined by input signal analyzer and RMS generator module 308 and the parameters generated using pre-stored values in the predictive and intelligence module 312 may be evaluated using a predictive algorithm to arrive at optimal values to be passed onto the digital signal processing chain for better haptic experience. Alternatively, prediction and intelligence module 312 may decide to utilize either the parameters determined using the input audio signal or the pre-stored haptic data parameters to control at least one or more dynamic processor in the digital signal processing chain. In another embodiment, the parameters determined by input signal analyzer and RMS generator module 308 and the parameters generated using pre-stored values in the predictive and intelligence module 312 may be evaluated using a predictive algorithm to determine or control an envelope follower, preset values, dual filter cut-off frequencies and some other parameters.

In embodiments of the present invention, the predictive and intelligence module 312 may implement at least one classification algorithm. The at least one classification algorithm selected from predictive algorithm data 346 is first trained using a pre-stored dataset in the memory 330. The predictive and intelligence module 312 initially learns from the pre-stored data and the waveform analysis parameter data 342 by initiating a learning process. Once the predictive algorithm completes the learning process, it then uses the learning to classify the haptic data to provide haptic experience. For example, the classification algorithm can classify the gain and/or the threshold based on the instantaneous input audio signal 202, these RMS values and peak values are provided to one or more dynamic processors in the digital signal processing chain. The predictive and intelligence module 312 may implement unsupervised algorithms, for example, deep belief network, which is a generative probabilistic model. The deep belief network is a deep learning algorithm composed of visible layer with multiple hidden layers. The predictive and intelligence module 312 may train at least one visible layer using a pre-stored data in the memory 330. The learning process is propagated to hidden layers, which learn the statistical relation from the visible layer. In one implementation, the deep belief network can be trained using greedy layerwise training using audio signal characteristics and pre-stored data to predict closest haptic experience stored in the haptic data 344. The greedy layerwise training may follow a bottom up approach during the training process. In a different embodiment, the convolutional deep belief networks can also be used to predict haptic signal.

The predictive and intelligence module 312 may implement unsupervised learning algorithms including but not limited to clustering, k-means, mixture models, DBSCAN (Density-based spatial clustering of applications with noise), OPTICS (Ordering points to identify the clustering structure) algorithms, autoencoders, deep belief nets, Hebbian learning, generative adversarial networks, self-organizing map, expectation-maximization algorithm (EM), method of moments, blind signal separation techniques or some other unsupervised learning algorithms. The analytics module 232 utilizes the haptic data output 344 stored in the memory 330 to determine the parameters to control the digital signal processing chain.

Figure 4:
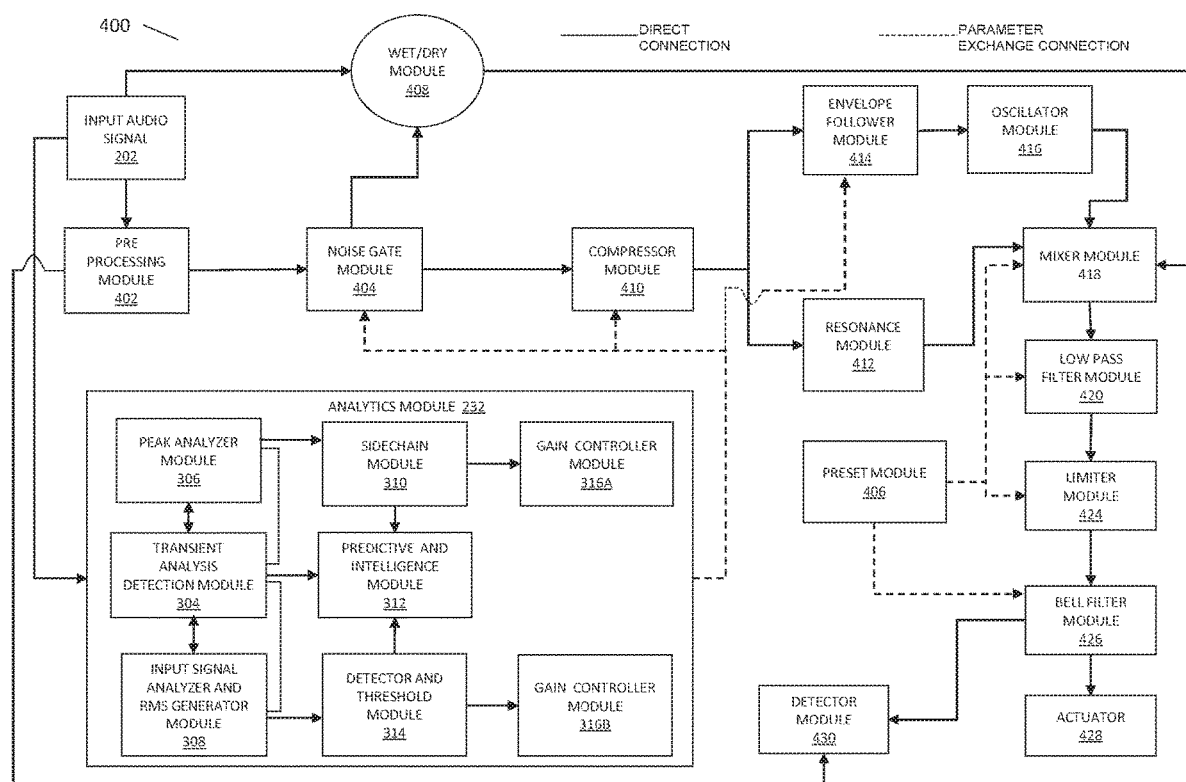
FIG. 4 illustrates a haptic module of a haptic processing system in another embodiment of the present invention.

FIG. 4 illustrates a haptic processing system 400 in an alternate embodiment of the present invention. The haptic processing system 400 receives an input audio signal 202. The signal is pre-processed and made suitable for processing at a pre-processing module 402. The pre-processing module 402 may reduce the sampling rate of the input audio signal and filter out any unwanted frequencies in the input audio signal 202 before it can be provided to one or more dynamic processors. In this embodiment, two dynamic processors are provided, that is, a noise gate 404 and a compressor 410. The pre-processed signal is passed on to the noise gate 404, which has a threshold level; the threshold level is set dynamically based on the parameters received from an analytics module 232. The output from the noise gate module 404 is provided to the compressor module 410. Additionally, the output from the noise gate module 404 is also provided to a dry/wet module 408. The dry/wet module 408 mixes the input audio signal 202 and the output signal from the noise gate 404 in a pre-defined ratio. The dry/wet module 408 acts as a mixer between the input audio signal 202, which is the unprocessed audio signal and the processed signal from at least one of the dynamic processor module. The dry/wet module 408 offers a single point control for configuring the preset module 406. Additionally, it enables controlling at least one or more dynamic processor module such as the noise gate 404 and the compressor 410 through the analytics module 232 by passing at least one control parameter. Furthermore, the dry/wet module 408 may also improve the haptic output signal by a mix of the dry audio signal to the wet audio signal. When no sound effects can be produced using the wet audio signal, the mix of the dry/wet signal may provide the basis to produce the haptic output. In one embodiment of the present invention, the pre-defined ratio of the two signals may vary between 0 and 1. A part of the output signal from the dry/wet module 408 may also be provided to a mixer module 418.

The output signal from the noise gate module 404 is passed on to the compressor module 410, which reduces the dynamic range of the received signal 202. The compressor module 410 may also receive parameters from the analytics module 232. The received parameters may modulate or control or adjust the gain of the compressor module 410 without interfering with the digital signal processing chain. The output signal from the compressor module 410 with a reduced dynamic range is passed on to the envelope follower module 414. The envelope follower module 414 converts the received high-frequency signal into a low frequency signal and further converts the received bipolar signal into a unipolar signal; the low-frequency signal is the replica of the high-frequency signal. The output of the envelope follower module 414 is passed on to an oscillator module 416 which is tuned to a fixed resonant frequency preferably the resonant frequency of an actuator 428. In some embodiments of the present invention, the oscillator module 416 may be tuned around the resonant frequency of the actuator 428. The output from the oscillator module 416 is subsequently passed to the mixer module 418.

A part of the signal from the compressor module 410 is also passed on to a resonance module 412, which amplifies low-frequency components present in the received signal. The resonance module 412 may append low-frequency components that replicate a string or membrane musical instrument. In an embodiment, the resonance module 412 may amplify as well as append low-frequency components initially present in the input audio signal 202 which were suppressed during audio signal processing at various stages of digital signal processing chain. Additionally, the resonance module 412 may add low frequencies to the received signal. Furthermore, the resonance module 412 may excite the physical module of string, membrane, plate or other musical instruments to enhance the haptic output. The output of the resonance module is passed on to the mixer module 418.

The mixer module 418 also receives the input from the dry/wet module 408, the output of the oscillator module 416, and the output from the resonance module for 412. In the mixer module 418, the received signals are mixed in a pre-defined proportion. The output signal from the mixer module 412 is passed to a low pass filter module 420. The low-pass filter module 420 suppresses any unwanted high-frequency components from the received signal. The output signal from the low pass filter module 420 is passed on to a limiter module 424. The limiter module 424 ensures that any unwanted energy embedded in the received signal is restricted to the operating voltage or current of the actuator 428. Thus, the limiter module 424 limits any additional power that may damage the actuator 428. Also, the limiter module 424 may limit the voltage in the signal to avoid any damage to the actuator 428. Moving further, a bell filter module 426 expands the operating frequency response range of the actuator 428. The output signal from the bell filter module 426 is provided to a detector module 430 and the actuator 428. The actuator 428 transforms the received signal from the bell filter module 426 to produce haptic output.

A preset module 406 may have one or more preset switches configured for setting one or more control parameters in the low pass filter module 420, the delimiter module 424, and the bell filter module 426. In some embodiments, the one or more control parameters may include the cut-off frequency, the proportion of signals to be mixed in different modules, and the like. In one embodiment of the present invention, the preset switch may be controlled by a user interface in the electronic device, a rotary switch with different preset values or some other type of switch.

The exchange of parameters between the at least one dynamic processor, for example, the noise gate 404 or the compressor module 410, and the analytics module 232 may be independent of the digital signal processing chain. In an embodiment of the present invention, the exchange of parameters between at least one dynamic processor and the analytics module 232 may be implemented using a pointer, passing on a value by reference, shared memory, function, subroutines, procedures or any other type of parameter exchange means known in the art. For example, the noise gate 404 may receive parameter values from the analytics module 232 and accordingly control the threshold value of the noise gate 404. In another implementation, the compressor module 410 receives parameters from the analytics module 232 to control the gain of the compressor module 410. The exchange of parameters may not interfere with the digital signal processing chain but may be utilised to set the gain of the compressor 410.

The output signal from the bell filter module 426 may be passed on to a detector module 430 which may also receive an input from the pre-processing module 402 or the input audio signal 202. The detector module 430 probes the presence of a signal at either of the two inputs, that is input signal from the preprocessing module 402 and the output signal from the bell filter module 426. If no signal is detected at either of the inputs, the detector module 430 switches off the haptic processing module 400 into power saving mode. However, if a signal is detected at both the input audio signal 202 and the output of the bell filter module 426, the detector module 430 may keep the haptic processing module 400 in power ON state or active mode. When a signal is detected either at the input or the output, the detector module 430 may stay in power ON state for a pre-determined time-period and again probe the two inputs and, in absence of a signal at both the inputs, the detector module 430 may switch off the power or energy or enter into power saving mode. In some embodiments, the time-period before the haptic processing module 400 may switch off the power may vary between 10 seconds to 60 seconds. In another embodiment, the period before the detector module 430 may switch off the power supply may be hard-coded in the program instructions.

The analytics module 232 includes the transient analysis detection module (or transient detector) 304, the peak analyzer module (or peak analyser) 306, the input signal analyzer and RMS generator module (or input signal analyser and RMS generator) 308, the sidechain module (or sidechain processor) 310, the predictive and intelligence module (or predictive and intelligence processor) 312, the detector and threshold (or detector and threshold processor) module 314, the gain controller module (or gain controller) 316A and the gain controller module (or gain controller) 316B. The analytics module 232 and all other modules perform the function as already described earlier.

In an embodiment of the present invention, the analytics module 232 may include a transient analysis detection module 304, a peak analyzer module 306, an input signal analyzer and RMS generator module 308, a side chain module 310, a detector and threshold module 314, a predictive and intelligence module 312, a gain controller module 316A and a gain controller module 316B. Each module may have one or more processors or share a processor or share a core or be embedded in a VLSI framework with an associated processor. For example, the peak analyzer module 306 may have an independent processor and a memory. In another example, the transient analysis module 304 may have an independent processor and a memory. In yet another example, the input signal analyzer and RMS generator module 308 may have an independent processor and a memory. In yet another example, the sidechain module 310 may have an independent processor and a memory. In yet another example, the predictive and intelligence module 312 may have an independent processor and a memory. In yet another example, the detector and threshold module 314 may have an independent processor and a memory. In yet another example, the gain controller module 316A and 316B may have an independent processor and a memory.

Figure 5:
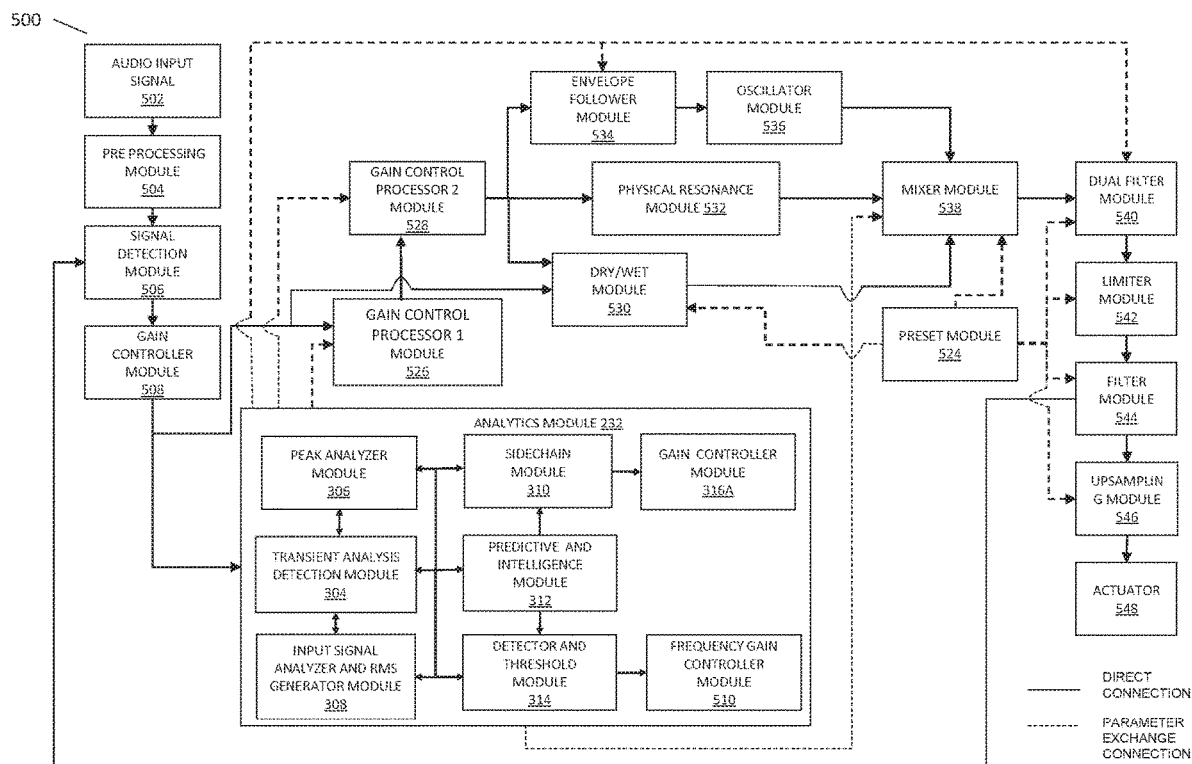
FIG. 5 illustrates a haptic module of a haptic processing system in other embodiment of the present invention.

Referring to FIG. 5, a haptic processing system 500 is provided in an alternate embodiment of the present invention. The dotted connection illustrates a parameter exchange between different modules and the direct line indicates the flow of an input audio signal 502 in different modules.

As defined earlier and herein, the haptic processing module 500 comprises of a digital signal processing chain, an analytics module 232, and a preset module 524. The analytics module 232 and the preset module 524 control or modulate the processing of audio input signal in the digital signal processing chain by adjusting one or more control parameters in the different modules. The digital signal processing chain comprises of all the modules through which the audio input signal is processed to produce haptic output.

The haptic processing system 500 receives an input audio signal 502 (same as input audio signal 202) which is provided to a preprocessing module 504. The preprocessing module 504 converts the signal into a suitable form to enable processing of the audio input signal 502, for example, by converting the received input audio signal 502 into a signal with a sampling rate below 8 KHz. Likewise, the preprocessing module 504 may include a low pass filter to remove unwanted frequencies. The output of the preprocessing module 504 is provided to a signal detection module 506; the signal detection module 506 senses the presence of a signal from the preprocessing module 504 and a signal received from a bell filter module 544, and in absence of a signal at the preprocessing module and the bell filter module 544, turns off the power of the haptic processing module 500 and enters the power saving mode. Alternatively, if the detection module 506 senses a signal either at the preprocessing module 504 or a signal from the bell filter module 544, it keeps the haptic processing module 500 in active power state. In yet another embodiment, the detection module 506 investigates the presence of a signal from the pre-processing module 504 and a signal from the bell filter module 544, and if it detects no signal from the preprocessing module 504 but a signal from the bell filter module 544, the detection module waits for a pre-determined time before switching off the power of the haptic processing module 500. In an embodiment, the pre-determined time may be 10 seconds. In other embodiments, the pre-determined period may be between 1 second and 60 seconds.

The output from the signal detection module 506 is provided to a gain controller module 508, which increases or decreases the gain of the signal. The output of the gain controller module 508 is then passed on to a gain control processor 1 module 526 and to an analytics module 232. The gain control processor 1 module 526 receives at least one control parameter such as threshold from the analytics module 232; the at least one control parameter adjusts or controls the threshold level of the gain control processor 1 module 526 and also provide gain to be applied to the signal. The passing of threshold parameters on to the gain control processor 1 module 526 may be made by reference, value, pointer or by a function call as known in the art. The gain control processor 1 module 526 opens to pass on the received signal when the received signal is above the received threshold value and attenuates the received signal if it is below the threshold value. In some embodiments, the gain applied to the received signal may vary dynamically based on the parameters provided by the analytics module 232. For example, the gains applied at one instance t1 and at another instance is t2 are different depending upon the characteristics of the input audio signal 502.

The analytics module 232 also receives the signal from the gain controller module 508. The received signal is simultaneously provided to the transient analysis detection module 314, the peak analyzer module 306 and the input signal analyzer and RMS generator module 308. The transient analysis detection module 304 detects the presence of transients in the received input signal, while the peak analyzer module 306 calculates the peak values in the received input signal for a fixed period of time. Likewise, the input signal analyzer and RMS generator module 308 calculates the root mean square values of the received signal for modulating or controlling at least one control parameter, for example the gain or the threshold value of gain control processors.

The sidechain module 310 controls the different parameters for the haptic processing system 500 such as an attack time, a release time, a hold time, a knee and other parameters associated with the received signal. The detector and threshold module 314 monitors the received signal and detects when the input audio signal moves above or below the threshold values. The output from the transient analysis detection module 304, the peak analyzer module 306, the input signal analyzer and RMS generator module 308, the sidechain module 310 and the detector and threshold module 314 are provided to the predictive and intelligence module 312. The predictive and intelligence module 312 calculates the one or more control parameters to control signal processing at different stages of the haptic processing module 500. For example, based on the parameters received from the transient analysis detection module 304, the peak analyzer module 306, the input signal analyzer and RMS generator module 308, the sidechain module 310 and the detector and threshold module 314, the predictive and intelligence module 312 may provide the parameters to the gain control processor 1 module 526 to control the threshold values. Similarly, the transient analysis detection module 516, the peak detection module 306, the RMS generator module 308, the sidechain module 310 and the detector and threshold module 314 the predictive and intelligence module 312 may modulate the gain at one or more gain control processors. Also, the output of the sidechain module 310 is also passed on to a gain controller module 316A. Likewise, the output from the detector and threshold module 314 is also passed on to frequency gain controller module (or frequency gain controller) 510. The frequency gain controller 510 may control or adjust the amplitude of received signal at particular frequencies to provide enhanced haptic response over wide band actuators.

The output of the gain control processor 1 module 526 is provided to the gain control processor 2 module 528, which receives parameters from the analytics module 232 to set the gain, threshold, and other parameters. The gain control processor 2 module 528 reduces the dynamic range of the received signal based on parameters such as gain and/or threshold value received from the analytics module 232 in real time. The parameters may be passed on using any known method of passing on parameters such as passing on by value, passing on by reference, passing on by pointer.

The output from the gain control processor 2 module 528 is passed simultaneously on to an envelope follower module 534, a physical resonance module 532, and a dry/wet module 530. The envelope follower converts the high frequency signal to a low-frequency signal and the bipolar signal into a unipolar signal to be provided to an oscillator module 536. The oscillator module 536 modulates the received signal at a fixed resonant frequency. In some embodiments, the fixed frequency may vary from 35 Hz to 120 Hz. The physical resonance module 532 amplifies and/or appends the suppressed low frequencies in the received signal to produce a better haptic experience. Additionally, the physical resonance module 532 may also generate audio waveform using mathematical models to add frequencies of string, membrane and the like.

The dry/wet module 530 receives input from the gain control processor 2 module 528 and the gain controller module 508. The dry/wet module 530 processes the received signals and provides the output to the mixer module 538.

Additionally, the analytics module 232 also passes control parameters on to the envelope follower module 534 and a dual filter module 540. The analytics module 232 passes on parameters to control the threshold and/or gain at the envelope follower module 534. Additionally, the analytic module 232 also provides parameters to the dual filter module 540.

A preset module 524 provides a parameter to control the dry/wet module 530, the mixer module 538, a dual filter module 540, a limiter module 542, a filter module 544, and an up-sampling module 546. For example, the preset module 524 may provide a user interface to set the parameters to control the mixer module 538. In another example, the dry/wet module 530 may be controlled by a slider accessible to a user via a software or hardware user interface.

The output from the oscillator module 536, the physical resonance module 532, and the dry/wet module 530 is provided to the mixer module 538. The mixer module 538 mixes the signal in a pre-defined proportion. The pre-set module 524 may control the pre-defined proportion of the signals to be mixed. The output from the mixer module 538 is passed on to a dual filter module 540. The dual filter module 540 filters the output using a double filter with cut-off frequencies F1 and F2. The analytics module 232 controls the opening of the filters LF1 and LF2 associated with dual filter module 540. When a transient is detected, the analytics module 232 directs the dual filter 540 to shift the cut-off the frequency from F1 to F2. After passing on the transient, the analytics module 232 sends a control signal to shift the cut-off frequency to F1. In one example, the cut-off frequency of the dual filter 540 may be 40 Hz to 250 Hz. In another example, the cut-off frequency of the dual filter 540 may be between 50 Hz to 400 Hz. In another embodiment, the lower cut-off frequency may be between 20-60 Hz and upper cut-off frequency may be between 250 Hz to 500 Hz.

The output of the dual filter module 540 is then provided to the limiter module 542, which ensures that the received signal is within the acceptable operating range of an actuator 548. Otherwise, it may create distortions in the haptic output. To overcome this, the limiter module 542 is set to −3 dB just below 0 dB to provide a flat haptic response.

In an embodiment of the present invention, the limiter module 542 may be associated with an overdrive module and a damping module. Due to the initial weight of the actuator 548, when the excitation voltage is passed on to the actuator 548, it takes time to achieve the expected vibrations. This is due to the weight of the actuator 548. The slow response of the actuator 548 is compensated by an overdrive module that provides additional excitation to reach expected vibrations on initial excitation. Additionally, the weight of the actuator 548 and the inertia gained by it during vibration does not allow it to stop immediately. To compensate the additional vibration of the actuator 548, a damping module is provided. The damping module may provide an excitation voltage, which is 180 degrees out of phase from the input signal (inverted input signal) to damp out the vibration and to halt the actuator 548 immediately.

The output of the limiter module 542 may be provided to the filter module 544 to attenuate any unwanted frequencies. The output of the filter module 544 may be passed on to an up-scaling module 546 to amplify or reinforce frequencies that may have diminished during filtering. These required frequencies are amplified and finally passed on to the actuator 548 for producing haptic output.

Figure 5A:
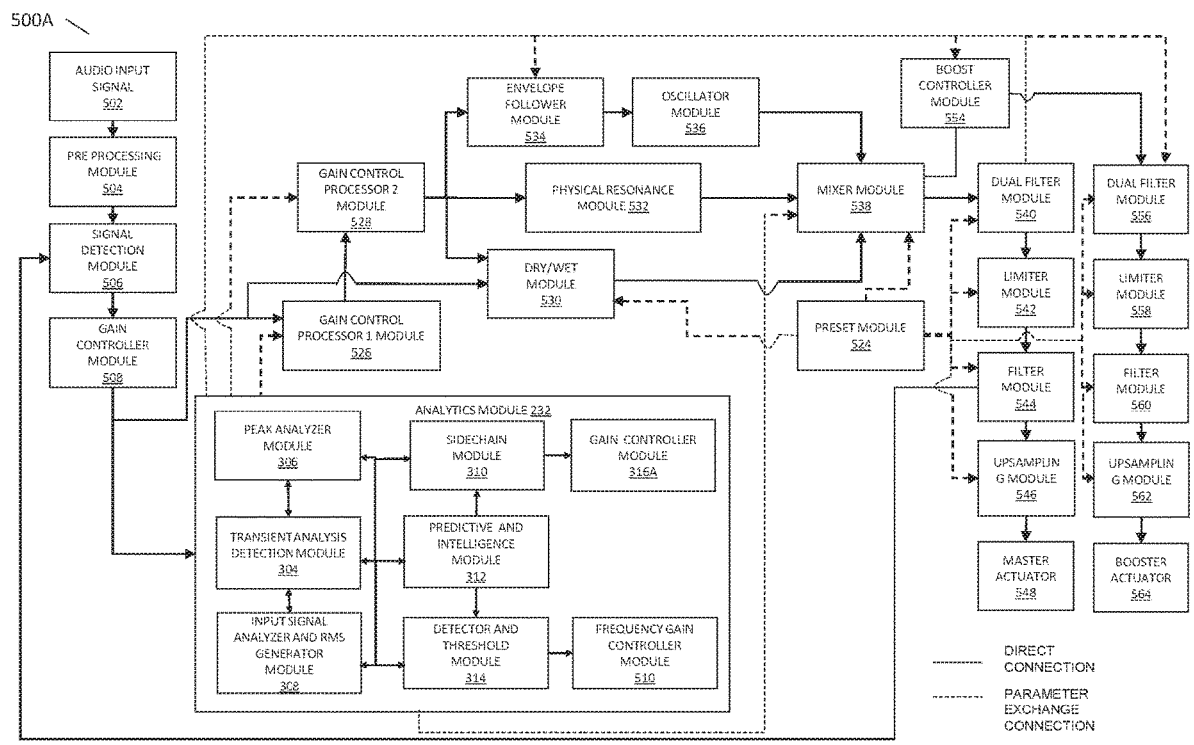
FIG. 5A illustrates a haptic module with a boost control in an embodiment of the present invention.

Referring to FIG. 5A, a haptic processing system 500A is provided in an embodiment of the present invention illustrates at least two actuators, that is, a master actuator 548 (which is same as actuator 548 but referred here in this embodiment as master actuator 548 for clarity) and a booster actuator 564. Both the master actuator 548 and the booster actuator 654 are connected with the digital signal processing chain in parallel with identical modules but operate independently. As described earlier and herein, the digital signal processing chain comprises of all the modules with a direct audio signal flow. The input audio signal is processed in the digital signal processing chain to generate haptic output signal. Referring to FIG. 5A, the digital signal processing chain comprises all the different modules except the analytics module 232 and the preset module 524. The analytics module 232 and the preset module 524 controls or adjusts the processing of the digital signal processing chain by passing one or more control parameters. Furthermore, as provided earlier and herein, the dotted connection illustrates exchange of parameters among different modules, whereas the direct line indicates the flow of an input audio signal among different modules. Furthermore, the analytics module 232 implements all the functionality as described in FIG. 3A, FIG. 3B, and FIG. 3C.

The haptic processing module 500A receives the input audio signal 502 which is provided to the preprocessing module 504. The preprocessing module 504 converts the signal into a suitable form to enable processing of the audio input signal 502, for example, by converting the received input audio signal 502 into an audio signal with a sampling rate of below 8 KHz. The preprocessing module 504 may include a low pass filter to remove unwanted frequencies. The output of the preprocessing module 504 is provided to a signal detection module 506; the signal detection module 506 senses the presence of the input audio signal 502 from the preprocessing module 504 and the output signal received from the bell filter module 544, and in the absence of a signal at the pre-processing module 504 and the bell filter module 544, turns off the power of the haptic processing module 500A and enters the power saving mode. Alternatively, if the signal detection module 506 senses a signal either at the preprocessing module 504 or a signal from the bell filter module 544, it keeps the haptic processing module 500A in an active power state. Additionally, the signal detection module 506 investigates the presence of a signal from the preprocessing module 504 and a signal from the bell filter module 544, and if no signal is detected at the preprocessing module 504 but an output signal is sensed at the bell filter module 544, the signal detection module 506 waits for a predetermined amount of time before switching off the power of the haptic processing module 500A.

In a preferred embodiment, the predetermined time may be between 5 to 10 seconds. In other embodiments, the predetermined period may vary between 1 second and 60 seconds.

The output from the signal detection module 506 is provided to the gain controller module 508, which increases or decreases the gain of the audio signal. The output of the gain controller module 508 is then passed on to the gain control processor 1 module 526 and to the analytics module 508. The gain control processor 1 module 526 receives one or more control parameters, for example, threshold and/or gain from the analytics module 232. The control parameters adjust or control threshold of the gain control processor 1 module 526. In addition, the control parameters also provide the gain to be applied to the input signal during processing in the digital signal processing chain. The control parameters can be passed to the gain control processor 1 module 526 by reference, value, pointers or as a function or subroutine calls.

The gain control processor 1 module 526 operates either in an open state or a closed state. When the received signal from the gain controller module 508 is above the threshold value, gain control processor 1 module 526 operates open state and passes the received signal; however, when the received signal is below the threshold values, the gain control processor 1 module 526 is in closed state and attenuates the received signal. In some embodiments, the gain applied to the received signal and/or the threshold values are dynamically updated in real time. Furthermore, in another embodiment, the gain applied to the received signal and/or the threshold values are dynamically updated at varying time intervals. For example, the gain and/or the threshold applied at instance t1 and at instance t2 are different depending upon the characteristics of the input audio signal 502.

The analytics module 232, and the gain controller processor 1 module 526 simultaneously receives the input audio signal 502 from the gain controller module 508. The received input signal is provided to a transient analysis detection module 304, a peak analyzer module 306 and an input signal analyzer and RMS generator module 308. A parallel processing is performed on the input audio signal 502. The transient analysis detection module 304 detects the presence of transients in the received input signal by implementing the transient detection algorithm defined later in FIG. 21. The peak analyzer module 306 calculates the peaks in the received input signal for a fixed time with varying window size. The window size may depend upon the frequency of the signal, pitch, temporal resolution, frequency resolution and other waveform characteristics. In one embodiment, the window size is selected based on an adaptive algorithm such as the Widrow-Hoff least square (LMS). Simultaneously, the input signal analyzer and RMS generator module 308 calculates the root mean square values of the received audio signal. The peak and RMS values are utilized to calculate one or more control parameters for modulating the gain control processor 1 and the gain control processor 2 as described in the process 1600 in FIG. 16. The one or more control parameters may be a gain, a threshold, pitch, phase or some other parameters related to input audio signal.

The analytics module 232 also includes the input signal analyzer and RMS generator module 308, the sidechain module 310, the predictive and intelligence module 312, the detection and threshold module 314, the gain controller module 316A, the frequency gain controller module 552 and a booster analytics module 338 (shown in FIG. 3C) apart from other modules. The peak analyzer module 306 calculates the peak values of the input audio signal 502. The transient analysis detection module 304 detects the presence of transients in the input audio signal 502. The RMS generator calculates the RMS values of the input audio signal 502. As herein and elsewhere, the RMS values and the peak values are utilised for calculation of one or more control parameters such as the gain and/or threshold. Similarly, the transient analysis detection module 304 handles transients in the input audio signal 502 by implementing the transient processing algorithm described later under FIG. 21. The sidechain module 310 controls the different parameters for the haptic processing module 500A such as an attack time, release time, a hold time, a knee and other parameters. A detector and threshold module 314 monitors the received input signal and detects when the input audio signal moves above or below the threshold values. The output from the transient detection module 304, the peak detection module 306, the RMS generator module 308, the sidechain module 310 and the detector and threshold module 314 are provided to the predictive and intelligence module 312. The predictive and intelligence module 312 calculates the parameter values associated with input audio signal 502 characteristics to control signal processing at different stages of the haptic processing module 500A. The predictive and intelligence module 312 may implement all the predictive algorithms as described in FIG. 3C. For example, based on the parameters received from the transient analysis detection module 304, the peak analyzer module 306, the input signal analyzer and RMS generator module 308, the sidechain module 310 and the detector and threshold module 314, the predictive and intelligence module 312 may provide the parameters to the gain control processor 1 module 526 to control at least one parameter such as the threshold values/gain. Similarly, the transient analysis detection module 304, the peak analyzer module 306, the input signal analyzer and RMS generator module 308, the sidechain module 310, the detector and threshold module 314 and the predictive and intelligence module 312 may modulate the gain at one or more gain control processors like gain control processor 1. Also, the output of the sidechain module 310 is also passed on to a gain controller module 316A. Likewise, the output from the detector and threshold module 314 is also passed on to frequency gain controller module 552, which provides further refining to control parameters.

The output of the gain control processor 1 module 526 is provided to the gain control processor 2 module 528, which also receives control parameters from the analytics module 232 to set the gain and/or threshold. The gain control processor 2 module 528 reduces the dynamic range of the received signal based on the control parameters such as gain and/or threshold value received from the analytics module 232 in real time. The control parameters can be passed on using any known method of parameter passing in computer programming such as pass by value, pass by reference, pass by pointer and the like.

The output from the gain control processor 2 module 528 is passed simultaneously on to the envelope follower module 534, the physical resonance module 532, and the dry/wet module 530. The envelope follower module 534 converts the high frequency signal to a low-frequency signal and the bipolar signal into a unipolar signal to be provided to an oscillator module 536. The oscillator module 536 modulates the received signal at a fixed resonant frequency. In different embodiments, the fixed frequency may vary from 35 Hz to 120 Hz depending upon resonant frequency of the master actuator 548. The physical resonance module 532 amplifies and/or appends the suppressed low frequencies in the received signal to produce a better haptic experience.

The dry/wet module 530 receives input from the gain control processor 2 module 528 and the gain controller module 508. The dry/wet module 530 receives a dry signal and a wet signal as input. The dry signal is an unprocessed input audio signal. The wet signal is a processed input audio signal. The dry/wet module 530 mixes the dry signal and the wet signal in a specific ratio. The output of the dry/wet signal is provided to the mixer module 538.

The analytics module 232 also passes one or more control parameters to the envelope follower module 534, the dual filter module 540, a dual filter module 556 and a booster controller module 554.

The mixer module 538 is connected directly with the dual filter module 540. In addition, the mixer module 538 is also connected with the booster controller module 554. The haptic output from the mixer module 538 is provided to the dual filter module 540, the limiter module 542, the filter module 544, the up-sampling module 546 and to one or more master actuator, such as the master actuator 548. FIG. 5A depicts only one master actuator 548, although more than one master actuators such as 548A, 548B, 548C, 548D can be provided for producing haptic experience.

The boost controller module 554 provides the output signal to the dual filter 556, a limiter module 558, a filter module 560, an up-sampling module 562 and to a booster actuator 564. Although only one booster actuator 564 is shown, more than one booster actuators such as a booster actuator 564A, a booster actuator 564B, a booster actuator 564C, and a booster actuator 564D can be connected with the up-sampling module 562 in other embodiments. The main purpose of the booster control module 554 is to provide additional boost for better haptic experience in synchronisation with the master actuator 548. The booster control module 554 also receives an input from the booster analytics module 338 as described in FIG. 3 incorporated herein.

The boost controller 554 receives input from the analytics module 232 and the mixer module 538 to decide when to trigger the boost based on one or more control parameters. The one or more control parameters are waveform characteristics like amplitude, frequency, phase, loudness, RMS values, peak values, the calculated gain, the calculated threshold, and the predictive algorithms implemented in the prediction and intelligence module in FIG. 3C. By way of example and not as a limitation, the mixer module 538 provides a haptic signal to the boost controller module 554. The boost controller module 554 has logic to trigger the one or more booster actuators 564 in synchronisation with the master actuator 548. Alternatively, the boost controller 554 may trigger the booster actuator 564 based on one or more control parameters received from the analytics module 232. The boost controller 554 can trigger one or more booster actuators 564 based on one or more control parameters received from the analytics module 232 and the received signal from the mixer module 538 in another implementation. Likewise, the boost controller 554 may trigger the booster actuator 564 based on one or more control parameters received from the analytics module 232 or the received signal from the mixer module 538 in yet another implementation. However, the master actuator 548 generates haptic output based on signal received from the digital signal processing chain. To illustrate with an example, the haptic processing system 500A produces haptic output through the master actuator 548 continuously based on input audio signal 502. However, the booster controller 554 decides when to trigger the booster actuator 564 in phase with the master actuator 548.

Figure 5B:
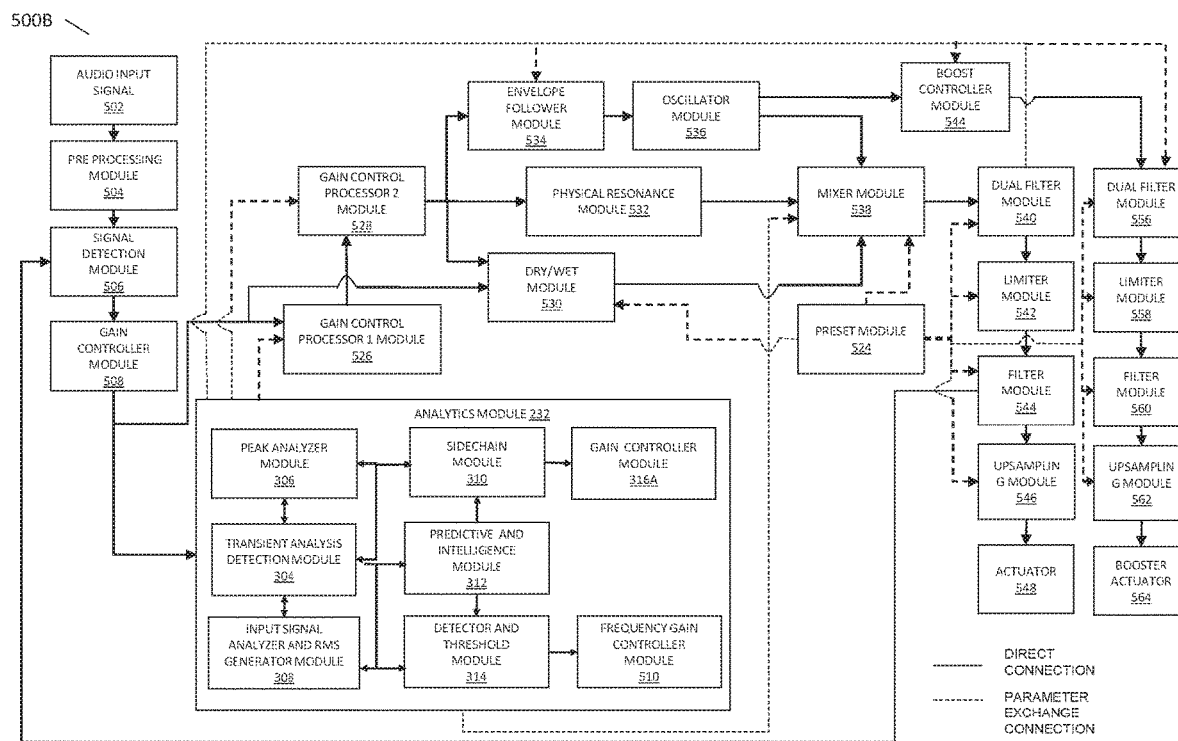
FIG. 5B illustrates a haptic module with a boost control in an alternate embodiment of the present invention.

FIG. 5B illustrates an alternate implementation of the haptic processing system 500B, which is similar to 500A in all functionality except that in this implementation the boost controller module 554 receives output signal from the oscillator module 536. The novel aspect of this implementation is to use a simple waveform to drive the booster actuator 564 for producing haptic output. For example, the booster actuator 564 can be a Linear Resonant Actuator (LRA), which provides maximum haptic effect at the resonant frequency and can be integrated along with the master actuator 548. The LRA based booster actuator 564 can be tuned at resonant frequency and the master actuator 548 is a wide band actuator tuned to provide good frequency response over a range of frequencies. This arrangement simplifies the synchronisation of the booster actuator 564 with the master actuator 548 producing a better haptic experience. In addition, the mixer module 538 mixes input signals received from different sources. The output waveform is a complex waveform, which is passed to the master actuator 548 to produce high definition haptic experience whereas a boost signal is provided by the oscillator module 536. The booster controller module 554 triggers the booster actuator 564 based on one or more control parameters to generate haptic output via the dual filter module 556, the limiter module 558, a filter module 560, and an up-sampling module 562. Although only one boost actuator 564 is shown, there may be one or more boost actuators such as a booster actuator 564A, a booster actuator 564B, a booster actuator 564C, and a booster actuator 564D connected to the upsampling module 562. In one example, the master actuator 548 is connected to one or more booster actuators such as the booster actuator 564A, the booster actuator 564B, the booster actuator 564C, and the booster actuator 564D. In another example, one or more master actuators such as the master actuator 548A, the master actuator 548B, the master actuator 548C, and the master actuator 548D can be configured to one booster actuator 564. In another example, one or more master actuators such as the master actuator 548A, the master actuator 548B, the master actuator 548C, and the master actuator 548D is connected with the booster actuator 564A, the booster actuator 564B, the booster actuator 564C, and the booster actuator 564D.

Figure 5C:
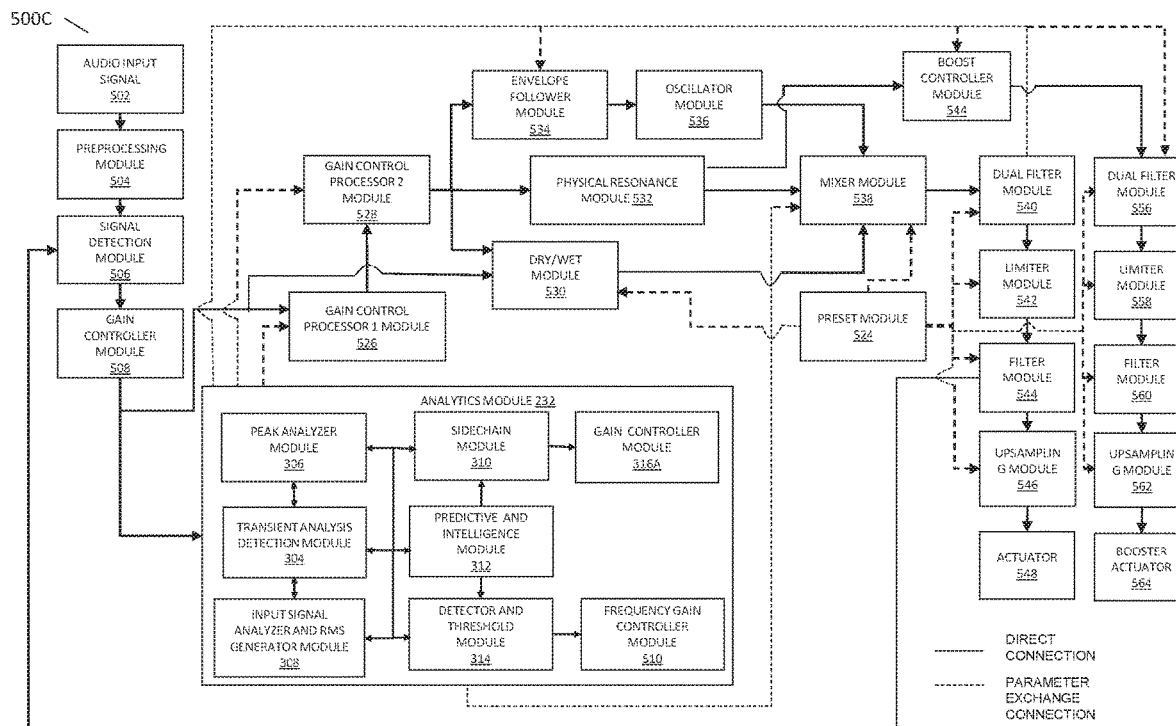
FIG. 5C illustrates a haptic module with a boost controller in another alternate embodiment of the present invention.

FIG. 5C illustrates another alternate implementation of the haptic processing system 500C similar to the haptic processing system 500A except that the boost controller module 554 receives the output signal from the physical resonance module 532. The booster controller module 554 then triggers the booster actuator 564 based on one or more control parameters to produce the haptic output through the dual filter module 556, the limiter module 558, a filter module 560, and an up-sampling module 562. By connecting the physical resonance module 532 to the boost controller module 554, several suppressed frequencies can be amplified to drive the booster actuator 564 in synchronization with the master actuator 548. Due to processing of the input audio signal 502 at various stages, some of the frequencies might be lost or suppressed and require regeneration or amplification to produce a realistic haptic experience. This can be achieved by passing a part of the haptic signal from the physical resonance module 532 directly to the boost controller module 554, which drives the booster actuator 564 based on one or more control parameters in synchronization with the master actuator 548. Although only one boost actuator 564 is shown, there may be one or more boost actuators such as a booster actuator 564A, a booster actuator 564B, a booster actuator 564C, and a booster actuator 564D connected to the upsampling module 562. In one example, the master actuator 548 is connected to one or more booster actuators such as the booster actuator 564A, the booster actuator 564B, the booster actuator 564C, and the booster actuator 564D. In another example, one or more master actuators such as the master actuator 548A, the master actuator 548B, the master actuator 548C, and the master actuator 548D is configured to one booster actuator 564. In another example, one or more master actuators such as the master actuator 548A, the master actuator 548B, the master actuator 548C, and the master actuator 548D is connected with the booster actuator 564A, the booster actuator 564B, the booster actuator 564C, and the booster actuator 564D.

A pre-set module 524 provides controls for setting parameters or predefined values in the dry/wet module 530, the mixer module 538, the dual filter module 540, the limiter module 542, the filter module 544, and the up-sampling module 546. For example, the preset module 524 may provide a user interface to set the control parameters or values. In another example, the dry/wet module 530 may be controlled by a slider accessible to a user via a software or hardware user interface. In addition, the preset module 524 is used to set the control parameters or control values in the dual filter module 556, the limiter module 558, the filter module 560, the upsampling module 562 associated with the booster actuator 564. The control parameters or control values can either be predefined or set using a user interface.

Moving further, the output signal from the oscillator module 536, the physical resonance module 532, and the dry/wet module 530 are mixed together in the mixer module 538. The mixer module 538 mixes the signal in a pre-defined proportion or can be set through the user interface of the preset module 524. The output from the mixer module 538 is passed on to the dual filter module 540 and the boost controller module 554. The output of the boost controller module 554 is provided to the dual filter module 556. The dual filter module 540 and the dual filter 556 filters the output using a double filter with cut-off frequencies F1 and F2. The analytics module 232 controls the opening of the dual filter 540 and the dual filter 556. When a transient is detected, the analytics module 232 directs the dual filter 540 and the dual filter 556 to shift the cut-off frequency from F1 to F2. After passing on the transient, the analytics module 232 sends another control signal to shift the cut-off frequency back to F1. In one example, the cut-off frequency of the dual filter may be between 40 Hz to 250 Hz. In another example, the cut-off frequency of the dual filter may be between 50 Hz to 400 Hz. In another embodiment, the lower cut-off frequency may be between 20-60 Hz and upper cut-off frequency may be between 250 Hz to 500 Hz.

The output of the dual filter module 540 is then provided to the limiter module 542, which ensures that the received signal is within the acceptable operating range of the master actuator 548. Otherwise, it may create distortions in the haptic output. To overcome this, the limiter module 542 is set to −3 dB just below 0 dB to provide a flat haptic response. Similarly, the output signal from the dual filter module 556 is provided to the limiter module 558, which ensures that the received signal is within the acceptable operating range of the booster actuator 564.

The output from the limiter module 542 is passed to the filter module 544 to filter unwanted frequencies causing distortion in the haptic output. Likewise, the output from the limiter 558 is provided to the filter module 560. The output signal from the filter module 544 is provided to the upsampling module 546 for increasing the sampling rate before generating haptic output in the master actuator 548. Likewise, the output signal from the filter module 560 is provided to the upsampling module 562 for increasing the sampling rate before generating haptic output in the booster actuator 564.

In an embodiment of the present invention, the haptic processing system 500 or 500A or 500B or 500C may have a processor shared among all or less than all the associated modules. For example, the gain controller module 508, the signal detector module 506, the gain control processor 1 module 526, the gain control processor 2 module 528, the physical resonance module 532, the envelope follower module 534, the oscillator module 536, the dry/wet module 530, the mixer module 538, the dual filter module 540, and/or the dual filter module 556 may have separate processors. In other embodiments, the gain controller module 508, the signal detector module 506, the gain control processor 1 module 526, the gain control processor 1 module 528, the physical resonance module 532, the envelope follower module 534, the oscillator module 536, the dry/wet module 530, the mixer module 538, the dual filter module 540, and/or the dual filter module 556 may have a shared processor or shared processes by way of multiprocessing, multitasking, and/or multithreading.

FIG. 5A, FIG. 5B, and FIG. 5C can be implemented in stereo or quadraphonic configuration. The stereo configuration has a left channel and a right channel, each channel having a haptic processing system shown in FIG. 5A, FIG. 5B, and FIG. 5C. For example, the left channel audio and the right channel audio are separate digital signal processing chains comprising the audio input signal 502, the pre-processing module 504, the signal detection module 506, gain controller 508, the gain control processor 1 module 526, the gain control processor 2 module 528, the envelope follower module 534, the oscillator module 536, the physical resonance module 532, the dry/wet module 530, the mixer module 538, the boost controller module 554, the dual filter module 540, the limiter 542, the filter module 544, the up-sampling module 546 to generate haptic output in the master actuator 548A. Additionally, the digital signal processing chain also includes the boost controller 554, dual filter module 556, the limiter 558, the filter module 560, the up-sampling module 562 to generate haptic output in the booster actuator 564. The analytics module 232 controls the digital signal processing chain by passing one or more control parameters. Similarly, in a quadraphonic implementation, there are at least four haptic processing modules, each comprising a digital signal processing chain with an analytics module and each connected with one or more master actuators 548 and one or more booster actuators. Alternatively, the quadraphonic channels can also be implemented using two haptic processing modules configured to provide virtual quadraphonic channels.

Figure 5D:
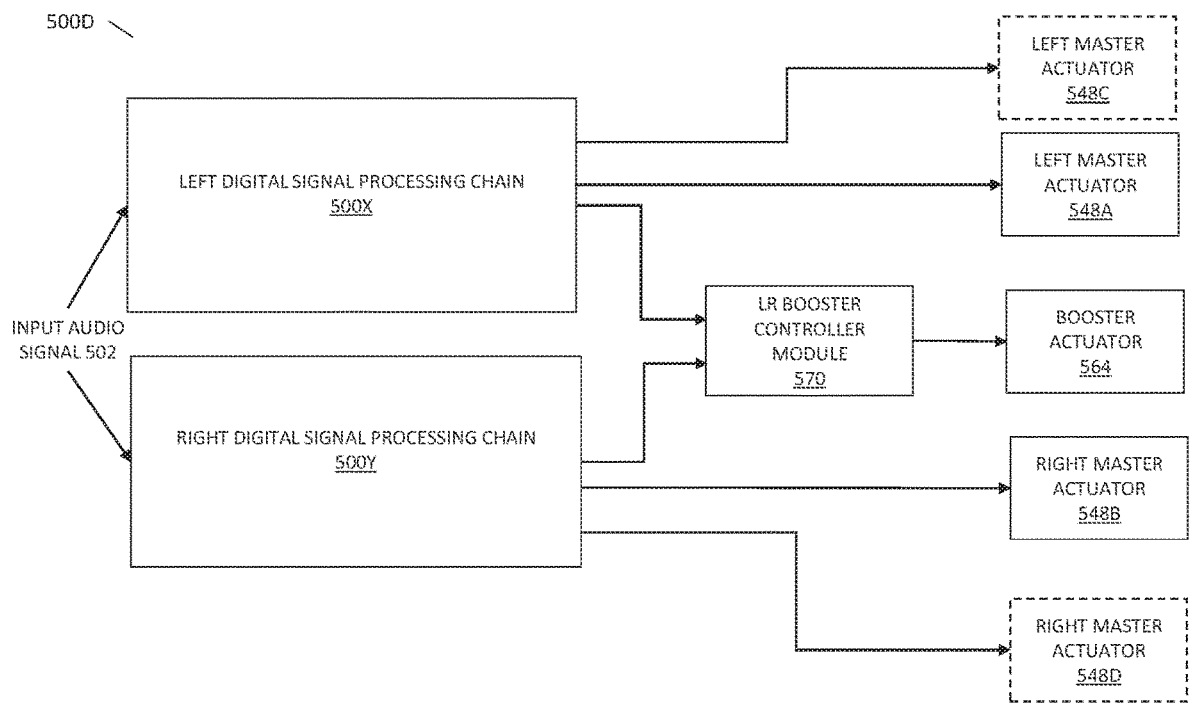
FIG. 5D illustrates a stereo implementation a booster controller in a haptic processing module in an embodiment of the present invention.

Referring to FIG. 5D, a stereophonic haptic processing system 500D is illustrated. The stereophonic haptic processing system 500D includes the input audio signal 502, which is passed to a digital signal processing chain 500A or 500B or 500C as shown in FIG. 5A, FIG. 5B, and FIG. 5C respectively. To distinguish a left digital signal processing chain and a right digital signal processing chain, the left digital signal processing chain is shown as 500X and the right digital signal processing chain is shown as 500Y. The output of the left digital signal processing chain 500X and the right digital signal processing chain 500Y is provided to a LR boost controller module 570. The boost controller module 570 includes a dual filter module, a limiter module, a filter module, an upsampling module to drive the booster actuator 564. Additionally, the left digital signal processing chain 500X produces haptic output through one or more left actuators such as the left master actuator 548A and 548C. Similarly, the right digital signal processing chain 500Y produces haptic output through one or more right master actuators such as the master actuator 548B and the master actuator 548D. A part of the output signal from the left digital signal processing chain 500X and the right digital signal processing chain 500Y is provided to the LR boost controller module 570. The LR boost controller is triggered based on one or more control parameters are described earlier. The haptic output of the master actuators, for example, the master actuator 548A and the master actuator 548B are harmonised with the booster actuator 564 to produce a synchronised haptic experience. Although only one left master actuator 548A and only one right master actuator 548B is provided, the haptic processing system 500D can have two or more left master actuators such as 548A and 548C and two or more right master actuators such as 548B and 548D in other embodiments.

Figure 5E:
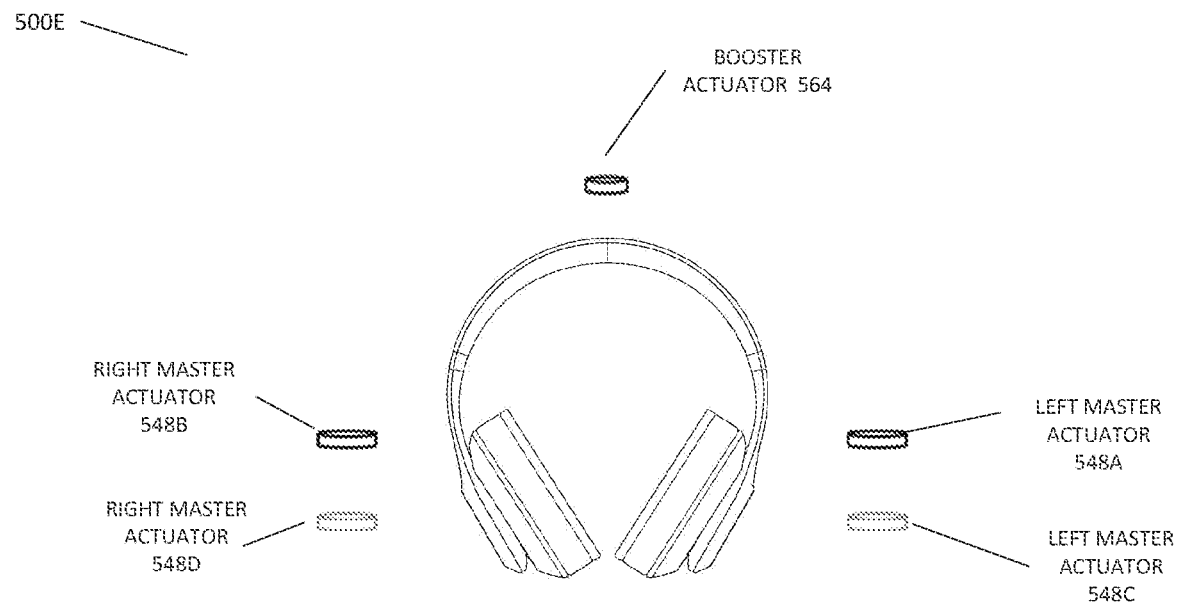
FIG. 5E illustrates a headphone with multiple actuators and a booster actuator in embodiment of the present invention.

FIG. 5E illustrates the placement of the left master actuator 548A and the right master actuator 548B with the booster actuator 564 on headphones in an embodiment of the present invention. Furthermore, one or more additional left master actuators such as 548C and one or more additional right master actuators 548D can be provided along with the left master actuator 548A and the right master actuator 548B with the booster actuator 564 in another embodiment of the present invention as shown in FIG. 5E.

Figure 5F:
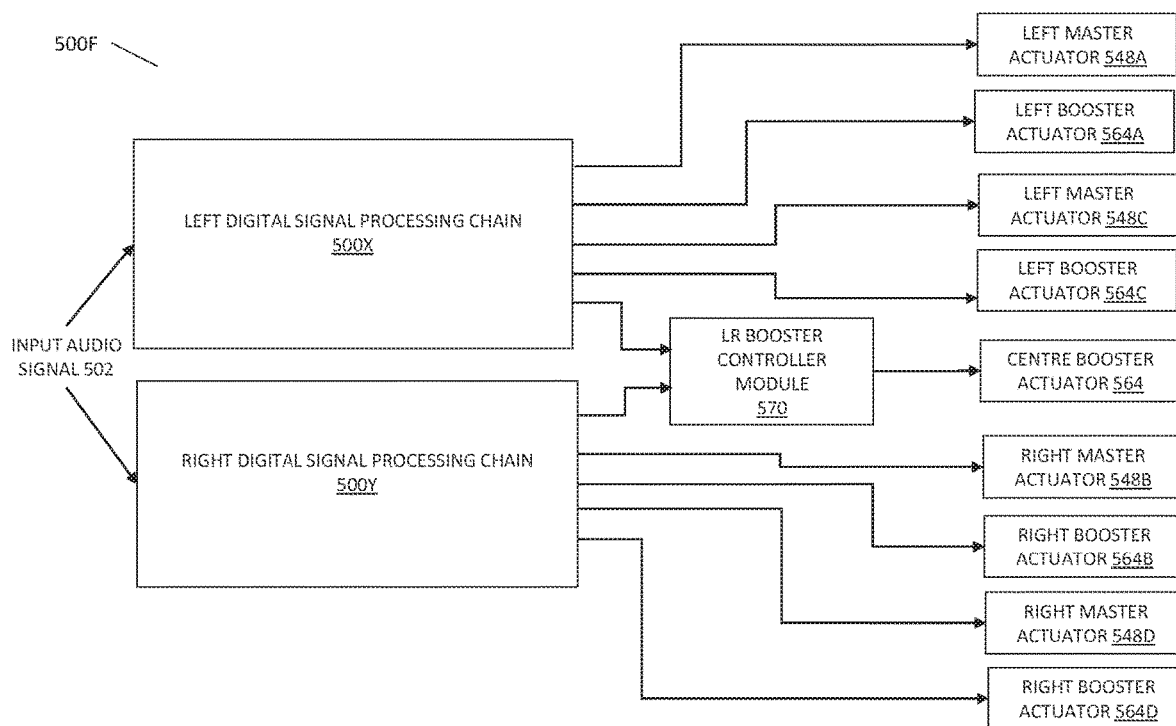
FIG. 5F illustrates a haptic processing system with multiple master actuators and multiple booster actuators in an embodiment of the present invention.

Referring to FIG. 5F, a haptic processing system 500F is illustrated with a left digital signal processing chain 500X and a right digital signal processing chain 500Y. The left digital signal processing chain 500X and the right digital signal processing chain 500Y are identical to each other but are independent haptic processing systems as provided in 500A or 500B or 500C in different embodiments. In one implementation, the left digital signal processing chain 500X drives the left master actuator 548A and the left booster actuator 564A. Similarly, the right digital signal processing chain 500Y drives the right master actuator 548B and the right booster actuator 564B. The output from the left boost controller module and the right boost controller module of the left digital signal processing chain 500X and the right digital signal processing chain 500Y respectively is also provided to the LR booster controller module 570. The LR booster controller module drives the centre booster actuator 564 in synchronisation with master actuators and the booster actuators.

Figure 5G:
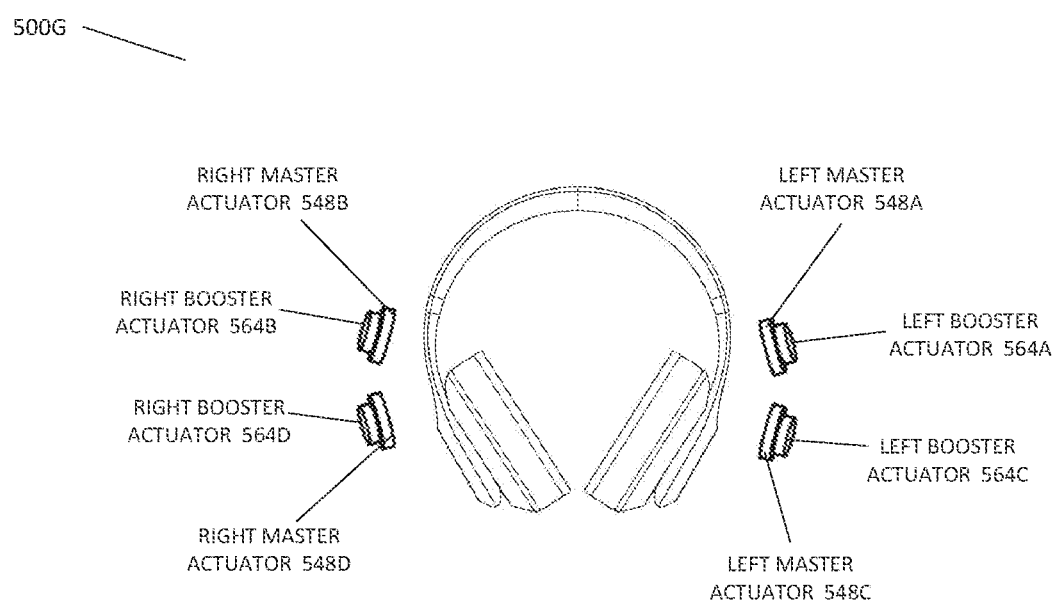
FIG. 5G illustrates a haptic processing system in a headphone with a multiple master actuators and multiple booster actuators in an embodiment of the present invention.

Referring to FIG. 5G, an implementation of a haptic system on a headphone is provided comprising at least two master actuators and two booster actuators on each channel of the headphone. Although the exemplary implementation is shown on the headphone, the haptic module 108 can be implemented in headbands, game controllers, gamepads, joysticks, mobile devices or other gaming devices with haptic output. FIG. 5G depicts at least two actuators in each channel. The left channel has the left master actuator 548A, the left booster actuator 564A, another left master actuator 548C, and another left booster actuator 564C. Likewise, the right channel has the right master actuator 548B, the right master actuator 548D, the right booster actuator 564B, and the right booster actuator 564D. Other variations such as multiple master actuators and multiple boost actuators also fall within the scope of the invention.

Figure 5H:
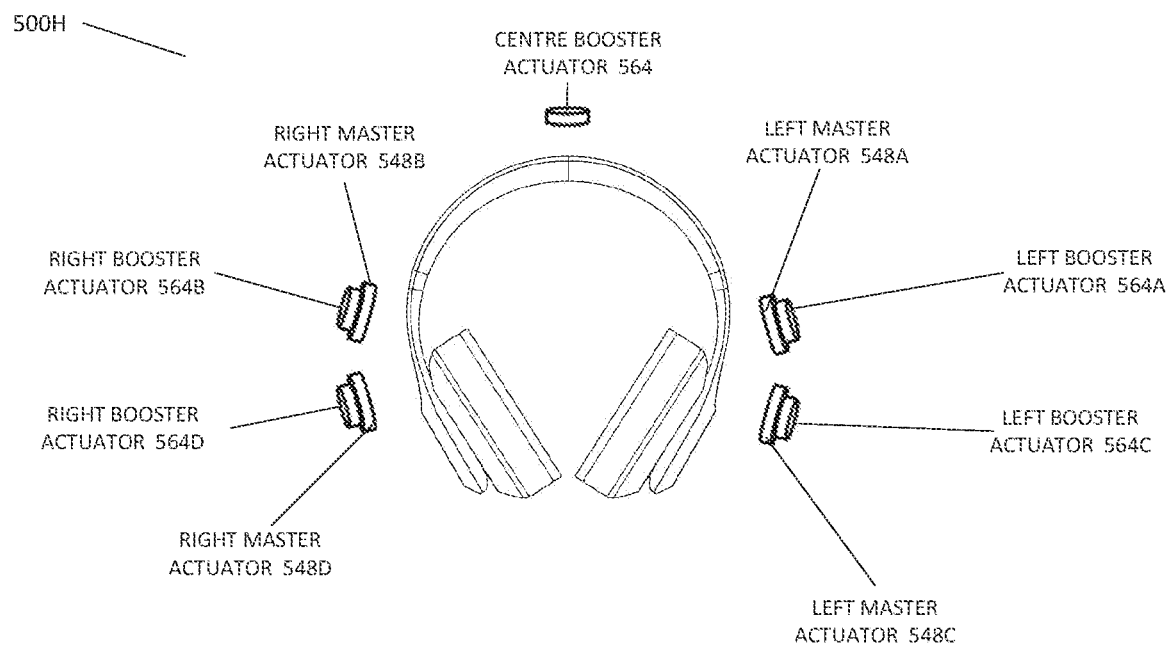
FIG. 5H illustrates a haptic processing system in a headphone with a multiple master actuators and multiple booster actuators with a centre booster actuator in an embodiment of the present invention.

FIG. 5H illustrates another variation of one or more master actuators and one or more booster actuators implemented on a headphone. Referring to 500H, the configuration includes at least two left master actuators 548A and 548C and at least two right master actuators 548B and 548D. In addition, there are at least two left booster actuators 564A and 564C, and at least two right booster actuators 564B and 564D along with the centre booster actuator 564. The centre booster actuator 564 functions in coordination with the left booster actuators 564A, 564C and the right booster actuators 564B, 564D.

In an embodiment of the present invention, the limiter module 542 and the limiter module 558 may be associated with an overdrive module and a damping module. Due to the initial weight of the master actuator 548 and the booster actuator 564, when the excitation voltage is passed on to the master actuator 548 and the booster actuator 564, it takes time to achieve the expected vibrations. This is due to the weight of the moving mass in the actuators. The slow response of the actuator is compensated by an overdrive module that provides additional excitation to reach expected vibrations on initial excitation. Additionally, the weight of the moving mass in the master actuator 548 and the booster actuator 564 gains inertia during vibrations. Due to inertia gained during the vibration, the moving mass in the master actuator 548 and the booster actuator 564 does not stop immediately. To compensate the additional vibration of the master actuator 548 and the booster actuator 564, a damping module is provided. The damping module may provide an inverted excitation voltage to damp out the vibration, and to halt the master actuator 548 and the booster actuator 564 immediately.

The output of the limiter module 542 and the limiter 558 may be provided to the filter module 544 and the filter module 560 respectively to attenuate any unwanted frequencies. The output of the filter module 544 and the filter module 560 may be passed on to an upsampling module 546 and the upsampling module 562 respectively to increase the sampling rate to a desired level. The upsampled signal is passed to digital to analog circuit to drive the master actuator 548 and the booster actuator 564 respectively to produce haptic output.

FIG. 6 depicts the various parameters in the input audio signal processing in an embodiment of the present invention. These parameters include an attack time, a release time, a knee, a gain, and a threshold apart from other parameters that may be implemented in the at least one dynamic processor, for example, the noise gate module 206 and the compressor module 212 in association with the sidechain modules 208A and 208B, respectively.

Figure 6A:
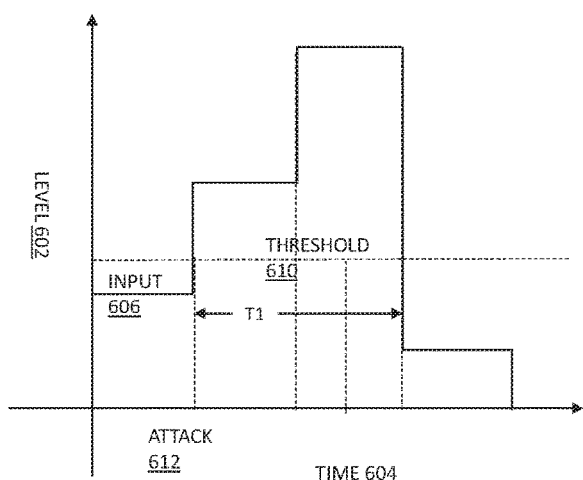
FIGS. 6A and 6B illustrate an input signal and an output signal in an embodiment of the present invention.

Referring to FIG. 6A, different parameters associated with the sidechain modules 208 and the side chain module 310 are provided in an embodiment of the present invention. For the sake of simplicity and analysis, the input audio signal 202 is shown as an input digital signal 606. The threshold level 410 is set to −20 dB. In alternate embodiments, the threshold value 410 may be set to between −10 dB to −20 dB.

Figure 6B:
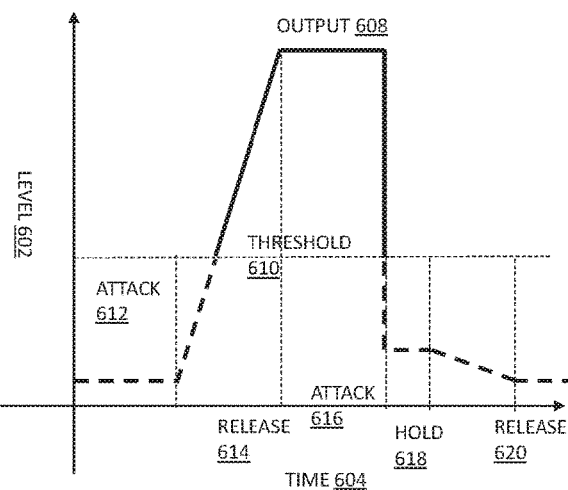

The input digital data 606 is passed on un-attenuated over the threshold value 610. When the input digital data 606 just reaches the threshold 610, the noise gate 206 is opened and passes on all input digital data 606. When the input digital data 606 falls below the threshold value 610, the noise gate 206 is closed. In the closed state, the noise gate 206 attenuates the input digital data 606. The sidechain module 208B triggers an attack time 612, when the input digital audio signal 606 is at the threshold value 610. The attack time 612 is the time required by the noise gate 206 to transact from closed to open state. This change of state from closed to open is also called fade-in duration. In some embodiments, the attack time may be between 10 milliseconds to 50 milliseconds. The attack time 612 is required for smooth transaction of the noise gate 206 from closed to open state and vice-versa. In absence of smooth transaction, the user may experience a silence for a short time. Once the input digital data 606 crosses below the threshold 610, the noise gate 206 closes to attenuate the input audio signal 202 by a pre-defined value called a gain factor/gain reduction or an attenuation factor. In some embodiments, the analytics module 232 may control the gain factor. In addition, the analytics module 232 also controls the threshold 610 in real time. For example, the analytics module 232 may pass on absolute values such as 2.0. 3.4 or 7.5 to set the threshold 610 in the noise gate module 206. Alternatively, the analytics module 232 may provide relative values such as a divisor (divide the current level by 2) or reduced threshold by 14 percent to the noise gate module 206. Subsequently, after time T1, the input digital audio data 606 falls below the threshold value 610. At this instance, the noise gate 206 does not open instantaneously, instead it holds on for a short time before opening; this short time period is referred to as the hold time 618. The hold time 618 is the time before the noise gate 206 closes after the input digital data signal 606 falls below the threshold value 610. This enables a smooth transaction between the open state and closed state of the noise gate 206 and also eliminates any abrupt changes that might induce silence or clicks in an output signal 608. A release time 620 is initiated to begin the process of closing the noise gate 206. In another embodiment, the haptic processing module may vary the hold time 618 intelligently using software instructions to avoid chattering. This provisioning is specially provided in a multi-threshold implementation of the haptic processing module 200 to avoid hysteresis. The noise gate 206 may close after the end of the release time 620. In some embodiments of the present invention, the release duration may vary between 0.1 ms to 1000 ms. The output waveform 608 is shown in FIG. 6B. In the present embodiment of the invention, the output waveform 608 in represented by solid lines. The noise gate 206 is open during this period. In contrast, the output waveform 608 is a suppressed or attenuated by a pre-determined amount when the noise gate 206 is closed, which is shown in FIG. 6B with dashed lines. The above implementation is one exemplary representation, which is provided in FIG. 6A and FIG. 6B, those skilled in the art will appreciate that there are several variations to the output waveform and associated parameters that fall within the purview of the present invention.

Figure 7A:
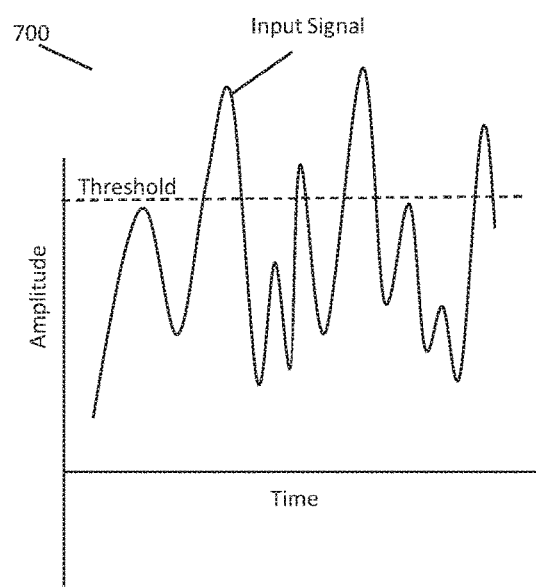
FIGS. 7A and 7B illustrate an input signal and an output signal of a dynamic processor, which is a noise gate in an embodiment of the present invention.
Figure 7B:
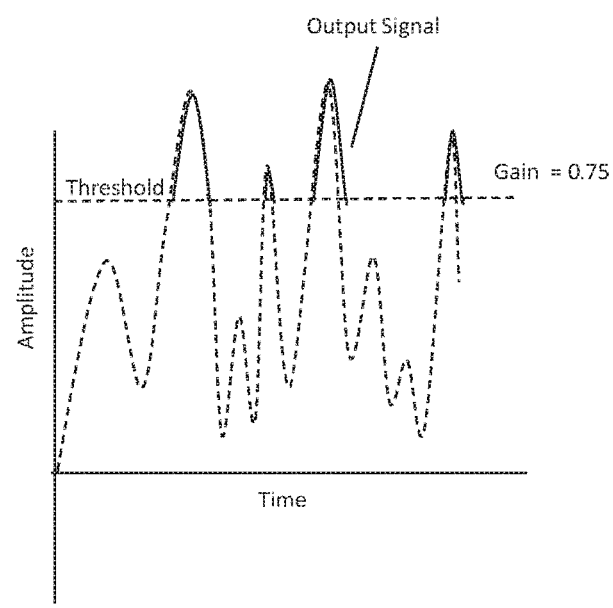

FIG. 7 illustrates the input audio signal and the output signal 202 at the noise gate 206 in one embodiment of the present invention. FIG. 7A illustrates the input audio signal 202 being applied to the noise gate 206. The input audio signal 202 is also passed on to the sidechain module 208A, which comprises a detector. The detector monitors that state of the input audio signal 202 to determine if the input audio signal 202 is above or below the threshold level. When the input audio signal 202 crosses above the threshold level, the input signal is passed on unaltered. However, when the input audio signal 202 is below the threshold, the input audio signal 202 is multiplied by a gain factor/gain reduction. This considerably reduces the input audio signal 202 since the gain factor is less than 1. The result is the output signal shown in FIG. 7B. By varying the gain factor value between 0 and 1, the amount of attenuation, which is applied to the output signal is controlled. Additionally, the analytics module 232 simultaneously controls the parameters associated with the noise gate module, for example, the threshold by passing parameters on to the noise gate 206.

In one embodiment of the present invention, the analytics module 232 may provide additional control on the signal gain to enhance the output signal. The analytics module 232 may adjust certain parameters based on an analysis of the input audio signal 202. The analytics module 232 does not interfere directly with the processing of the input audio signal 202 but controls one or more parameters for adjusting digital signal processing chain comprising other modules. The adjustment of parameters by the analytics module 232 controls the output signal to produce a better haptic experience for the user. In an embodiment of the present invention, all processes of the signal processing chain and all processes executed in the analytics module may operate in parallel. In another embodiment of the invention, some or all the processes may be implemented using virtualisation.

In one example, to clearly bring out the advantages of the present invention, the haptic processing module 200 has a digital signal processing chain comprising the pre-processor module 204, the dynamic processors 206 and 212, the sidechain 208A and 208B, the envelope follower module 214, the oscillator module 218, the resonance module 220, the mixer module 222, the low-pass filter 224, the limiter module 226, the bell filter module 228 and the actuator 230. The digital signal processing chain is the flow path of the input audio signal 202. The input audio signal 202 is also provided to the analytics module 232, which perform analytics on the input audio signal 202 but does not interfere with the signal flow. It only provides control parameters to the digital processing signal chain.

In some embodiments, the parameters that are controlled or adjusted by the analytics module 232 may be gain, amplitude, frequency, pitch, timbre, harmonic constitution, waveform, noise, or some other type of parameters.

In an alternate embodiment, the analytics module 232 may be optional. In yet another embodiment, the analytics module 232 may be partially implemented to control the parameters only at the noise gate module. In yet another embodiment, the analytics module 232 may be associated with the noise gate module 206 and the compressor module 212. In yet another implementation, the analytics module 232 may be associated with the noise gate module 206, the sidechain modules 208, the compressor module 212, and the envelope module 214. Various other implementations are possible using the analytics module 232 that allow control or adjustment of parameters associated with the input audio signal 202 to optimise the haptic experience of the user.

Figure 8A:
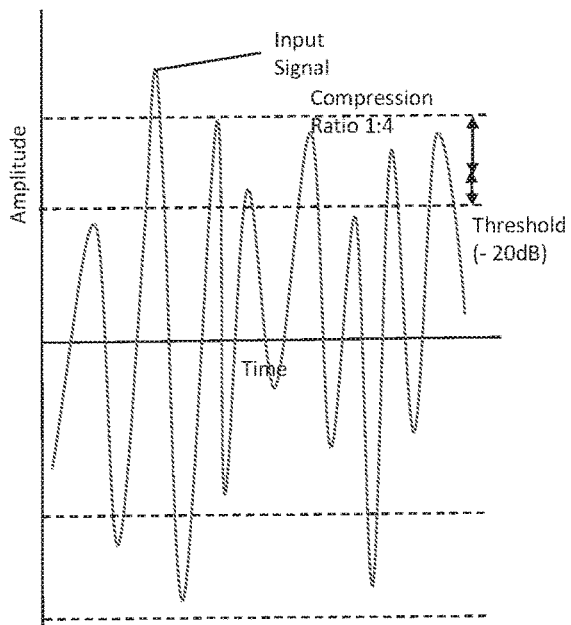
FIGS. 8A and 8B illustrate an input signal and an output signal of a dynamic processor, which is a compressor in an embodiment of the present invention.

FIG. 8 illustrates an input signal and an output signal at the compressor module 212 in an embodiment of the present invention. FIG. 8A illustrates the input audio signal 202 received from the noise gate 206 at the input of the compressor module 212. The main function of the compressor module 212 is to reduce the dynamic range of the input audio signal. The dynamic range of the audio signal is the difference between the quietest and the loudest parts in an audio signal. A sound can be defined by three perpetual qualities, that is, loudness, pitch, and quality (timbre) that corresponds to three physical qualities, which are amplitude, frequency and harmonic constitution or waveform.

The amplitude of the received input audio signal 202 at the compressor module 212 is reduced based on at least the compression ratio and/or the threshold value. The detector in the sidechain module 208B detects when the input audio signal 202 crosses the threshold value. When the received input signal crosses the threshold value, the amplitude of the input signal is multiplied by a gain factor/gain reduction derived from the compression ratio. FIG. 8A depicts a compression ratio of 1:4 in an exemplary illustration. The compression ratio and the threshold value may vary depending upon haptic processing requirements. In other embodiments, the compression ratio may be in the ratio of 1:2 to 1:100. In some embodiments, the threshold value may be between 0 dB to −20 dB.

Figure 8B:
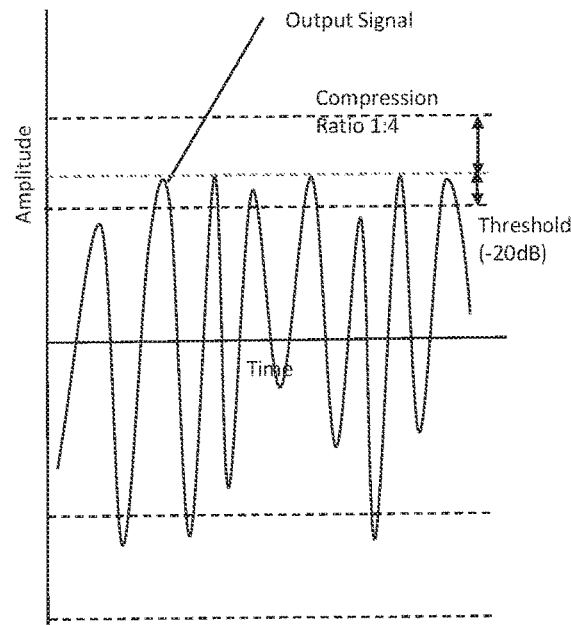

In a preferred embodiment of the present invention, the compression ratio may be set to 1:5. The threshold value may be set to between −20 dB to −36 dB. The output signal of the compressor module 212 is illustrated in FIG. 8B. FIG. 8A shows the output signal with a significant reduction in dynamic range by limiting the amplitude of the input audio signal above the threshold value.

Figure 9A:
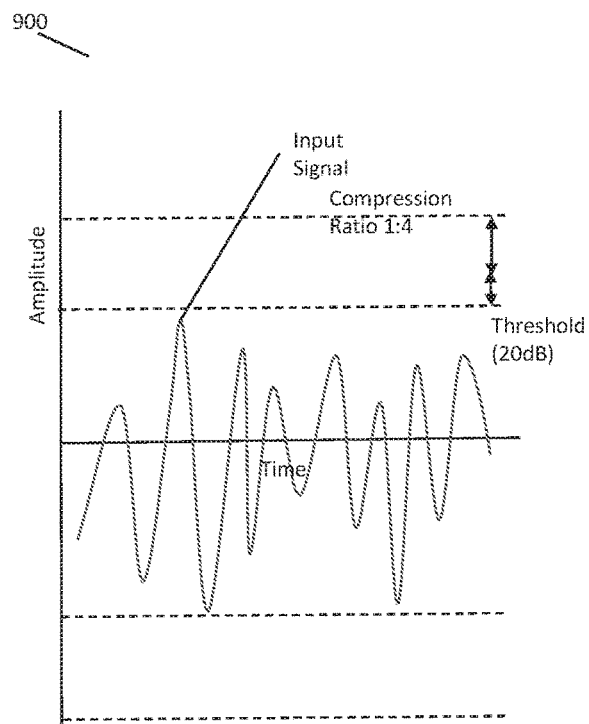
FIGS. 9A and 9B illustrate an input signal and an output signal of the compressor with gain in an embodiment of the present invention.
Figure 9B:
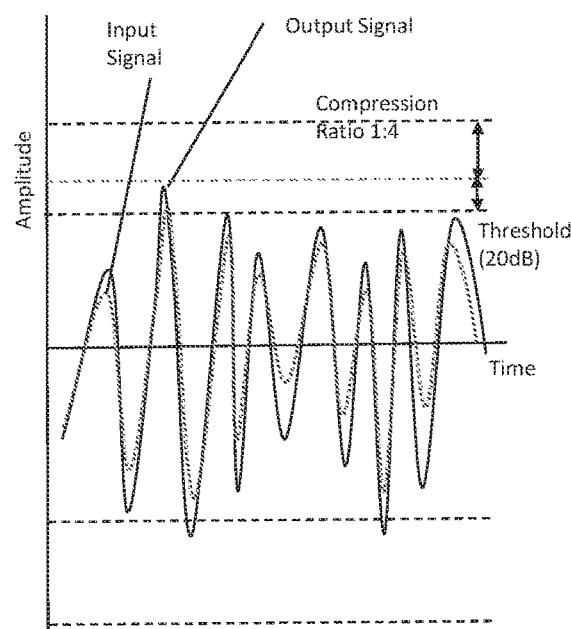

FIG. 9 illustrates a gain and a reduced dynamic range at the compressor in an embodiment of the present invention. The analytics module 232 may adjust the gain applied to the input audio signal 202 by providing parameters in real time to control the gain of the compressor module 212. FIG. 9A shows the output signal of the compressor module 212 in absence of the analytics module 232. FIG. 9B depicts the output signal of the compressor module 212 when the control parameters are applied by the analytics module 232. The analytics module 232 provides control parameters continuously in real time. The resulting signal (output signal) is compressed to reduce its dynamic range along with a gain factor applied to it. In some embodiments, the gain factor may vary based on various parameters such as but not limited to amplitude, frequency, pitch, timbre, harmonic constitution, waveform, and noise levels of the input audio signal.

In an alternate embodiment, multiple parameters may collectively determine the gain factor to be adjusted by the analytics module 232 during the processing of the audio signal in the compressor module 212.

Figure 10:
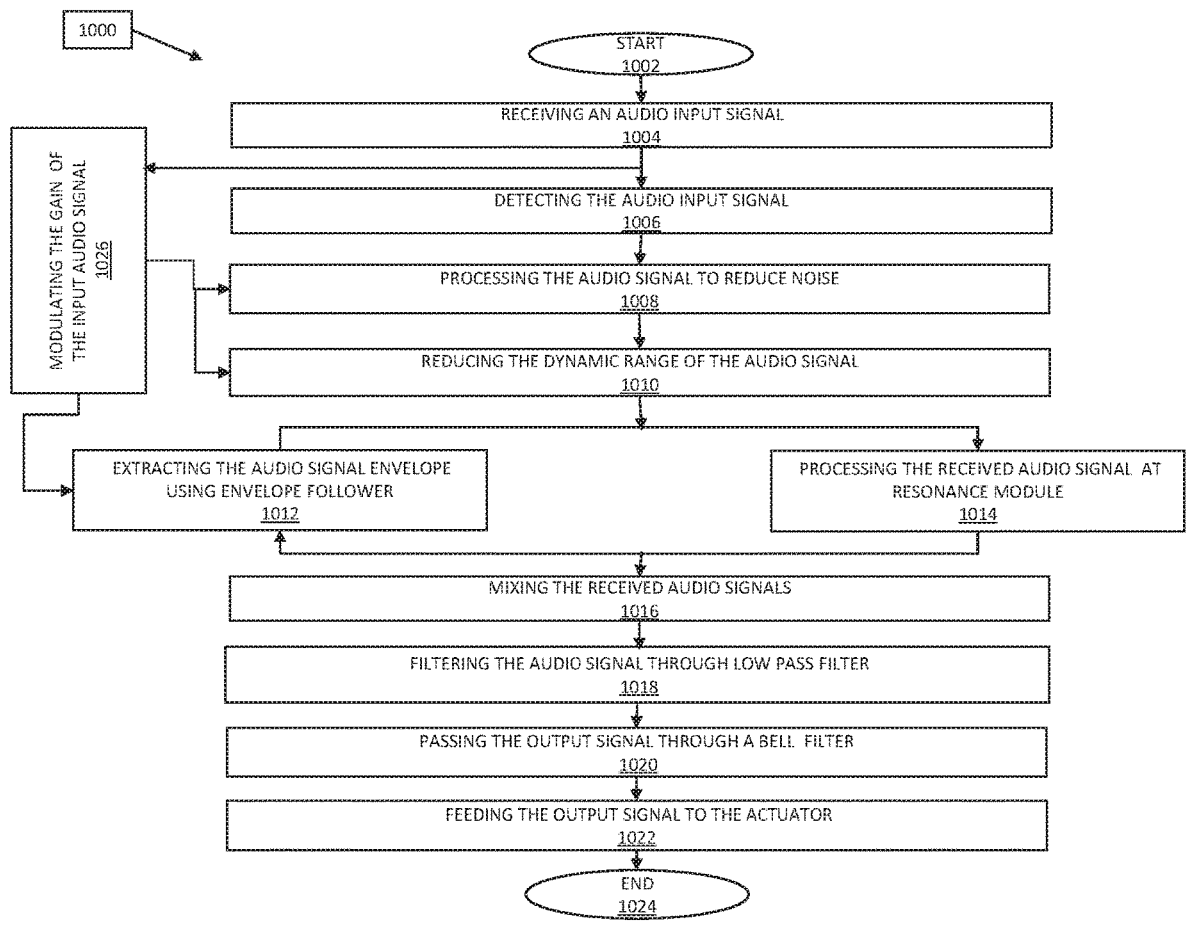
FIG. 10 illustrates a process flow of the haptic processing module in an embodiment of the present invention.

Referring to FIG. 10, the flow diagram of the haptic processing module 200 is provided in an embodiment of the present invention. The process 1000 starts at step 1002. At step 1004, the process 1000 receives a digital audio signal for generating a haptic output. The input audio signal received at step 1004 may be a digital or an analog audio signal. In one embodiment of the present invention, the process 1000 may receive digital signal data. The received analog signal is converted to a digital signal using an analog to digital convertor before passing it on to step 1006. In another embodiment, the process 1000 may receive digital audio data. When the input audio signal is a digital signal no analog to digital convertor is required. At step 1006, the audio signal is processed by the signal detection module to probe the presence of the input audio signal. If the input audio signal is sensed by the signal detection module, the haptic processing module 200 is kept in power ON state by the detection module, else it enters a power saving mode. In addition, if the signal is detected only at the output, the detection module waits for a pre-defined period before entering the power saving mode. It may be appreciated that the signal detection module may generate a haptic signal for at least a few seconds even if there is no input audio signal. This is due to the presence of an audio signal in the haptic processing module currently being processed. The amount of delay before the detection module may turn off the power supply to the haptic processing module is pre-set or hard coded. In an embodiment of the present invention, the parameters associated with delay time may include but are not limited to compensation time for delay, delay due to electronic circuitry, amount of noise in the audio signal, quality of the audio signal, the strength of the audio signal and the like.

At step 1008, the received signal is processed to reduce the noise in the input audio signal. A sidechain module comprising a detector and a threshold is utilised for achieving a reduction in noise in the input audio signal. The input audio signal is passed simultaneously on to the sidechain module and the noise gate module. The sidechain module has a detector that detects whether the input audio signal is above or below the threshold value. When the input audio signal is above the threshold value, the noise gate is open, and the input signal passes through it un-attenuated. However, when the input audio signal is below the threshold value, the input audio signal is attenuated by multiplying the input signal with a gain factor. In some embodiments, the gain factor may be between numeric values 0 and 1, for example, 0.3, 0.75, 0.89 and the like. Additionally, the input audio signal at the noise gate may also be dynamically adjusted by the analytics module. The analytics module may adjust the gain of the input audio signal by monitoring the amplitude peaks.

At step 1010, the dynamic range of the audio signal is reduced. The reduction in dynamic range of the signal is controlled by the sidechain module and the analytics module. The sidechain module includes a detector and a threshold module. The threshold module is utilised to set the threshold value. The audio signal received from step 1008 is simultaneously passed on to sidechain module and the compressor module. In addition, the analytics module may dynamically modulate the gain of the input audio signal to optimise the haptic output signal. The input audio signal is passed on to the sidechain module, which detects whether the input audio signal is below or above the threshold value. If the input audio signal is below the threshold value, the detector indicates to the compressor to pass on the entire input signal without any compression. However, if the input audio signal is above the threshold value, the detector sends an indication to the compressor to apply compression to the input signal. The amount of compression that may be applied to the input signal is decided on the basis of the compression ratio. In some embodiments of the present invention, the amount of compression applied is determined by different parameters including but not limited to amplitude, phase, and frequency of the input signal. The analytics module also dynamically adjusts the gain of the input signal. In some embodiments, the analytics module may receive the input audio signal. The analytics module may monitor the input audio signal for 10 seconds to measure if the peak of the input signal is below the 3 dB.

The processed audio signal from the compressor module is then passed on through an envelope detector module at step 1012, which extracts the signal envelope of the received input signal. The envelope detector module produces a low frequency waveform from the high frequency waveform and also converts the bipolar signal into a unipolar signal. This low frequency waveform is the exact replica of the high frequency waveform. The enveloped signal produced by the envelope detector module is modulated using a fixed frequency oscillator module. In some embodiments, the fixed frequency oscillator module may be tuned to the resonant frequency of an actuator. A part of the processed audio signal from step 1010 is simultaneously passed on to the resonance module. At step 1014, the low frequency components produced by membrane or string musical instruments are amplified by the resonance module. In one example, the low-frequency components that may have been attenuated and/or suppressed during mixing of different audio frequencies are enhanced to produce a haptic signal. In another example, the string or the membrane generated frequencies may be added to the received audio signal to produce a haptic signal for enhanced user experience.

At step 1016, the audio signal received from different sources/modules is mixed in a mixer module. An output signal from the dry/wet module (not shown in the FIG. 10) and the audio output signal from steps 1012 and 1014 are mixed to produce the haptic output signal. Mixing of audio signals ensures that an optimised haptic signal response is produced by the actuator. For example, due to high intermixing of frequencies, it might be difficult to extract the right set of frequencies for generation of the haptic signal. In another example, due to a large high frequency component, most of the low frequency components also get eliminated during audio signal processing. In yet another example, if the audio signal input is over processed, the haptic signal to be derived from the input audio signal is also filtered out during processing at various modules. The mixing of signals produces the right quality of signal for generating a haptic response.

The output signal of step 1018 is passed on to the low pass filter for removing any residual high frequency components. It also eliminates unwanted signals that do not contribute to the haptic signal output. The audio output from 1016 is subsequently processed at step 1020 through at least one filter, e.g., the bell filter to increase the frequency response of the haptic signal in and around the resonant frequencies of the fixed frequency oscillator. At step 1022, the actuator receives the output signal to produce a haptic response to a user. The process 1000 ends at step 1024.

Figure 11:
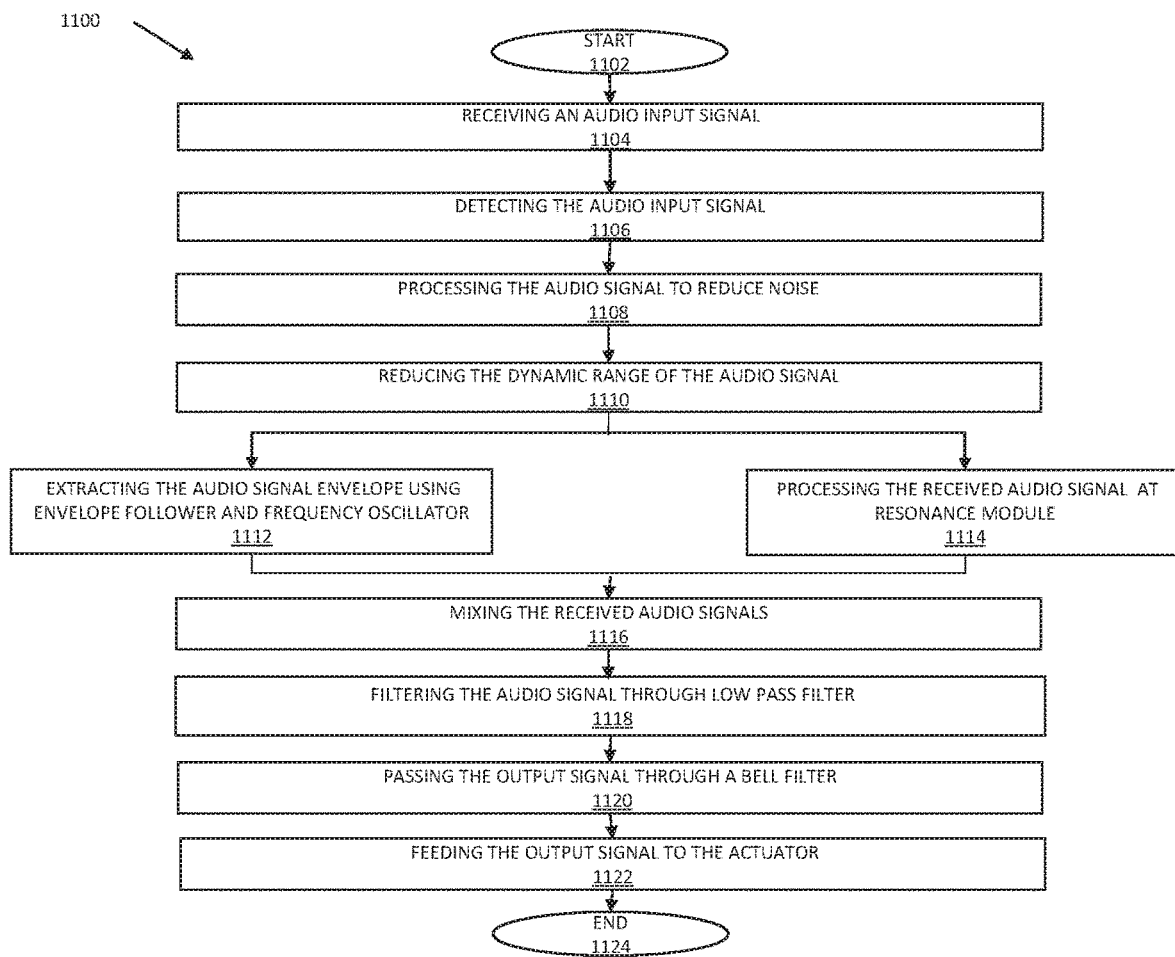
FIG. 11 illustrates a process flow of the haptic processing system in another embodiment of the present invention.

In another embodiment of the present invention, FIG. 11 depicts the flow chart 1100 of the digital signal processing chain without an analytics module. The process 1100 is initiated at step 1102. At step 1104, the process 1100 receives an audio input signal. At step 1106, the detection of a signal at the input and the output of the process 1100 is performed. If no input or output signal is detected, the haptic processing module may enter battery saving mode. On the other hand, if a signal is present either at the input or the output, the haptic processing module remains in power ON state. At step 1108, the input audio signal is processed by the noise gate with a sidechain module to eliminate noise in the input audio signal. The sidechain module associated with the noise gate module includes a detector and a threshold value. The detector detects the signal when it falls above or below the threshold value. When the input audio signal is above the threshold value, the entire input audio signal is passed on by the noise gate module. However, when the input audio signal falls below the threshold value the noise gate is closed to attenuate the input signal by an attenuation ratio or gain ratio/gain reduction. The processed output from the noise gate is passed on to step 1110, where the received signal is compressed to reduce its dynamic range by a compressor module. The processed output of step 1110 is simultaneously passed on to steps 1112 and 1114. At step 1112, the high frequency signal is reproduced into a low frequency signal. The low frequency signal is the exact replica of the received input signal with a reduced frequency. Further, this low frequency signal is modulated with a fixed frequency oscillator to generate a modulated output signal. Simultaneously, at step 1114, the received signal is analyzed for low frequency components produced by string or membrane instruments; these low frequency components might have been suppressed due to mixing of different audio frequencies. Additionally, these low frequencies may be recreated based on audio fingerprints present in the received signal. At step 1116, the output signals from steps 1112 and 1114 are mixed. In addition, step 1116 receives an input from a pre-set that comprises a dry/wet signal ratio. The output signal from step 1116 is passed on through a low pass filter at step 1118. At step 1120, the output from the low pass filter is passed on through a bell filter to accommodate adequate response of frequencies near and around the resonant frequency of the actuator. At step 1122, the output signal is fed to the actuator for producing a haptic response. The process 1100 ends at step 1124.

Figure 12:
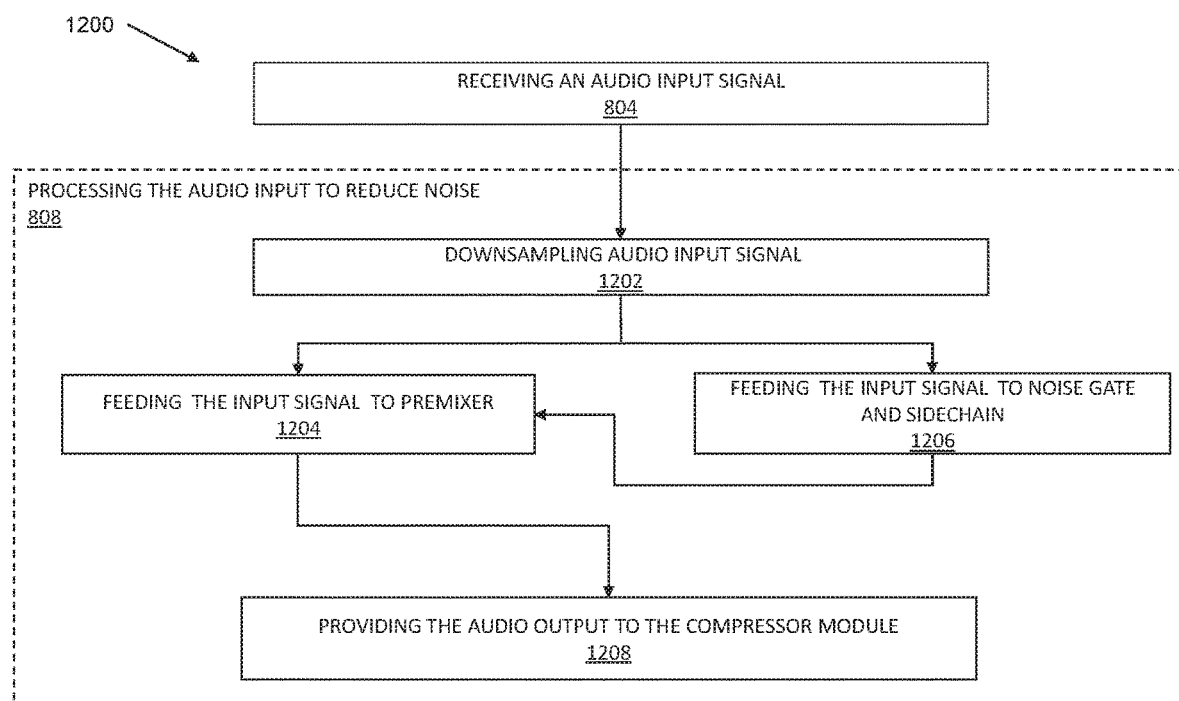
FIG. 12 illustrates the process flow of a noise gate of the haptic processing system in an embodiment of the present invention.

Referring to FIG. 12, a flow chart for reducing noise in input audio signal at the noise gate is provided. The process 1200 is a detailed flow chart of the processes performed in step 808. The process 1200 starts by receiving the audio input signal at step 804. The audio signal input of step 804 is down sampled to an appropriate level to reduce unwanted information in the input audio signal to adapt the signal for haptic processing. The down sampling of the signal may include passing the input audio signal on through a digital to analog convertor if the received signal is an analog signal. At step 1204, the input audio signal is directly fed to the pre-mixer module. At step 1206, the down sampled audio signal is processed by the noise gate module and the sidechain module to reduce noise components in the input audio signal. The sidechain module comprises a detector and a threshold value. The sidechain module is fed with an input audio signal, a threshold value is set, and the detector ascertains if the input signal is below or above the set threshold value. When the input signal is above the threshold value, the noise gate opens to pass on the input audio signal without any attenuation. In case when the input audio signal is below the threshold, the noise gate attenuates the input signal by a gain factor/gain reduction, which may be between 0 and 1 depending at least on the level of the noise present in the input signal.

In another embodiment, the sidechain module 208A may include a low pass filter to pre-filter unwanted frequencies. The output of step 1206 is passed on as an input to step 1204. The ratio of the audio input signal to the output signal of step 1206 is referred to as the "dry/wet signal ratio". In an embodiment of the present invention, the pre-mixing ratio may be fixed and hard coded. Alternatively, the pre-mixing ratio may be selected by a user from a set of available pre-set values using a rotary or a touch interface. The output from step 1204 is provided to step 1208.

Figure 13:
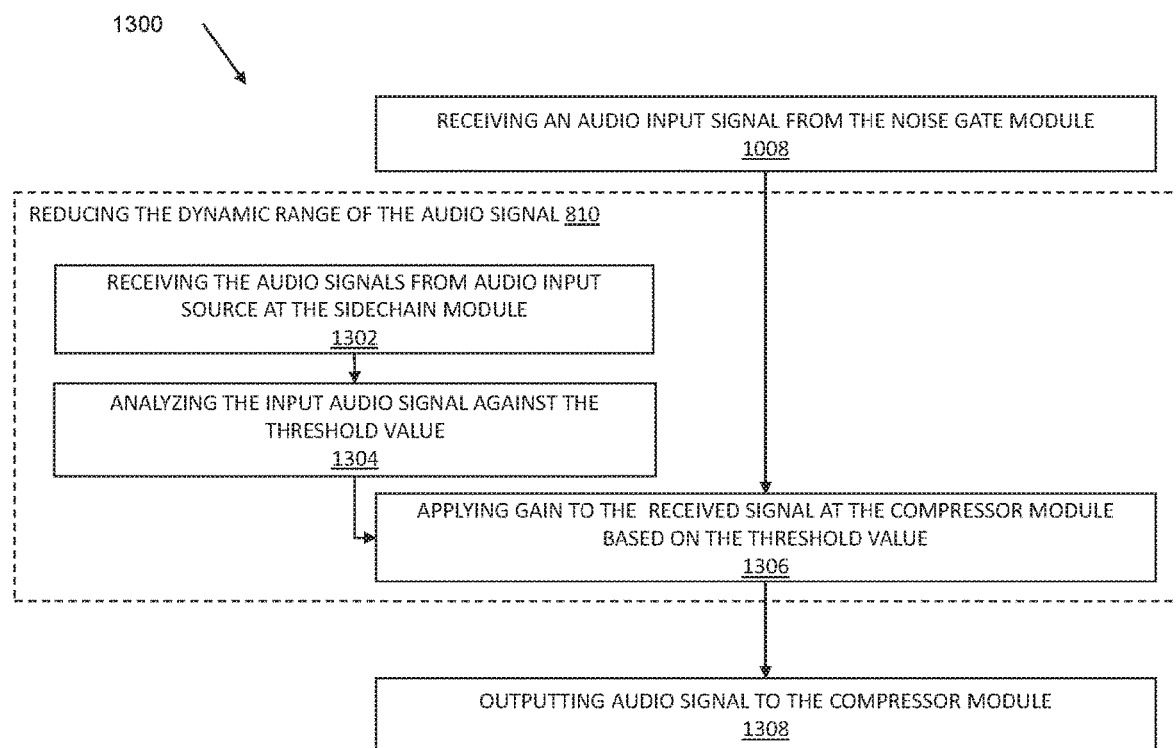
FIG. 13 illustrates the process flow of a compressor of the haptic processing system in an embodiment of the present invention.

Referring to FIG. 13, the process 1300 executed under step 810 associated with the compressor module is illustrated in detail in an embodiment of the present invention. The process 1300 receives the processed signal from the noise gate module 1008. The process 1300 receives the input audio signal at step 1302 from the sidechain module. The sidechain module comprises a detector and a threshold module enabled to set a threshold value. At step 1302, a threshold value is fixed. Subsequently, the input audio signal is monitored against the threshold value by a detector. The detector continuously detects the level of the input audio signal against the threshold value to adjust the gain in the compressor module. When the input audio signal is below the threshold value, no compression is applied. On the contrary, when the input audio signal is above the threshold value, compression is applied to the received signal at the compression. The compression applied is determined by the compression ratio, which may vary from 1:2 to 1:10 depending upon various parameters associated with the input audio signal. The ratio determines the amount of gain reduction applied to the input signal, for example, a ratio of 4:1 means that if the input level is 4 dB over the threshold, the output signal level is reduced to 1 dB over the threshold. The gain and output level has been reduced by 3 dB. Finally, at step 1308, the output signal from the compressor is generated.

Figure 14:
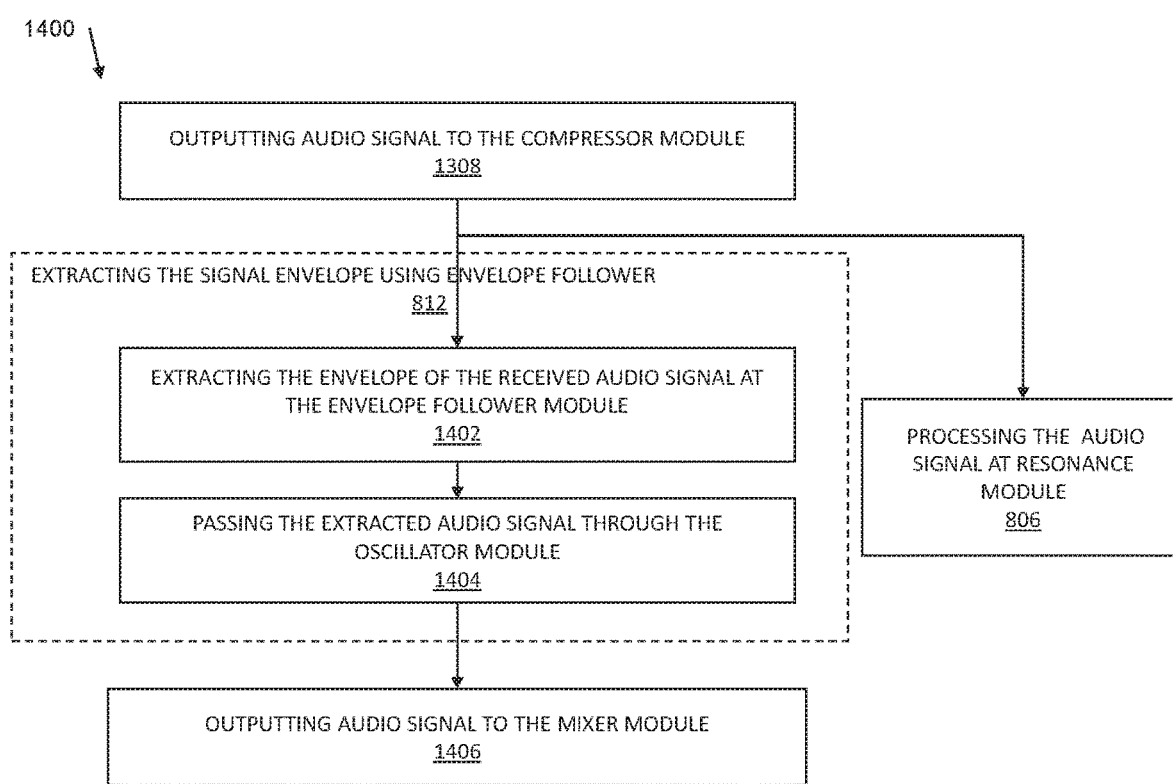
FIG. 14 illustrates the process flow of an envelope follower of the haptic processing system in an embodiment of the present invention.

FIG. 14 illustrates details of the process occurring in step 812 associated with the extraction of the signal by the envelope follower module and the modulation of the extracted signal. At step 1108, the output signal from the compressor module is fed to the envelope follower module. The envelope follower module performs the extraction of the audio signal from the output signal received at the compressor module. At step 1402, the high frequency signal is converted to a low frequency signal by the envelope follower module. The output from the envelope follower module is provided to a fixed frequency oscillator at step 1404. The audio output of the compressor module is also simultaneously provided to the resonance module as previously discussed in process 800 in FIG. 8. The fixed frequency oscillator may be tuned to near or around the resonant frequency of the actuator. In a preferred embodiment, the fixed frequency oscillator is tuned to the resonant frequency of the actuator. The resonance module amplifies the suppressed low frequency components in the audio signal. In addition, the resonance module is entrusted to supplement the frequencies that are mixed together within the audio signal and will produce a haptic signal for better user experience. Moving further, the output of the resonance module is fed to the input mixer module.

Figure 15:
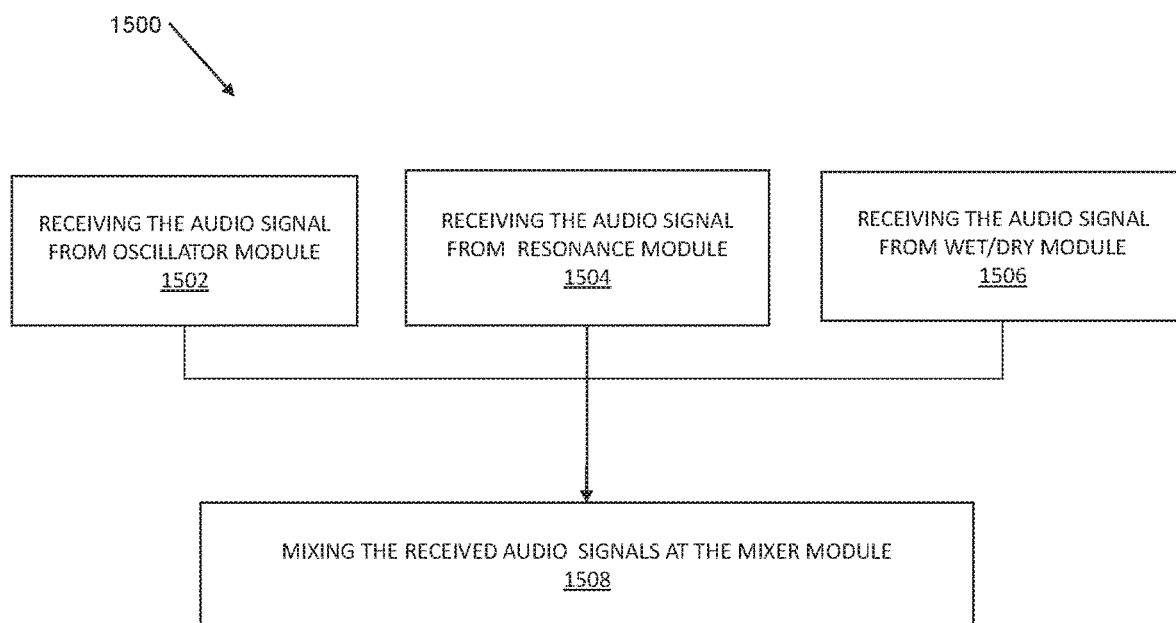
FIG. 15 illustrates the process flow of a mixer of the haptic processing system in an embodiment of the present invention.

Referring to FIG. 15, a flow chart illustrates the process 1500 associated with the pre-mixer module in an embodiment of the present invention. The process 1500 receives an input audio signal 1502 from the fixed frequency oscillator module. This signal is the ratio of the "dry/wet" signal. At step 1504, the processed signal from the resonance module is received. Additionally, at step 1506, the processed signal from the preset module is received, which is a mixture of the dry/wet signal ratio in a pre-determined proportion. It may be noted that all these signals are received simultaneously and mixed in a pre-determined proportion in step 1508 to produce an output signal, which may be fed to the low pass filter.

Figure 16:
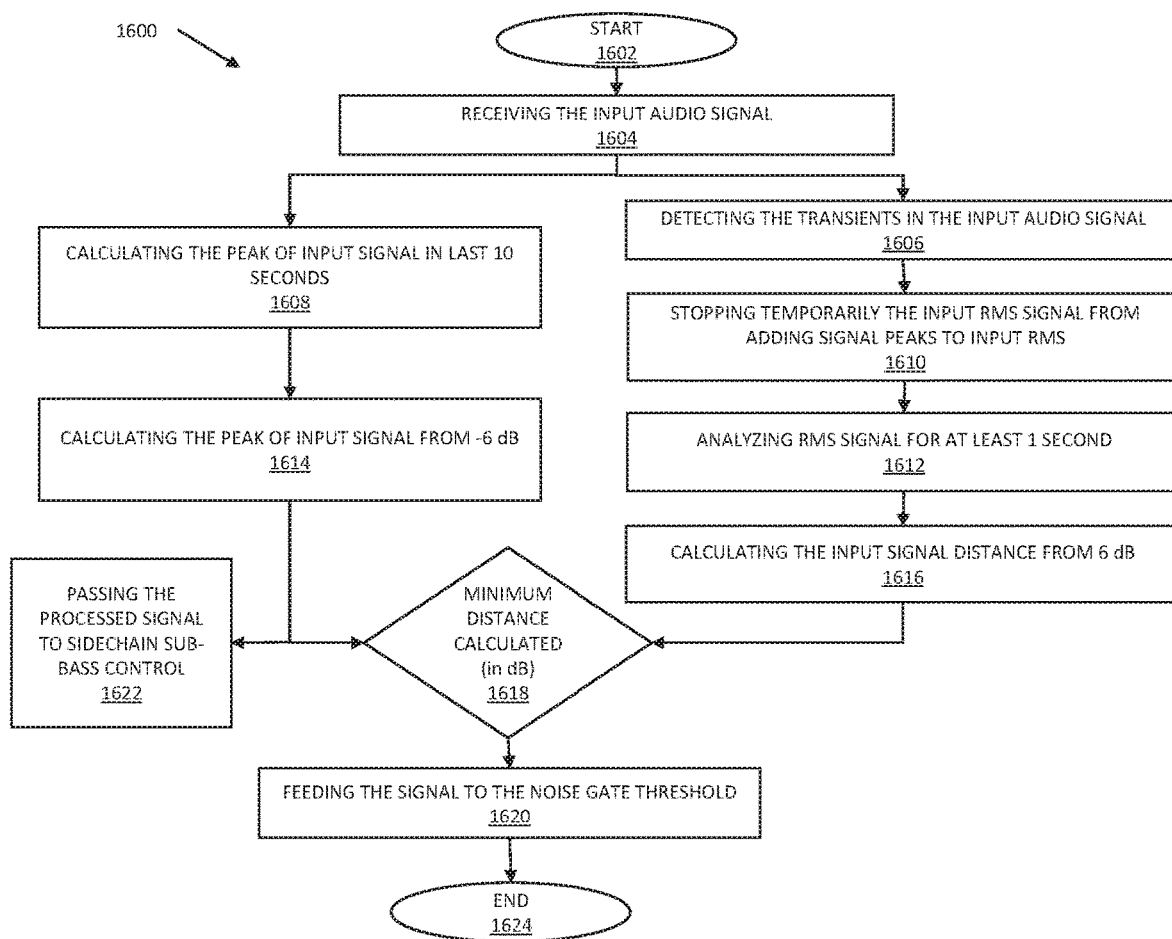
FIG. 16 illustrates the process of detecting a transient in the analytics module of the haptic processing system in an embodiment of the present invention.

FIG. 16 shows the process at 1600, illustrating the input signal processing within the analytics module in an embodiment of the present invention. The process starts at 1602. At step 1604, the process 1600 receives an input audio signal, which may be a digital signal. The received input signal is simultaneously passed on to steps 1606 and 1608. At step 1606, the received input audio signal is passed on to a fast envelope follower and a slow envelope follower to determine the transients in the input audio signal. In other embodiments, various techniques well known in the art for transient detection may be utilised for determining the presence of transients in the input audio signal. Simultaneously, at step 1608, the input audio signal is analysed to determine the signal peak. The signal peak may be analysed for a specific time of the input audio signal. In a preferred embodiment, the specified time is 10 milliseconds. In other embodiments, the specified peak may be determined using different parameters including but not limited to amplitude, frequency and pitch and may vary from 10 milliseconds to 60 milliseconds.

At step 1610, the Root Mean Square (RMS) values of the input audio signal are continuously received. The RMS values may be calculated at step 1602 or may be calculated at step 1410 itself. Alternatively, they may be received from other modules.

Moving further to step 1610, when transients are detected, the analytics module temporarily stops adding peak signal values determined at step 1608 to the RMS signal values. The RMS value is set to Zero. At this point, the analytics module initiates the analysis of the input RMS signal for at least one second at step 1614. At step 1616, the analytics module calculates and adds 6 decibels to the RMS values obtained from the input audio signal. The final set of input audio signal values may be temporarily stored in memory associated with the analytics module.

Parallelly, the peak signal values calculated at step 1614 are passed on to step 1614 for calculating the difference between the peak signal value (in decibels) and the constant 6 dB gain. The signal values hence obtained are stored temporarily in a buffer in memory.

At step 1618, the minimum value of the two outputs stored temporarily in the buffer memory, that is, the first one obtained at step +6 dB distance of the RMS signal values and the second one obtained at step 1614 by subtracting a constant value, e.g., 6 dB distance from the peak signal values, is determined. At step 1620, the minimum value obtained after comparing the first and the second values is passed on to the noise gate for dynamically controlling the threshold value.

In other embodiments of the present invention, the addition or subtraction of a constant value, e.g., 6 dB distance may vary from −0 dB to −20 dB depending upon the haptic processing required. Furthermore, the decibel constant value of 6 dB may depend upon signal noise, amplitude, frequency, frequency of occurrence of transients or some other parameters. Similarly, the subtraction of a constant value, e.g., 6 dB distance from signal peak values may vary from 0 dB to −20 dB depending upon signal processing requirements. In other embodiments, the subtraction of a constant value, e.g., 6 dB or −6 dB distance from signal peak values may depend upon amplitude, frequency and noise levels of the input audio signal.

The signal output from step 1614 is also passed on to the sidechain module to control the sub-bass at step 1616. In an embodiment of the present invention, the sub-bass module may be a part of the sidechain module. Alternately, it may be manifested as a separate module. The process ends at 1624.

Figure 17:
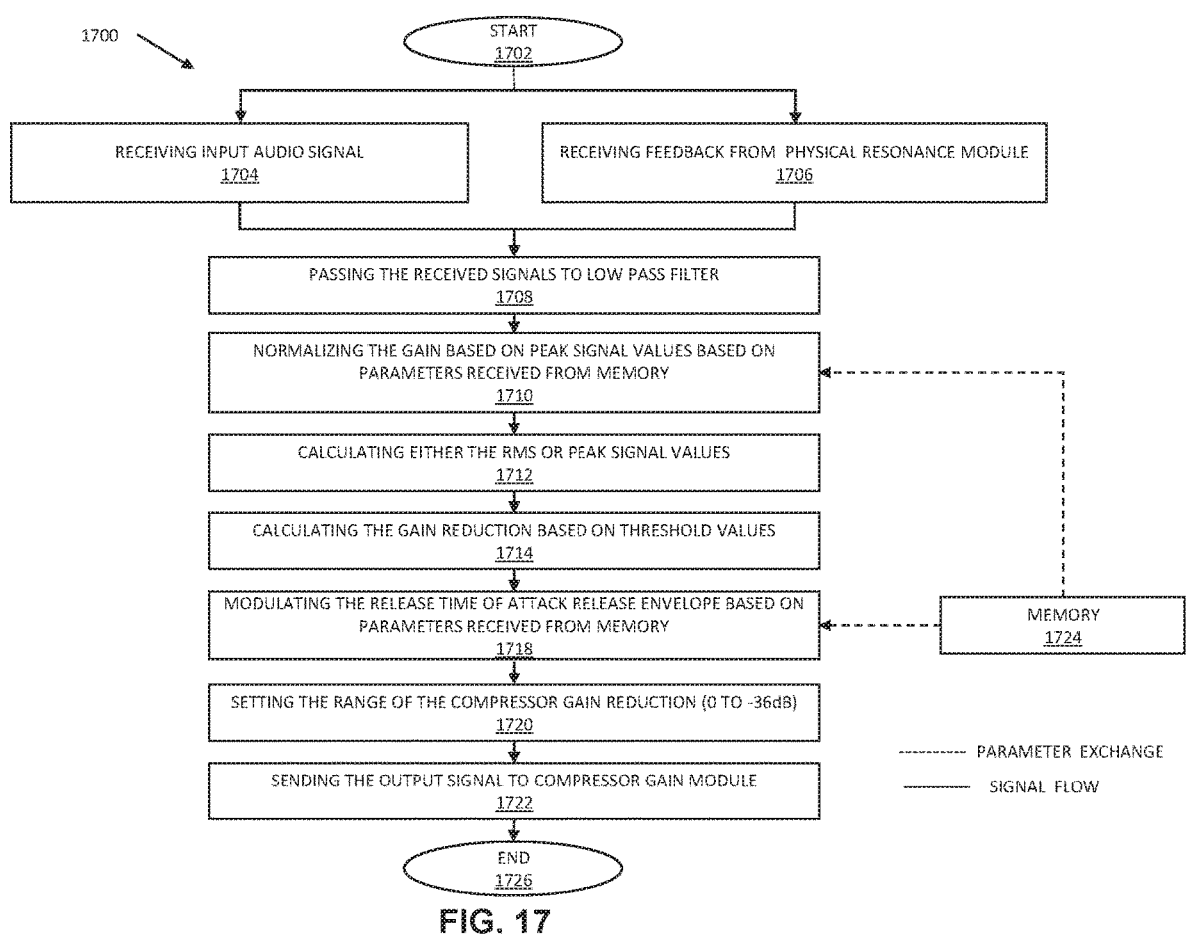
FIG. 17 illustrates a compressor control process of the haptic processing system in an embodiment of the present invention.

Referring to FIG. 17, a process of the compressor signal control 1700 is provided in an embodiment of the present invention. The process 1700 also depicts parameter control from other processes during execution. The process 1700 starts at 1702. At step 1704, the process 1700 receives an input audio signal. The input audio signal may be a digital signal. Simultaneously, the process 1700 also receives a feedback signal from the resonance module 1706. At step 1708, the received input audio signal and the feedback signal from the physical resonance modules are added and passed on to a low pass filter. The low pass filter passes on the low frequencies in the received signal. At step 1710, the gain of the compressor module is normalised based on the peak signal values received from the memory. Subsequently, once the gain of the compressor module has been normalised, the process 1700 at step 1712 calculates either the RMS signal values or the peak signal values of the received audio input signal. In another embodiment, the process 1700 at step 1712 the calculates either the RMS signal values or the peak signal values of the received audio input signal. Further, at step 1714, the process 1700 calculates the gain reduction to be applied to the compressor module based on the threshold values. The threshold values may be provided by the sidechain module associated with the compressor module. At step 1718, the process 1700 receives parameters, for example, an absolute value or a relative value from memory. For example, an absolute value may be based on the received parameters; the process 1700 modulates the release time of the attach release envelope follower associated with the compressor module. In some embodiments, the compressor module may have one or more envelope followers, which may include an attack release envelope follower, an attack release hold envelope follower and the like. At step 1720, the process 1700 may set the gain reduction to be applied to the compressor. Finally, at step 1722, the output signal is passed on to the compressor gain control module. The process 1700 may terminate at step 1726.

Figure 18:
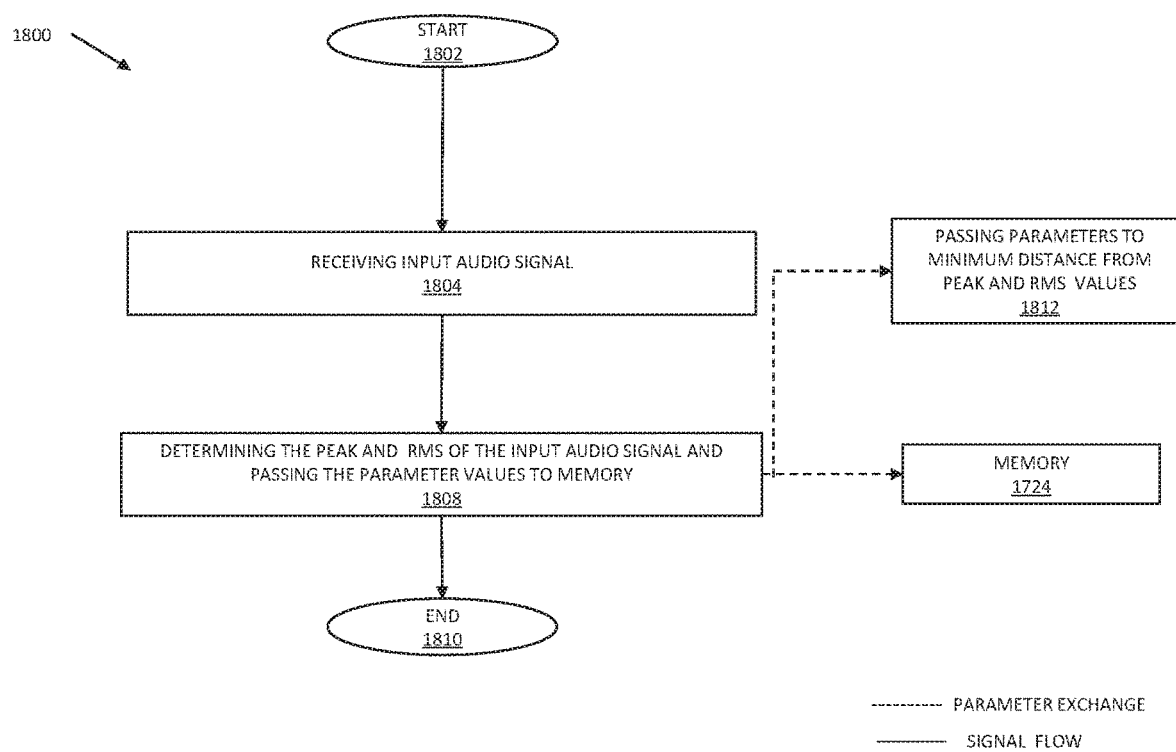
FIG. 18 illustrates the process of peak detection in the analytics module of the haptic processing system in an embodiment of the present invention.

Referring to FIG. 18, a process of the peak signal detection in 1800 is provided in an embodiment of the present invention. The process 1800 also depicts an implementation of the parameter control from other processes during execution. The process 1800 is initiated at step 1802 and immediately moves to step 1804. At step 1804, the process 1800 receives an input audio signal. The peak values and the RMS values of the input audio signal are determined at step 1808 and are passed on to the memory. In addition, at step 1808, the peak values and the RMS values are also passed on for the calculation of the minimum value obtained by comparing (a) the peak value (in dB) subtracted from 6 dB and (b) the RMS values (in dB) added to 6 dB. The minimum of the two values is calculated and passed on to step 1812. Additionally, the calculated values are stored in a buffer or memory, for example, 1724, to be passed on to other processes. The process 1800 terminates at step 1810.

Figure 19:
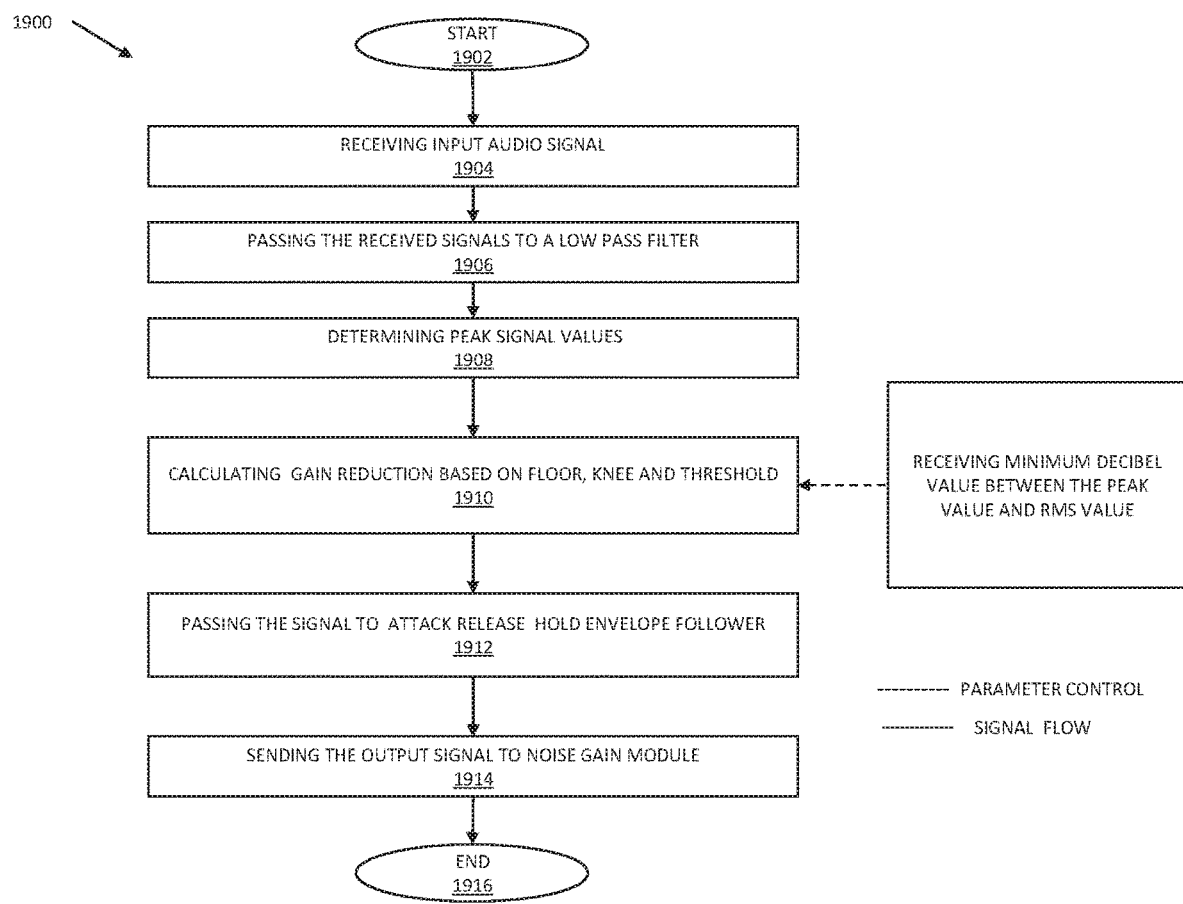
FIG. 19 illustrates a noise gain control process in the analytics module of the haptic processing system in an embodiment of the present invention.

FIG. 19 illustrates a process of the noise gate signal control 1900 in an embodiment of the present invention. The process 1900 also depicts an implementation of the parameter control from other processes during execution. The process 1900 starts at step 1902 and immediately moves to step 1904. At step 1904, the received audio input signal is passed on to a low pass filter to remove high frequency components. In a preferred embodiment, the low pass filter may have a cut-off frequency of 200 Hz. However, in other embodiments, the cut-off frequency of the low pass filter may be between 80 Hz to 250 Hz. The signal received from the low pass filter is analysed to determine the peak signal values at step 1908. At step 1910, the peak values extracted from the signal are utilized to calculate the gain reduction based on at least one parameter. In addition, step 1910 also receives control parameters from step 1612 comprising minimum decibel values derived by comparing the two values, that is, (a) subtracting the peak value (in decibels) from 6 dB and (b) RMS values (in decibels) obtained by adding from 6 dB. In some embodiments, the parameters may be floor, knee and threshold or some other parameters. In a preferred embodiment of the present invention, the parameters utilised for calculating the gain reduction are based on floor, knee and threshold. Once the gain reduction has been calculated, it is passed on to the attack release hold envelope follower at step 1912. Subsequently, the output of the attack release hold envelope follower is sent to the noise gate module at step 1914. The process terminates at step 1916.

Figure 20:
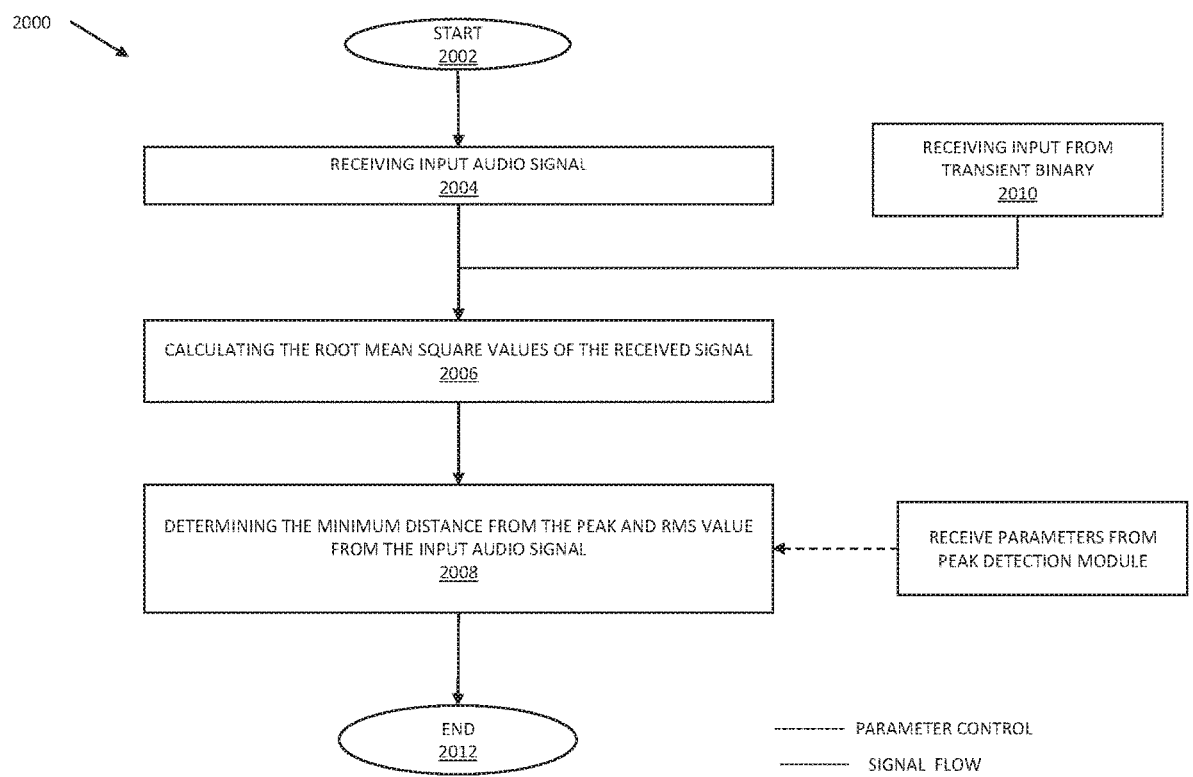
FIG. 20 illustrates the process of Root Mean Square (RMS) detection and flow in the analytics module of the haptic processing system in an embodiment of the present invention.

Referring to FIG. 20, a process of the RMS signal detection 2000 is provided in an embodiment of the present invention. The process 2000 also depicts an implementation of the parameter control from other processes during execution. The process 2000 is initiated at step 2002 and moves immediately to step 2004. At step 2004, the process 2000 receives the input audio signal. The input audio signal is mixed with the input signal received from the transient binary 2010. The transient binary is a binary value, which is either 0 or 1. The root mean square values of the input audio signal are calculated at step 2006. The root mean values calculated at step 2006 are passed on to step 2008. Step 2008 also receives parameters from peak detection module. In some embodiments, the received parameters may be implemented by function calls, procedures, subroutines or by referencing memory or by some other type of parameter exchange mechanism. Further at step 2008, a minimum distance of the two values that are (a) peak values subtracted from 6 decibels and (b) RMS values added with 6 decibels, respectively, is determined. The calculated minimum value in decibels is utilised to feed other processes as described herein and elsewhere. The process 2000 terminates at step 2012.

Figure 21:
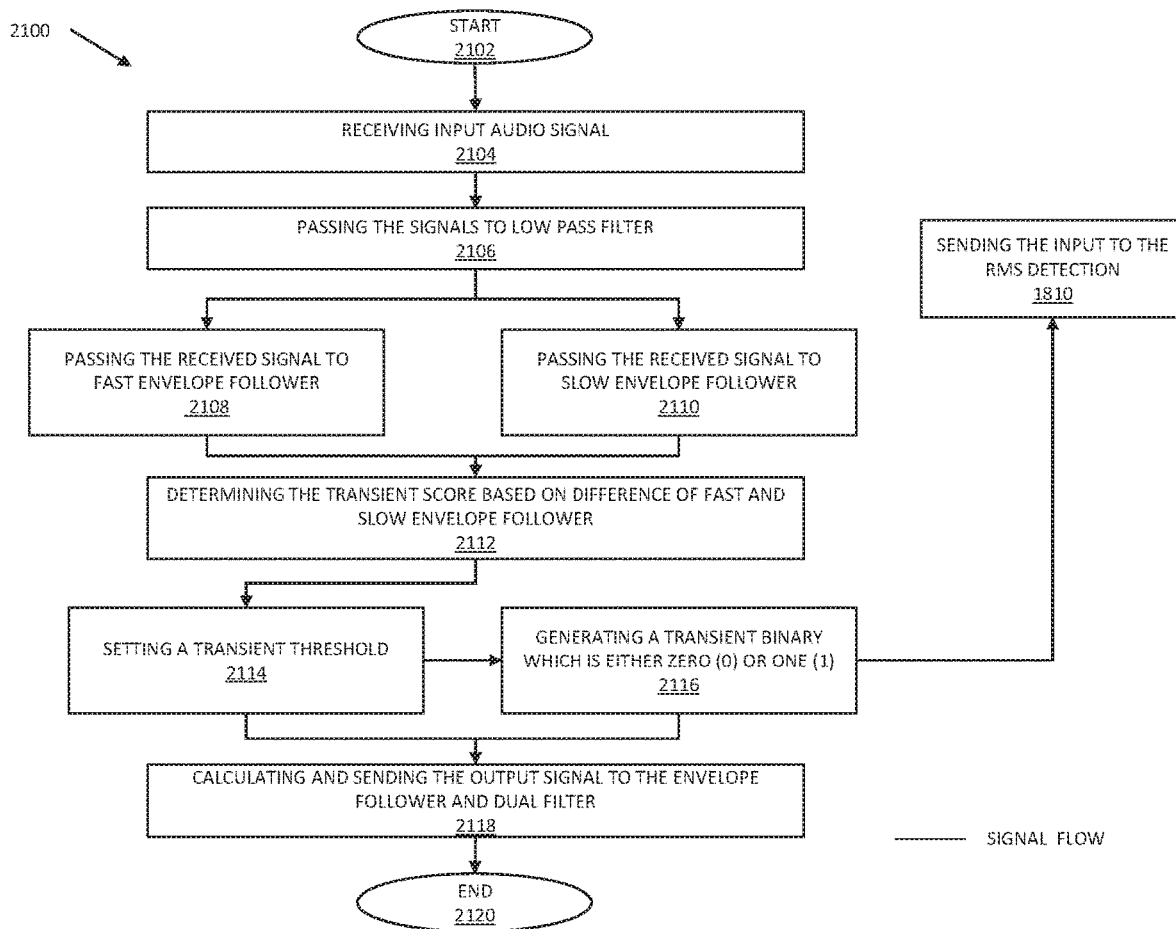
FIG. 21 illustrates the process of transient detection in the analytics module of the haptic processing system in an embodiment of the present invention.

Referring to FIG. 21, a process of the peak signal detection in 2100 is provided in an embodiment of the present invention. The process 2100 is initiated at step 2102 and immediately moves to step 2104. At step 2104, the process 2100 receives the input audio signal. The input audio signal is passed on through a low pass filter at step 2106. The output from the low pass filter is provided simultaneously to a fast envelope follower at step 2108 and a slow envelope follower at step 2110, respectively. At step 2108, the decibel value of the output signal of the fast envelope follower and the slow envelope follower is calculated. The difference between the decibel values of the fast envelope follower and the slow envelope follower is determined to arrive at the transient score at step 2112.

In some embodiments, the difference of the fast envelope follower and the slow envelope follower in decibels represents the transient score. Alternatively, the transient score may be determined by multiplying the difference of the fast envelope follower and the slow envelope follower in decibels with a constant value. At step 2114, a transient threshold level is defined. A pre-set module may be utilised for setting up the transient threshold level. In another embodiment, a predictive and intelligence module may dynamically control the transient threshold level. In yet another embodiment, the predictive and intelligence module may implement learning algorithms to predict in advance the optimised transient threshold level. In yet another embodiment, the transient threshold level may be determined based on different parameters of the received signal such as frequency, harmonics amplitude and phase.

At step 2116, the transient binary is calculated based on the transient score. The transient score is analysed against the transient threshold level; when the transient score is above the transient threshold value the transient binary is set to 1, else it is set to 0. The transient binary is a digital value. At step 2118, the transient binary is multiplied with the transient score to determine the transient output, which is provided to the dual filter to allow transients to pass on through the dual filter. In an embodiment, the dual filter is a combination of two low pass filters, a first low pass filter 1 and a second low pass filter 2. The transient output is provided to the first low pass filter 1 with cut-off frequency f1 and to the second low pass filter 2 with cut-off frequency f2. When the transient is detected, the predictive and intelligence module may direct the dual filter to pass on the transient for enhanced user experience. Immediately after the passing on of the transient, the dual filter may close to attenuate other higher frequency components. The transient signal is necessary to provide an enhanced haptic experience. The dual filter allows shifting of cut-off frequencies when a transient is detected. The dual frequency shifts the cut-off frequency of the first low pass filter 1 and the second low pass filter 2 to allow transients to pass on through and subsequently fades the cut-off frequencies to their normal cut-off frequency values. For example, when the transient is detected, the first low pass filter 1 with cut-off frequency f1 is shifted to higher cut-off frequency f3 and the second low pass filter 2 with cut-off frequency f2 is shifted to higher cut-off frequency f4 to accommodate the passing on of the transient.

In some embodiments, the transient SCORE may be a discrete digital value such as 0.2, 0.3 . . . 2.15 and the like. The binary value determined is passed on to step 1810, which is provided to the tRMS detection module of process 1800. At step 2118, the output signal is calculated and subsequently sent to the envelope follower module and the dual filter associated with other processes described herein and elsewhere. The process 2100 is terminated at step 2120.

In an embodiment of the present invention, the passing on of values to the dual filter by the analytics module is accomplished by passing on the parameters by value, reference, share memory or pointers.

In some embodiments, the passing on the parameter values to the envelope follower module by the analytics module is accomplished by passing on the parameters by values, reference, shared memory, pointer, or some other way of passing on parameters.

In some embodiments, the dual filter may be replaced by a multi-pass filter with different cut-off frequencies, for example, F1, F2, . . . Fn. The analytics module may be programmed to control the shifting of the frequencies according to the frequency range of the transient. The analytics module may determine the frequency range and accordingly set the multi-pass filter based on the frequency range of the transient.

In an embodiment of the present invention, the analytics module may receive the input audio signal 202 in real time, whereas the digital signal processing chain may be fed with the input audio signal with a delay of a few milliseconds. The analytics module may analyse the signal to identify the transient in advance and accordingly operate the dual filter or the multi filter to pass on the transients. In this embodiment, the predictive and intelligence module may predict the transients and peaks before they are processed by the digital signal processing chain.

Paragraphs 1-10 that follow define further embodiments forming part of the present disclosure.

Paragraph 1. A haptic processing method is provided and comprises: receiving an input audio signal; analysing the input audio signal for calculating a peak amplitude values and a root mean square values for fixed time period with varying window size; utilizing the calculated peak amplitude values and the calculated root mean square values to set the gain control at least one dynamic processor by: (a) determining the difference between the peak amplitude values and the pre-determined gain; (b) determining the sum of the root mean square values and the pre-determined gain; wherein the pre-determined gain subtracted from the peak amplitude values and the pre-determined gain added to the root mean square value is a constant; determining the minimum of the two values determined at step (a) and step (b); applying the minimum values to dynamically modulate a threshold level of the at least one dynamic processor. In an embodiment, the pre-determined gain having a constant value is between −10 dB to −20 dB. In an embodiment, the minimum value is provided as parameter to the at least one dynamic processor to update the gain of the at least one dynamic processor in real time. In some embodiments, the parameters are calculated independently of the digital signal processing chain. Further, the parameters are provided based on input signal characteristics and the intelligence accumulated from the input audio signal by the analytics module.

Paragraph 2. A non-transitory computer readable medium is provided and stores instruction thereon that, when executed by a processor, causes the processor to perform the function to receive an input audio signal, analyse the input audio signal to calculate at least one peak amplitude value and at least one root mean square value for a fixed time period with a varying window size, determine the analysed at least one peak amplitude value to calculate a peak signal value, determine the analysed at least one root mean square value to calculate an average root mean square value, set the gain of the at least one dynamic processor by (a) determining the difference between the peak signal value and the pre-determined constant gain, and (b) determining the summation of the root mean square value and the pre-determined constant gain, wherein the pre-determined constant gain is subtracted from the peak amplitude value and the pre-determined constant gain is added to the root mean square value, (c) determining the minimum of the two values determined at step (a) and step (b) and (d) applying the determined minimum value to dynamically modulate the threshold level of the at least one dynamic processor.

Paragraph 3. A haptic processing system is provided with a digital signal processing chain, which includes a pre-processor, at least one dynamic processor, memory, an envelope follower, a physical resonance module, a fixed frequency oscillator, a low pass filter, a bell filter, a limiter and an actuator. The haptic processing system also includes an analytics module associated with the at least one dynamic processor and the memory and enabled to receive an input audio signal. The analytics module includes a root mean square module, which is enabled to receive an input audio signal to calculate the root mean square value. The root mean square value calculated is added with a pre-determined constant value. A peak detection module receives an input audio signal to calculate the peak signal value. The peak signal values are subtracted from a pre-determined constant value. The constant value which is added to the root mean square value and subtracted from the peak value is the same. Additionally, a predictive module calculates the minimum of the two values, that is, (a) the root mean square value added to the pre-determined constant value, and (b) the peak signal value subtracted from the peak signal value. This minimum value is buffered in the memory. The buffered value is provided to the at least one dynamic processor.

Paragraph 4. A haptic processing method is provided and comprises the step of receiving an input audio signal, processing the input audio signal to eliminate noise and reduce the dynamic range of the input audio signal using at least one dynamic processor. The at least one dynamic processor is associated with a side chain module, a detector module, and threshold module. Furthermore, the at least one dynamic processor in the digital signal processing chain is associated with a threshold value and a gain. An analytics module receives the input audio signal separately to determine the audio input signal characteristics by calculating one or more peak signal values, root mean square values, and the transient values for a fixed time period. The analytics module calculates a threshold parameter and a gain parameter based on the one or more peak signal values, the root mean square values, and the transient values to be applied to the at least one dynamic processor in real time. The threshold parameter and the gain parameter are passed on by the analytics module to the at least one dynamic processor using function calls, variables or as memory references. The at least one dynamic processor utilises the threshold parameters to set the threshold level. A different dynamic processor utilises the gain parameters to control the gain of the signal being processed in the digital signal processing chain. The digital signal processing chain uses the threshold parameters and the gain parameters to dynamically update the at least one dynamic processor continuously to produce haptic output. In one implementation, the digital signal processing chain comprises two dynamic processors, the first being a noise gate wherein the noise gate associated with a sidechain having at least a threshold, a hold time, a release time, an attack and a knee. The second dynamic processor is a compressor, wherein the compressor is associated with a sidechain having at least a threshold, a hold time, a release time, an attack and a knee.

Paragraph 5. A haptic processing system is provided and comprises a digital signal processing chain. The digital signal processing chain further comprises a at least one dynamic processor, the at least one dynamic processor configured to receive an input audio signal having a threshold level and a gain. Further, the at least one dynamic processor is enabled to receive parameters to dynamically control at least the threshold level or the gain of the at least one dynamic processor. An envelope follower is configured to receive and convert a bipolar signal into a unipolar signal and to convert the input audio signal into low frequency signal. In addition, a fixed frequency oscillator is provided to modulate the low frequency audio signal at or near the tuned resonant frequency. Additionally, a resonance and physical model enhances low frequency audio signals and further amplifies suppressed low frequency signals. A mixer is configured to mix the received audio signal from a pre-set, the resonance model, and the fixed frequency oscillator. A low pass filter is coupled to a bell filter and a limiter. The limiter is associated with an actuator to produce haptic output. The haptic processing system further comprises an analytics module having a peak detector to calculate peak values from the received input audio signal for a fixed time, a root mean square calculator to calculate the root mean square values for a fixed time, a predictive calculator configured to calculate the parameters to be passed on to the at least one dynamic processor based on the calculated root mean square values and the calculated peak values for passing on the calculated parameters for controlling the threshold value and the gain of the one or more dynamic processors to produce haptic output.

Paragraph 6. A method of processing the transient signal in a haptic processing system is provided. The method receives an audio input signal and detects the transient signal in the input audio signal by passing the input audio signal simultaneously on to a high pass envelope follower and a low pass envelope follower. The method calculates the difference in gain between the high pass envelope follower and low pass envelope follower. The calculated difference in gain is utilised to determine a transient score. The method receives a transient threshold. The transient score is converted into a transient binary. When the transient score is above the transient threshold, the transient binary is one (Binary one) and is zero when the transient score is below the transient threshold. A transient output is calculated by multiplying the transient binary with the transient score and the transient output is provided to an envelope follower and a dual filter. Additionally, the transient binary is provided to an RMS detection module.

Paragraph 7. A Computer readable medium is provided having instruction encoded thereon that, when executed by a processor, provides a haptic feedback based on an input audio signal, the instruction performing the steps of (a) processing the input audio signal into a dynamic processor, the dynamic processor configured to a sidechain to control the gain in the input audio signal below a set threshold; (b) inputting the processed audio signal to a second dynamic processor configured with a sidechain to control the dynamic range of the audio signal above a set threshold; (c) passing the audio signal on to: (i) an envelope follower module to extract an audio signal envelope, the audio signal envelope then modulating the amplitude of a fixed frequency oscillator, (ii) a resonance module configured to excitate physical models of string, membrane, plate or other musical instrument models from the input audio signal; and (d) mixing the signal output from the envelope module, the resonance module, and the dry/wet module signal; and (e) feeding the haptic signal to an actuator for generating a haptic output.

Paragraph 8. A haptic processing system is provided, comprising: a detection module; a noise gate module configured to a sidechain module; a dry/wet module configured to mix an input audio signal with a signal output of the noise gate module in a pre-determined proportion; a compressor module configured a different sidechain module; an envelope module associated with an oscillator; a resonance module configured to amplify suppressed frequencies, wherein the suppressed frequencies are reproduced using a string or a membrane musical instrument; a mixer module configured to mix an output signal from the dry/wet module, the fixed frequency oscillator module, and the resonance module, and an analytics module configured to independently process the input audio signal to assimilate intelligence and to provide parameters to the noise gate module and the compressor module to produce a haptic output. In some embodiments, the pre-determined proportion of the mix of the input audio signal with a signal output of the noise gate module is between decimal values of 0 and 1. In addition, the pre-determined proportion of the signal mix can be controlled by a user using a preset button. Alternatively, the pre-determined proportion associated with the signal mix is a constant fixed value. In an embodiment, an analytics module may intelligently configure the pre-determined value based on signal parameters.

Paragraph 9. A haptic processing system for real-time and non-real-time signal processing is provided, comprising: an analysis module containing at least two of the following: a dynamic processor logic to process the input signal below a set threshold; a second dynamic processor logic to process the input signal above a set threshold; a module to calculate average and peak values of the input signal, a logic to adjust threshold and/or gain settings of the dynamic processor logic based on the calculated peak and/or average (RMS) values of the input signal, a module to perform real-time onset detection with variable sensitivity; at least one gain module to multiply the signal amplitude of the input signal with the control signal value of the dynamic processor logic of the analysis module; a dry/wet module configured to mix the input audio signal with the signal output of one or multiple gain module(s) in a pre-determined proportion; an envelope module associated with an oscillator; a resonance module configured to excitate physical models of string, membrane, plate or other musical instrument models from the input signal; and a mixer module configured to mix an output signal from the dry/wet module, the oscillator module, and the resonance module. In some embodiments, the peak value and the root mean square value are stored in memory and are used by a predictive algorithm to intelligently predict the progression of the energy of the input audio signal. In an embodiment, the predictive algorithm outcome is utilised to change gain, threshold or envelope parameters of at least one dynamic processor. In an embodiment, the analytics module provides a variable look-ahead time and all processes occurring in the analytics module are performed in parallel using the previously determined look-ahead time. In some embodiments, a low pass filter may be implemented before signal averaging. In some embodiments, the at least one dynamic processor may apply a gain transfer curve at or near the threshold. Additionally, the at least one dynamic processor may limit the maximum gain reduction by a pre-defined value. In an embodiment, the detector module is configured to maintain the active state for a period of pre-determined time for the haptic processing system if there is no input audio signal but presence of the output haptic signal.

Paragraph 10. A haptic processing system is provided, comprising: an analytics module having at least one dynamic processor logic calculating a signal gain reduction; at least one signal averaging calculation module to calculate the root mean square value; at least one signal peak calculation module; at least one memory, wherein values of signal peak and root mean square values are stored; at least one module to perform real-time transient detection with a pre-defined sensitivity; at least one gain control module to multiply the signal amplitude of the input signal with the control signal value of the dynamic processor logic of the analytics module; a low pass filter comprising a first filter and a second filter, which process the input signal in parallel and wherein the second filter has a higher cut-off frequency than the first filter. In an embodiment, the transient detection provides both binary state output and continuous value for the transients. In an embodiment, the input and output of the parallel filters is multiplexed or mixed based on transient detection, and controlled shifting of cut-off frequencies is determined based on transient output. In addition, the cut-off frequencies corresponding to the first filter and the second filter of the dual filter are continuously adjusted based on the continuous value received from the transient output.

The various modules described herein are exemplary only. Other configurations and numbers of modules may be used. The invention may be implemented using non-modular approaches, and different sub-routines may be implemented in different components, which may operate as one unit to achieve the desirable haptic response. Furthermore, various modules may be fabricated in a single layout and implemented in a single chip. Alternatively, while using multiple chips for fabrication of haptic processing module 200, one or more modules may be implemented on different chips.

The description of the functionality provided by the modules described herein is for illustrative purposes and is not intended to be limiting, as one or more modules may provide additional or lesser functionality as described. Furthermore, the configuration of modules and their arrangement are also meant for illustrative purposes and are not intended to be limiting, as one or more modules may be removed or added or rearranged without deviating from the scope and spirit of the invention. Besides, one or more modules may be eliminated, and its functionality may be provided by other modules either completely or partially. Furthermore, one or more module may be expanded to show additional modules within it. The functionality of each expanded module may be different, but the overall effect would produce haptic output.

The paragraphs below define further embodiments forming part of the present disclosure.

A1. A haptic processing method for producing haptic output data from an input audio signal, the haptic processing method comprising:
receiving the input audio signal in a digital signal processing chain and an analytics processor;
processing the input audio signal simultaneously in the digital signal processor and the analytics processor, wherein the digital signal processor comprises at least one dynamic processor, and wherein the analytics processor independently processes the input audio signal to set a gain and a threshold in the at least one dynamic processor to control the processing of the input audio signal in the digital signal processing chain;
mixing the received audio signal in a mixer; and
producing the haptic output in one or more actuators.

A2. The haptic processing method of paragraph A1, wherein the digital signal processing chain further comprises a dry/wet processor, a noise gate, a compressor, an envelope follower, a frequency oscillator, a resonance processor, a detector, and a preset.

A3. The haptic processing method of paragraph A2, wherein the preset is configured to control the input audio signal processing in at least one of the mixer, the low pass filter, the limiter, or the bell filter.

A4. The haptic processing method of paragraph A2, wherein the digital signal processing chain further includes a dual filter, wherein the dual filter receives at least one control parameter from the analytics processor and the preset.

A5. The haptic processing method of paragraph A4, wherein the preset provides the at least one control parameter to the dry/wet processor.

A6. The haptic processing method of paragraph A2, wherein the dry/wet processor receives the input audio signal and the output from the at least one dynamic processor, wherein the ratio of dry signal to wet signal is controlled by a user interface.

A7. The haptic processing method of paragraph A2, wherein the resonance processor performs at least one or more functions comprising: (a) amplify suppressed low frequencies; (b) excitate physical models of string, membrane, plate, or other musical instrument models based on the input audio signal; or (c) add low frequencies to the output signal.

A8. The haptic processing method of paragraph A2, wherein the mixer is configured to mix output signal from the dry/wet processor, the frequency oscillator, and the resonance processor.

A9. The haptic processing method of paragraph A1, wherein the analytics processor comprises a peak analyzer, a transient detector, an RMS generator, a sidechain processor, a detector and threshold processor, a predictive and intelligence processor, a gain controller, and a frequency gain controller.

A10. The haptic processing method of paragraph A1, wherein the analytics processor performs the processing of the input audio signal independently of the digital signal processor and passes parameters by implementing function calls.

A11. The haptic processing method of paragraph A1, wherein the analytics processor provides control parameters to the envelope follower.

A12. The haptic processing method of paragraph A9, wherein the parameters passed to the at least one dynamic processor is determined by performing steps:

analyzing the input audio signal to calculate a peak amplitude value and a root mean square value for a fixed time period with a varying window size;

storing the calculated peak amplitude value and the calculated root mean square value to set a threshold level and a gain of the at least one dynamic processor by:
  (a) determining the difference between the peak amplitude value and a pre-determined gain,
  (b) determining the sum of the root mean square value and the pre-determined gain, wherein the pre-determined gain subtracted from the peak amplitude values and the pre-determined gain added to the root mean square value is a constant, and
  (c) determining the minimum of the two values determined at step (a) and step (b); and applying the minimum values to dynamically modulate the threshold level or the gain of the at least one dynamic processor.

A13. The haptic processing method of paragraph A1, wherein the input audio signal is processed in real time or non-real time.

A14. The haptic processing method of paragraph A2, wherein the dry/wet processor provides a preset control accessible by a user to control the mixing of a dry signal and a wet signal.

A15. The haptic processing method of paragraph A1, wherein the at least one dynamic processor is a compressor.

A16. The haptic processing method of paragraph A1, wherein the at least one dynamic processor is a noise gate.

A17. The haptic processing method of paragraph A1, wherein the analytics processor sets at least one parameter in the digital signal processing chain to control the audio signal processing.

A18. The haptic processing method of paragraph A2, wherein the detector implements a power saving mode by detecting input audio signal and the output signal.

A19. The haptic processing method of paragraph A2, wherein the power is switched to battery saving mode in absence of input audio signal and the output signal.

A20. The haptic processing method of paragraph A1, wherein the input audio signal feed to the analytics processor is processed using predictive algorithms to predict at least the threshold value and gain.

A21. A haptic processing system for producing a haptic output data from an input audio signal, the haptic processing system comprising:

a digital signal processing chain and an analytics processor configured to simultaneously receive the input audio signal, wherein the digital signal processor comprise at least one dynamic processor, and wherein the analytics processor separately processes the input audio signal to determine at least one parameter to set at least a gain or a threshold in the at least one dynamic processor;

a mixer configured to mix signals; and one or more actuators to produce the haptic output data.

A22. The haptic processing system of paragraph A21, further comprising an envelope follower, wherein the analytics processer provides control parameters to the envelope follower.

A23. The haptic processing system of paragraph A21, wherein the parameters passed to the at least one dynamic processor is determined by performing the steps of:

analyzing the input audio signal to calculate a peak amplitude value and a root mean square value for a fixed time period with a varying window size;

storing the calculated peak amplitude value and the calculated root mean square value to set a threshold level and a gain of the at least one dynamic processor by:
  (a) determining the difference between the peak amplitude value and a pre-determined gain,
  (b) determining the sum of the root mean square value and the pre-determined gain, wherein the pre-determined gain subtracted from the peak amplitude values and the pre-determined gain added to the root mean square value is a constant, and
  (c) determining the minimum of the two values determined at step (a) and step (b); and applying the minimum values to dynamically modulate the threshold level or the gain of the at least one dynamic processor.

A24. The haptic processing system of paragraph A21, wherein the digital signal processing chain further comprises a dry/wet processor, a noise gate, a compressor, an envelope follower, a frequency oscillator, a resonance processor, and a preset.

A25. The haptic processing system of paragraph A24, wherein the preset is configured to control at least one of the mixer, a low pass filter, a limiter, or a bell filter.

A26. The haptic processing system of paragraph A21, wherein the digital signal processing chain further includes a dual filter, wherein the dual filter receives control parameters from the analytics processor and the preset.

A27. The haptic processing system of paragraph A24, wherein the preset provides control parameters to the dry/wet processor.

A28. The haptic processing system of paragraph A24, wherein the dry/wet processor receives the input audio signal and the output from the at least one dynamic processor, wherein the ratio of dry signal to wet signal is controlled by a user interface.

A29. The haptic processing system of paragraph A24, wherein the resonance processor performs at least one or more functions comprising: (a) amplify suppressed low frequencies; (b) excitate physical models of string, membrane, plate or other musical instrument models based on the input audio signal; or (c) add low frequencies to the output signal.

A30. The haptic processing system of paragraph A21, wherein the mixer is configured to mix output signals from the dry/wet processor, the frequency oscillator, and the resonance processor.

A31. The haptic processing system of paragraph A21, wherein the analytics processor comprises a peak analyzer, a transient detector, an RMS generator, a sidechain processor, a detector and threshold processor, a predictive and intelligence processor, a gain controller, and a frequency gain controller.

A32. A computer program product, the computer program product comprising a non-transitory computer-readable storage medium and a processor, the non-transitory computer readable storage medium storing executable code, when executed by at least one processor causes the processor to perform the steps of:

receive an input audio signal simultaneously in a digital signal processing chain and an analytics processor, wherein the digital signal processor comprises at least one dynamic processor, and wherein the analytics processor separately processes the input audio signal to determine at least one parameter to set at least a gain in the at least one dynamic processor to control the processing of the haptic data;

mix the received audio signal to in a mixer, which receives at least one control parameter from the analytics processor; and produce a haptic output using at least one actuator.

A33. The computer program product of paragraph A32, wherein the analytics processor provides control parameters to an envelope follower.

A34. The computer program product of paragraph A32, wherein the analytics processor comprises a peak analyzer, a transient detector, an RMS generator, a sidechain processor, a detector and threshold processor, a predictive and intelligence processor, a gain controller, and a frequency gain controller.

A35. The computer program product of paragraph A32, wherein the parameters passed to the at least one dynamic processor is determined by performing the steps of:

analyzing the input audio signal to calculate a peak amplitude value and a root mean square value for a fixed time period with a varying window size;

storing the calculated peak amplitude value and the calculated root mean square value to set a threshold level and a gain of the at least one dynamic processor by:
  (a) determining the difference between the peak amplitude value and a pre-determined gain,
  (b) determining the sum of the root mean square value and the pre-determined gain, wherein the pre-determined gain subtracted from the peak amplitude values and the pre-determined gain added to the root mean square value is a constant, and
  (c) determining the minimum of the two values determined at step (a) and step (b); and applying the minimum values to dynamically modulate the threshold level or the gain of the at least one dynamic processor.

A36. The computer program product of paragraph A34, wherein predictive and intelligence processor implements machine learning algorithms to perform the determination of at least one parameter to be passed to the at least one dynamic processor.

A37. The computer program product of paragraph A32, wherein the digital signal processing chain further comprises a dry/wet processor, a noise gate, a compressor, an envelope follower, a frequency oscillator, a resonance processor, and a preset.

A38. The computer program product of paragraph A37, wherein the preset is configured to control at least one of the mixer, a low pass filter, a limiter, or a bell filter.

A39. The computer program product of paragraph A32, wherein the digital signal processing chain further includes a dual filter, wherein the dual filter receives control parameters from the analytics processor and the preset.

A40. The computer program product of paragraph A32, wherein the preset provides control parameters to the dry/wet processor.

A41. The computer program product of paragraph A37, wherein the dry/wet processor receives the input audio signal and the output from the at least one dynamic processor, wherein the ratio of dry signal to wet signal is controlled by a user interface.

A42. The computer program product of paragraph A37, wherein the resonance processor performs at least one or more functions comprising: (a) amplify suppressed low frequencies; (b) excitate physical models of string, membrane, plate or other musical instrument models based on the input audio signal; or (c) add low frequencies to the output signal.

A43. The computer program product of paragraph A32, wherein the mixer is configured to mix output signals from the dry/wet processor, the frequency oscillator, and the resonance processor.

We claim:

1. A haptic processing method for producing haptic output data from an input audio signal, the haptic processing method comprising:

receiving the input audio signal in a digital signal processing chain and an analytics processor;

processing the input audio signal simultaneously in the digital signal processor and the analytics processor, wherein the digital signal processor comprises at least one dynamic processor, and wherein the analytics processor independently processes the input audio signal to set a gain and a threshold in the at least one dynamic processor to control the processing of the input audio signal in the digital signal processing chain;

mixing the received audio signal in a mixer; and producing the haptic output in one or more actuators.

2. The haptic processing method of claim 1, wherein the digital signal processing chain further comprises a dry/wet processor, a noise gate, a compressor, an envelope follower, a frequency oscillator, a resonance processor, a detector, and a preset.

3. The haptic processing method of claim 2, wherein the preset is configured to control the input audio signal processing in at least one of: the mixer, a low pass filter, a limiter or a bell filter.

4. The haptic processing method of claim 2, wherein the digital signal processing chain further includes a dual filter, wherein the dual filter receives at least one control parameter from the analytics processor and the preset.

5. The haptic processing method of claim 4, wherein the preset provides the at least one control parameter to the dry/wet processor.

6. The haptic processing method of claim 2, wherein the dry/wet processor receives the input audio signal and the output from the at least one dynamic processor, wherein the ratio of dry signal to wet signal is controlled by a user interface.

7. The haptic processing method of claim 2, wherein the resonance processor performs at least one or more functions comprising: (a) amplify suppressed low frequencies; (b) excitate physical models of string, membrane, plate, or other musical instrument models based on the input audio signal; or (c) add low frequencies to the output signal.

8. The haptic processing method of claim 2, wherein the mixer is configured to mix output signal from the dry/wet processor, the frequency oscillator, and the resonance processor.

9. The haptic processing method of claim 2, wherein the dry/wet processor provides a preset control accessible by a user to control the mixing of a dry signal and a wet signal.

10. The haptic processing method of claim 2, wherein the detector implements a power saving mode by detecting input audio signal and the output signal.

11. The haptic processing method of claim 2, wherein the power is switched to battery saving mode in absence of input audio signal and the output signal.

12. The haptic processing method of claim 1, wherein the analytics processor comprises a peak analyzer, a transient detector, an RMS generator, a sidechain processor, a detector and threshold processor, a predictive and intelligence processor, a gain controller, and a frequency gain controller.

13. The haptic processing method of claim 12, wherein the parameters passed to the at least one dynamic processor is determined by performing steps:
analyzing the input audio signal to calculate a peak amplitude value and a root mean square value for a fixed time period with a varying window size;
storing the calculated peak amplitude value and the calculated root mean square value to set a threshold level and a gain of the at least one dynamic processor by:
(a) determining the difference between the peak amplitude value and a pre-determined gain,
(b) determining the sum of the root mean square value and the pre-determined gain, wherein the pre-determined gain subtracted from the peak amplitude values and the pre-determined gain added to the root mean square value is a constant, and
(c) determining the minimum of the two values determined at step (a) and step (b); and
applying the minimum values to dynamically modulate the threshold level or the gain of the at least one dynamic processor.

14. The haptic processing method of claim 1, wherein the analytics processor performs the processing of the input audio signal independently of the digital signal processor and passes parameters by implementing function calls.

15. The haptic processing method of claim 1, wherein the analytics module provides control parameters to an envelope follower module.

16. The haptic processing method of claim 1, wherein the input audio signal is processed in real time or non-real time.

17. The haptic processing method of claim 1, wherein the at least one dynamic processor is a compressor.

18. The haptic processing method of claim 1, wherein the at least one dynamic processor is a noise gate.

19. The haptic processing method of claim 1, wherein the analytics processor sets at least one parameter in the digital signal processing chain to control the audio signal processing.

20. The haptic processing method of claim 1, wherein the input audio signal feed to the analytics processor is processed using predictive algorithms to predict at least the threshold value and gain.

21. A haptic processing system for producing a haptic output data from an input audio signal, the haptic processing system comprising:
a digital signal processing chain and an analytics processor configured to simultaneously receive the input audio signal, wherein the digital signal processor comprise at least one dynamic processor, and
wherein the analytics processor separately processes the input audio signal to determine at least one parameter to set at least a gain or a threshold in the at least one dynamic processor;
a mixer configured to mix signals; and
one or more actuators to produce the haptic output data.

22. The haptic processing system of claim 21, further comprising an envelope follower, wherein the analytics processor provides control parameters to the envelope follower.

23. The haptic processing system of claim 21, wherein the parameters passed to the at least one dynamic processor is determined by performing the steps of:
analyzing the input audio signal to calculate a peak amplitude value and a root mean square value for a fixed time period with a varying window size;
storing the calculated peak amplitude value and the calculated root mean square value to set a threshold level and a gain of the at least one dynamic processor by:
(a) determining the difference between the peak amplitude value and a pre-determined gain,
(b) determining the sum of the root mean square value and the pre-determined gain, wherein the pre-determined gain subtracted from the peak amplitude values and the pre-determined gain added to the root mean square value is a constant, and
(c) determining the minimum of the two values determined at step (a) and step (b); and
applying the minimum values to dynamically modulate the threshold level or the gain of the at least one dynamic processor.

24. The haptic processing system of claim 21, wherein the digital signal processing chain further comprises a dry/wet processor, a noise gate, a compressor, an envelope follower, a frequency oscillator, a resonance processor, and a preset.

25. The haptic processing system of claim 24, wherein the preset is configured to control at least one of the mixer, a low pass filter, a limiter, or a bell filter.

26. The haptic processing system of claim 24, wherein the preset provides control parameters to the dry/wet processor.

27. The haptic processing system of claim 24, wherein the dry/wet processor receives the input audio signal and the output from the at least one dynamic processor, wherein the ratio of dry signal to wet signal is controlled by a user interface.

28. The haptic processing system of claim 24, wherein the resonance processor performs at least one or more functions comprising: (a) amplify suppressed low frequencies; (b) excitate physical models of string, membrane, plate or other musical instrument models based on the input audio signal; or (c) add low frequencies to the output signal.

29. The haptic processing system of claim 21, wherein the digital signal processing chain further includes a dual filter, wherein the dual filter receives control parameters from the analytics processor and a preset.

30. The haptic processing system of claim 21, wherein the mixer is configured to mix output signals from a dry/wet processor, a-frequency oscillator, and a resonance processor.

31. The haptic processing system of claim 21, wherein the analytics processor comprises a peak analyzer, a transient detector, an RMS generator, a sidechain processor, a detector and threshold processor, a predictive and intelligence processor, a gain controller, and a frequency gain controller.

32. A computer program product, the computer program product comprising a non-transitory computer-readable storage medium and a processor, the non-transitory computer readable storage medium storing executable code, when executed by at least one processor causes the processor to perform the steps of:
receive an input audio signal simultaneously in a digital signal processing chain and an analytics processor, wherein the digital signal processor comprises at least one dynamic processor, and
wherein the analytics processor separately processes the input audio signal to determine at least one parameter to set at least a gain in the at least one dynamic processor to control the processing of the haptic data;
mix the received audio signal to in a mixer, which receives at least one control parameter from the analytics processor; and
produce a haptic output using at least one actuator.

33. The computer program product of claim 32, wherein the analytics processor provides control parameters to an envelope follower.

34. The computer program product of claim 32, wherein the analytics processor comprises a peak analyzer, a transient detector, an RMS generator, a sidechain processor, a detector and threshold processor, a predictive and intelligence processor, a gain controller, and a frequency gain controller.

35. The computer program product of claim 34, wherein predictive and intelligence processor implements machine learning algorithms to perform the determination of at least one parameter to be passed to the at least one dynamic processor.

36. The computer program product of claim 32, wherein the parameters passed to the at least one dynamic processor is determined by performing the steps of:
analyzing the input audio signal to calculate a peak amplitude value and a root mean square value for a fixed time period with a varying window size;
storing the calculated peak amplitude value and the calculated root mean square value to set a threshold level and a gain of the at least one dynamic processor by:
(a) determining the difference between the peak amplitude value and a pre-determined gain,
(b) determining the sum of the root mean square value and the pre-determined gain, wherein the pre-determined gain subtracted from the peak amplitude values and the pre-determined gain added to the root mean square value is a constant, and
(c) determining the minimum of the two values determined at step (a) and step (b); and
applying the minimum values to dynamically modulate the threshold level or the gain of the at least one dynamic processor.

37. The computer program product of claim 32, wherein the digital signal processing chain further comprises a dry/wet processor, a noise gate, a compressor, an envelope follower, a frequency oscillator, a resonance processor, and a preset.

38. The computer program product of claim 37, wherein the preset is configured to control at least one of the mixer, a low pass filter, a limiter, or a bell filter.

39. The computer program product of claim 37, wherein the dry/wet processor receives the input audio signal and the output from the at least one dynamic processor, wherein the ratio of dry signal to wet signal is controlled by a user interface.

40. The computer program product of claim 37, wherein the resonance processor performs at least one or more functions comprising: (a) amplify suppressed low frequencies; (b) excitate physical models of string, membrane, plate or other musical instrument models based on the input audio signal; or (c) add low frequencies to the output signal.

41. The computer program product of claim 32, wherein the digital signal processing chain further includes a dual filter, wherein the dual filter receives control parameters from the analytics processor and a preset.

42. The computer program product of claim 32, wherein a preset provides control parameters to a dry/wet processor.

43. The computer program product of claim 32, wherein the mixer is configured to mix output signals from a dry/wet processor, a frequency oscillator, and a resonance processor.

* * * * *